US011056051B2

(12) United States Patent
Kim et al.

(10) Patent No.: US 11,056,051 B2
(45) Date of Patent: Jul. 6, 2021

(54) TOUCH SENSOR ASSEMBLY AND REFRIGERATOR DOOR WITH TOUCH SENSOR ASSEMBLY AND METHOD FOR MANUFACTURING THE SAME

(71) Applicant: LG Electronics Inc., Seoul (KR)

(72) Inventors: Hyunki Kim, Seoul (KR); Seungje Park, Seoul (KR); Jinseung Park, Seoul (KR); Kihyun Park, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 16/887,763

(22) Filed: May 29, 2020

(65) Prior Publication Data

US 2020/0293129 A1 Sep. 17, 2020

Related U.S. Application Data

(63) Continuation of application No. 16/375,276, filed on Apr. 4, 2019, now Pat. No. 10,725,599, which is a
(Continued)

(30) Foreign Application Priority Data

Oct. 24, 2014 (KR) .................. 10-2014-0145534

(51) Int. Cl.
*F25D 23/02* (2006.01)
*F25D 29/00* (2006.01)
(Continued)

(52) U.S. Cl.
CPC ......... *G09G 3/3208* (2013.01); *F25D 23/028* (2013.01); *F25D 29/005* (2013.01); *G06F 3/03547* (2013.01); *F25D 2400/361* (2013.01)

(58) Field of Classification Search
CPC ......... G06F 3/041; F25D 23/028; F25D 23/02
See application file for complete search history.

(56) References Cited

U.S. PATENT DOCUMENTS 4,056,699 A 11/1977 Jordan
5,923,522 A 7/1999 Sajna
(Continued)

FOREIGN PATENT DOCUMENTS

CN 1255665 6/2000
CN 1980061 6/2007
(Continued)

OTHER PUBLICATIONS

Chinese Office Action in Chinese Application No. 201510671495.5, dated Jul. 3, 2017, 10 pages (with English translation).
(Continued)

*Primary Examiner* — Kent W Chang
*Assistant Examiner* — Chayce R Bibbee
(74) *Attorney, Agent, or Firm* — Fish & Richardson P.C.

(57) ABSTRACT

Provided are a touch sensor assembly that is maintained in a state in which the touch sensor is closely attached to an exterior member to accurately detect displacement when touch manipulation is performed to improve a recognition rate, a refrigerator door including a touch sensor assembly that is capable of preventing a sensor control part from being damaged by static electricity and having an improved front outer appearance, and a method for manufacturing the refrigerator door.

20 Claims, 35 Drawing Sheets

Related U.S. Application Data continuation of application No. 15/969,901, filed on May 3, 2018, now Pat. No. 10,345,981, which is a continuation of application No. 14/921,681, filed on Oct. 23, 2015, now Pat. No. 10,007,385.

(51) Int. Cl.
*G09G 3/3208* (2016.01)
*G06F 3/0354* (2013.01)

(56) References Cited

U.S. PATENT DOCUMENTS

| | | | |
|---|---|---|---|
| 5,973,420 A | 10/1999 | Kaiserman | |
| 5,995,877 A | 11/1999 | Brueggemann | |
| 6,242,076 B1 | 6/2001 | Andriash | |
| 6,265,682 B1 | 7/2001 | Lee | |
| 6,667,563 B2 | 12/2003 | Bae | |
| 7,155,317 B1 | 12/2006 | Tran | |
| 7,573,701 B2 | 8/2009 | Doberstein | |
| 7,911,321 B2 | 3/2011 | Bingle | |
| 8,648,832 B2 | 2/2014 | Maloof | |
| 8,742,647 B2 | 6/2014 | Fluhrer | |
| 8,922,979 B2 | 12/2014 | Fluhrer | |
| 9,323,289 B2 | 4/2016 | Oohira | |
| 10,007,385 B2 | 6/2018 | Kim et al. | |
| 2002/0066971 A1 | 6/2002 | Takashi | |
| 2003/0043449 A1 | 3/2003 | Takeuchi | |
| 2004/0100479 A1 | 5/2004 | Nakano | |
| 2006/0177212 A1 | 8/2006 | Lamborghini | |
| 2006/0262549 A1 | 11/2006 | Schmidt | |
| 2007/0051610 A1 | 3/2007 | Weiss | |
| 2007/0130965 A1 | 6/2007 | Boarman et al. | |
| 2007/0246267 A1 | 10/2007 | Koottungal | |
| 2008/0143684 A1 | 6/2008 | Seo | |
| 2008/0165154 A1 | 7/2008 | Kim | |
| 2008/0196945 A1 | 8/2008 | Konstas | |
| 2008/0202912 A1 | 8/2008 | Boddie | |
| 2008/0257706 A1 | 10/2008 | Haag | |
| 2009/0107829 A1 | 4/2009 | Hiemann | |
| 2009/0128375 A1 | 5/2009 | Hiemann | |
| 2010/0007531 A1 | 1/2010 | Fluherer | |
| 2010/0045617 A1* | 2/2010 | Lee | G06F 3/041 |
| | | | 345/173 |
| 2010/0114011 A1 | 5/2010 | Hermann | |
| 2010/0149000 A1 | 6/2010 | Heimann | |
| 2010/0216929 A1 | 8/2010 | Jung | |
| 2010/0219176 A1 | 9/2010 | Striegler | |
| 2011/0048047 A1* | 3/2011 | Kim | F25D 29/005 |
| | | | 62/246 |
| 2011/0134627 A1 | 6/2011 | Hamlin | |
| 2011/0175845 A1 | 7/2011 | Honda | |
| 2011/0267304 A1 | 11/2011 | Simmons | |
| 2011/0299129 A1 | 12/2011 | Ishida | |
| 2012/0138336 A1 | 6/2012 | Watanabe et al. | |
| 2012/0138337 A1 | 6/2012 | Kim | |
| 2012/0260683 A1 | 10/2012 | Cheon | |
| 2012/0274602 A1 | 11/2012 | Bita et al. | |
| 2013/0021274 A1 | 1/2013 | Fukushima | |
| 2013/0067940 A1 | 3/2013 | Shim | |
| 2013/0082948 A1 | 4/2013 | Ok | |
| 2014/0101589 A1 | 4/2014 | Hyun | |
| 2014/0184577 A1 | 7/2014 | Kim | |
| 2014/0203863 A1 | 7/2014 | Gillespie | |
| 2014/0300263 A1* | 10/2014 | Sung | F25D 23/065 |
| | | | 312/404 |
| 2015/0192352 A1 | 7/2015 | Sung | |
| 2015/0276302 A1 | 10/2015 | Roh | |
| 2016/0003519 A1 | 1/2016 | Kim | |
| 2016/0105985 A1 | 4/2016 | Wang | |
| 2016/0117002 A1 | 4/2016 | Kim et al. | |
| 2017/0089633 A1 | 3/2017 | Kim | |

FOREIGN PATENT DOCUMENTS

| | | |
|---|---|---|
| CN | 101535748 | 9/2009 |
| CN | 101738051 | 6/2010 |
| CN | 101741371 | 6/2010 |
| CN | 101939605 | 1/2011 |
| CN | 102338544 | 2/2012 |
| CN | 202582565 | 12/2012 |
| CN | 103105979 | 5/2013 |
| CN | 103109135 | 5/2013 |
| CN | 105546930 | 5/2016 |
| CN | 105577156 | 5/2016 |
| DE | 29722565 | 4/1998 |
| DE | 102009001412 | 9/2010 |
| EP | 2770638 | 2/2013 |
| EP | 2789943 | 10/2014 |
| EP | 2975345 | 1/2016 |
| EP | 3007361 | 4/2016 |
| JP | S5814433 | 1/1983 |
| JP | 6095803 | 4/1994 |
| JP | H06-060031 | 8/1994 |
| JP | 2006250485 | 9/2006 |
| JP | 2007100995 | 4/2007 |
| JP | 2010230226 | 10/2010 |
| JP | 2011090897 | 5/2011 |
| JP | 2012098828 | 5/2012 |
| JP | 2013057432 | 3/2013 |
| JP | 2013530398 | 7/2013 |
| JP | 2013181734 | 9/2013 |
| JP | 2014031958 | 2/2014 |
| JP | 2014031978 | 2/2014 |
| JP | 2014040939 | 3/2014 |
| JP | 2014043982 | 3/2014 |
| JP | 2014055700 | 3/2014 |
| JP | 2014085024 | 5/2014 |
| JP | 2014137147 | 7/2014 |
| JP | 2014196933 | 10/2014 |
| KR | 2000031593 | 6/2000 |
| KR | 578400 | 5/2006 |
| KR | 663866 | 1/2007 |
| KR | 100756451 | 9/2007 |
| KR | 100866342 | 10/2008 |
| KR | 20090090518 | 8/2009 |
| KR | 2010050190 | 5/2010 |
| KR | 20100074034 | 7/2010 |
| KR | 2010095274 | 8/2010 |
| KR | 20120011516 | 2/2012 |
| KR | 1132463 | 3/2012 |
| KR | 2012050070 | 5/2012 |
| KR | 20120048655 | 5/2012 |
| KR | 20120116207 | 10/2012 |
| KR | 1237564 | 2/2013 |
| KR | 2013040058 | 4/2013 |
| KR | 20140121753 | 10/2014 |
| WO | 2007105950 | 9/2007 |
| WO | 2008069352 | 6/2008 |
| WO | 2010015749 | 2/2010 |
| WO | 2011081219 | 7/2011 |
| WO | 2014208585 | 12/2014 |
| WO | 2015128990 | 3/2017 |

OTHER PUBLICATIONS

Chinese Office Action in Chinese Application No. 201510684487.4, dated Jul. 3, 2017, 26 pages (with English translation).
Chinese Office Action in Chinese Application No. 201510964492.0, dated Jan. 17, 2018, 6 pages (with partial English translation).
Chinese Office Action in Chinese Application No. 201510977160.6, dated Sep. 29, 2017, 10 pages (with English translation).
Chinese Office Action in Chinese Application No. 201510977666.7, dated Oct. 25, 2017, 18 pages (with English translation).
Chinese Office Action in Chinese Application No. 201510979959.9, dated Jan. 25, 2018, 5 pages (with partial English translation).
Chinese Office Action in Chinese Application No. 201580024096.8, dated Jul. 27, 2018, 27 pages.
European Extended Search Report in European Application No. 15856232.2, dated Jun. 20, 2018, 12 pages.

(56) References Cited

OTHER PUBLICATIONS

European Extended Search Report in European Application No. 18158905.2, dated Jun. 19, 2018, 8 pages.
Extended European Search Report issued in European Application No. 15201832.1 dated May 3, 2016, 7 pages.
Extended European Search Report issued in European Application No. 15191174.0 dated May 31, 2016, 8 pages.
Notice of Allowance issued in Korean Application No. 10-2014-0186531 dated Aug. 31, 2016, 2 pages.
Notice of Allowance issued in Korean Application No. 10-2014-0188229 dated Sep. 30, 2016, 2 pages.
Notice of Allowance issued in Korean Application No. 10-2014-0189144 dated Aug. 31, 2016, 2 pages.
Notice of Allowance issued in Korean Application No. 10-2014-0189150 dated Sep. 13, 2016, 2 pages.
Office Action in European Application No. 15191174.0, dated Sep. 18, 2018, 6 pages.
United States Final Office Action in U.S. Appl. No. 14/931,776, dated Aug. 8, 2018, 28 pages.
United States Office Action in U.S. Appl. No. 14/977,605, dated Nov. 17, 2017, 43 pages.
United States Office Action in U.S. Appl. No. 14/977,588, dated Feb. 5, 2019, 20 pages.
United States Office Action in U.S. Appl. No. 14/977,605, dated May 25, 2018, 12 pages.
United States Office Action in U.S. Appl. No. 14/977,588, dated Jul. 25, 2018, 32 pages.
United States Office Action in U.S. Appl. No. 16/199,992, dated Jan. 11, 2019, 24 pages.
United States Office Action in U.S. Appl. No. 15/368,226 dated Apr. 23, 2019, 43 pages.
United States Office Action in U.S. Appl. No. 14/931,776, dated Sep. 5, 2017, 18 pages.
United States Office Action in U.S. Appl. No. 14/931,776, dated Mar. 24, 2017, 36 pages.
United States Office Action in U.S. Appl. No. 14/931,776, dated Feb. 28, 2018, 18 pages.
United States Office Action in U.S. Appl. No. 14/977,623, dated May 19, 2017, 29 pages.

\* cited by examiner

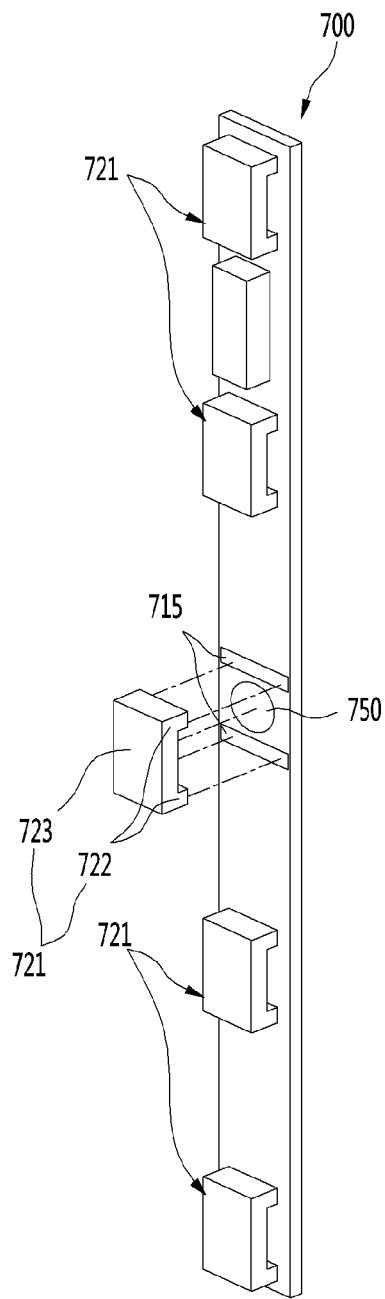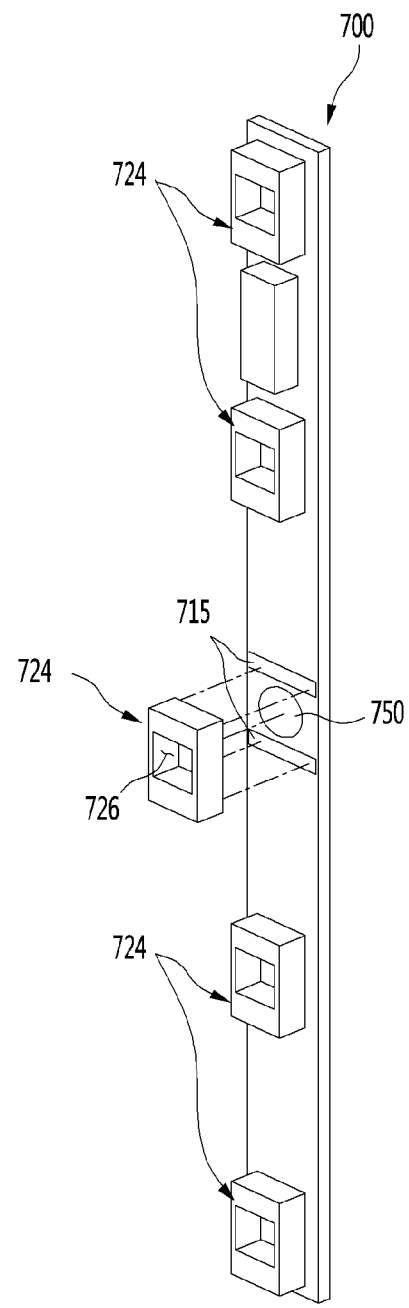

TOUCH SENSOR ASSEMBLY AND REFRIGERATOR DOOR WITH TOUCH SENSOR ASSEMBLY AND METHOD FOR MANUFACTURING THE SAME

CROSS-REFERENCE TO RELATED APPLICATIONS

The present application is a continuation of U.S. application Ser. No. 16/375,276, filed on Apr. 4, 2019, now allowed, which is a continuation of U.S. application Ser. No. 15/969,901 filed on May 3, 2018, now U.S. Pat. No. 10,345,981, which claims benefit to U.S. application Ser. No. 14/921,681, filed on Oct. 23, 2015, now U.S. Pat. No. 10,007,385, which claims priority under 35 U.S.C. 119 and 35 U.S.C. 365 to Korean Patent Application No. 10-2014-0145534 filed on Oct. 24, 2014, the contents of which are hereby incorporated by reference in their entirety.

FIELD

The present disclosure relates to a touch sensor assembly for home appliances, a refrigerator door including the touch sensor assembly, and a method for manufacturing the refrigerator door.

BACKGROUND

A touch sensor assembly may be used for home appliances to recognize, for example, a pushing operation of a user to generate a signal for operating the home appliance. The touch sensor assembly may include a capacitive sensor and a resistance cell type sensor. The sensors may detect a touch of the user and convert it into a signal for operating the home appliance.

In some home appliances, exterior members of the home appliances may be formed of steel or glass or in some cases coated with a material similar to the steel or glass to improve outer appearance.

A refrigerator, which is one type of a home appliance, is configured to store foods at a low temperature in a storage space that is covered by a door. The refrigerator may cool the inside of the storage space using cool air generated by heat-exchanging with a refrigerant that circulates a cooling cycle, to thereby keep the stored foods in an optimum state.

The storage space within the refrigerator may be classified into a refrigerating compartment and a freezing compartment. Accommodation members such as shelves, drawers, and baskets, among others, may be disposed within the refrigerating compartment and the freezing compartment. Each of the refrigerating compartment and the freezing compartment may be closed by a door. The refrigerator can be classified into various types according to, among other things, positions of the refrigerator compartment and the freezer compartment as well as configurations of the doors.

SUMMARY

According to one aspect of this disclosure, a touch sensor assembly includes a sensor PCB on which a sensor for detecting displacement of an exterior member of a home appliance is mounted, the sensor being configured to detect displacement based on a user touching the exterior member, a sensor housing attached to an inner surface of the exterior member, the sensor housing defining a space configured to accommodate the sensor PCB, and an elastic member disposed on a first surface that is opposite the second surface on which the sensor is mounted, the elastic member being configured to press the sensor PCB to thereby stabilize the sensor PCB relative to the exterior member.

Implementations according to this aspect may include one or more of the following features. For example, the sensor may be provided in plurality, and the elastic member may be disposed between the touch sensors. A mounting display part on which a mounted position of the elastic member is displayed may be disposed on a rear surface of the sensor PCB. The elastic member may be disposed on each of both sides of the sensor outside an outer end of the sensor. The elastic member may include a plurality of supports each of which extends from the sensor PCB that is disposed outside the sensor, and a connection part that connects corresponding ends of the supports to each other. A sensor support that is recessed to support a circumference of the sensor may further disposed on the sensor PCB. An input part on which a user's manipulation position is displayed may be disposed on the exterior member, and the sensor may be disposed at a rear side corresponding to the input part. The touch sensor assembly may further include a touch booster disposed between the sensor and the exterior member and configured to transmit a front/rear displacement of the exterior member to the sensor. The touch booster may include a first extension part extending from one side, a second extension part extends in a direction that is opposite to that of the first extension part, and a common part contacting the first and second extension parts, the common part contacting the sensor at a position corresponding to the sensor.

In some implementations, the touch booster may include a common part contacting the sensor, and a cut part that is spirally cut toward a center of the common part. The touch booster may include a common part that moves along the displacement of the exterior member, and a protrusion contacting the sensor is further disposed on the common part. A hook and hook groove that are coupled to each other may be disposed in the sensor housing and the touch booster, respectively, and the hook groove may have a size that is large enough to allow the touch booster to move in a front/rear direction. The hook and the hook groove may be coupled to each other so that a front surface of the touch booster further protrudes from a front surface of the sensor housing. An adhesion member configured to adhere the sensor housing to the exterior member may be disposed on a front surface of the sensor housing outside the touch booster. A booster support configured to restrict backward movement of the touch booster may further disposed on the sensor housing. A wire hole through which a wire connected to the sensor PCB is accessible may be defined in a side surface of the sensor housing. An opening of the sensor housing on which the touch booster is mounted may have a size corresponding to that of the sensor PCB, and an extension rib extending to contact a circumference of the sensor PCB may be disposed on the opening. The touch booster may be mounted on an opening of the sensor housing and configured to move in a front/rear direction, the touch booster being supported by the elastic member to protrude farther forward than a front surface of the sensor housing.

In some cases, the sensor housing may include a housing cover closely attached to the exterior member, and a housing body coupled to the housing cover to define a space in which the sensor PCB is accommodated, wherein, based on a cover coupling part and body coupling part, which are respectively disposed on the housing cover and the housing body, being coupled to each other, the elastic member may be pressed forward by the housing body. The cover coupling part and the body coupling part may be disposed on both sides of the sensor, respectively, and the cover coupling part, the body coupling part, and the sensor may be disposed along a common extension line. The elastic member may be disposed on each of both sides of the sensor, and the cover coupling part and the body coupling part may be disposed between the elastic members. A sensor terminal to which a wire for supplying power is connected may be disposed on a rear surface of the sensor PCB, and the wire may be connected to a side of the sensor terminal. A terminal hole that is opened in a position of the housing body corresponding to the sensor terminal to allow a connector to be exposed therethrough may be defined in the housing body. The sensor may include a piezo-sensor, and the touch sensor assembly may further include a spacer attached to one surface of the sensor PCB, the spacer defining a sensor hole in which the sensor is accommodated, and a conductive foil attached to one surface of the spacer to form a conductive pattern having a lattice shape and connecting an electrode of a top surface of the sensor to a common contact point of the PCB. The spacer may define an air vent that is cut into the sensor hole and extended along a direction of attachment of the spacer, the air vent being configured to discharge air bubbles between the spacer and the sensor PCB. A guide part for guiding the spacer and the conductive foil so that the spacer and the conductive foil may be disposed in fixed position on the sensor PCB is disposed on each of the spacer and the conductive foil. The guide part may define a plurality of punching holes passing through the same position of the spacer and the conductive foil, and a working rod disposed on one surface of the sensor PCB may pass through the plurality of punching holes based on the spacer and the conductive foil being attached. The plurality of punching holes may be positioned to miss each other. The touch sensor assembly may further include a touch booster that is disposed on a top surface of the conductive foil to contact the exterior member, the touch booster being configured to elastically deform according to a displacement of the exterior member to press the sensor upon being touched.

According to another aspect, a refrigerator door includes a front panel defining an outer appearance of a front surface of the door and in which a display window is disposed, a deco member coupled to the front panel, the deco member defining an insertion hole on one side of the deco member, a door liner coupled to the deco member to define a rear surface of the door, an insulation material filled into a space defined by the front panel, the deco member, and the door liner, a frame defining a rear space of the front panel, a display assembly inserted through the insertion hole after the insulation material is filled and disposed in the space defined by the frame, the display assembly being configured to irradiate light passing through the display window into the rear space of the front panel to display an operation state of a refrigerator, and a touch sensor assembly comprising a sensor that is closely attached to a rear surface of the front panel to detect deformation of the front panel due to a pushing manipulation by a user. The display assembly includes a display PCB on which an LED for irradiating the light is mounted, and a sensor control part configured to process a signal generated by the touch sensor assembly is mounted on the display PCB.

Implementations according to this aspect may include one or more of the following features. For example, the touch sensor assembly may include an elastic member configured to press the sensor toward the front panel. The elastic member may be disposed on a rear surface of a sensor PCB and configured to support the sensor PCB. The sensor may is provided in plurality, and the elastic member may be disposed between the plurality of sensors. A mounting display part on which a mounted position of the elastic member is displayed may be disposed on a rear surface of the sensor PCB. The elastic member may be disposed on each of both sides of the sensor outside an outer end of the sensor. The elastic member may include a plurality of supports each of which extends from the sensor PCB that is disposed outside the sensor, and a connection part connects corresponding ends of the supports to each other. The touch sensor assembly may include a sensor PCB on which the sensor is mounted, and a sensor support that is recessed to support a circumference of the sensor may further be disposed on the sensor PCB. The touch sensor assembly may include a touch booster disposed between the sensor and the front panel and configured to transmit displacement of the front panel, which occurs when the front panel is pushed, into the sensor. The touch booster may include a first extension part extending from one side, a second extension part extends in a direction that is opposite to that of the first extension part; and a common part contacting the first and second extension parts, the common part contacting the sensor at a position corresponding to the sensor.

In some implementations, the touch booster may include a common part contacting the sensor, and a cut part that is spirally cut toward a center of the common part. The touch booster may include a common part that moves along the displacement of the exterior member, and a protrusion contacting the sensor is further disposed on the common part. The touch sensor assembly may include a sensor housing defining a space in which a sensor PCB, on which the sensor is mounted, is seated, and a touch booster disposed at a front side of the sensor PCB to cover an opening of the sensor housing, the touch booster being mounted movable in a front/rear direction on the sensor housing and closely attached to the front panel. A hook and hook groove which are coupled to each other may be disposed on/in the sensor housing and the touch booster, respectively, and the hook groove may have a size that is large enough to allow the touch booster to move in a front/rear direction. The hook and hook groove may be coupled to each other so that a front surface of the touch booster further protrudes from that of the sensor housing. An adhesion member for allowing the sensor housing to adhere to the front panel may be disposed on a circumference of the opening. A booster support protruding along the opening to restrict backward movement of the touch booster may further be disposed on the sensor housing. A wire hole through which a wire connected to the sensor PCB is accessible may be defined in a side surface of the sensor housing.

In further implementations, the touch sensor assembly may include a housing cover closely attached to the front panel, a housing body coupled to the housing cover to define a space in which a sensor PCB, on which the sensor is mounted, is accommodated, and a plurality of elastic members disposed between the sensor PCB and the housing body to press the sensor PCB toward the front panel. A plurality of cover coupling parts and body coupling parts that match each other may be disposed at the same distance on the housing cover and the housing body, respectively, and based on the housing cover and the housing body being coupled to each other, the elastic member may be configured to be pressed by the housing body. The cover coupling part and the body coupling part may be disposed on both sides of the sensor, respectively, and the cover coupling part, the body coupling part, and the sensor may be disposed along a common extension line. The elastic member may be disposed on each of both sides of the sensor, and the cover coupling part and the body coupling part may be disposed between the elastic members. A sensor terminal to which a wire for supplying power is connected may be disposed on a rear surface of the sensor PCB, and the wire may be connected to a side of the sensor terminal. A terminal hole that is opened in a position of the housing body corresponding to the sensor terminal to allow a connector to be exposed therethrough may be defined in the housing body. A mounting guide configured to guide mounting of the elastic member may be disposed on a bottom surface of the housing body. An opening may be defined in the housing cover, and a touch booster transmitting displacement of the front panel, which occurs when the front panel is touched, into the sensor may be mounted on the opening. The opening may have a size corresponding to that of the sensor PCB, and an extension rib contacting a circumference of the sensor PCB may further be disposed along the opening. The touch booster may be mounted movable in a front/rear direction, and the touch booster may be supported by the elastic member and disposed to further protrude than a front surface of the housing cover.

In some cases, the housing cover may include a sensor part on which a touch booster transmitting displacement of the front panel, which occurs when the front panel is touched, into the sensor is movably mounted, and a display part having a second through hole corresponding to the display window, the display part guiding the mounting of the display assembly. The sensor part and the display part may be integrated with each other. The display assembly may be slidably mounted on the housing cover. In some cases, the touch sensor assembly may include a sensor PCB on which a copper film is printed, a piezo-sensor mounted on one surface of the sensor PCB, a spacer attached to one surface of the sensor PCB, the spacer having a sensor hole in which the sensor is accommodated, and a conductive foil attached to ne surface of the spacer to form a conductive pattern having a lattice shape and connecting an electrode of a top surface of the sensor to a common contact point of the PCB. The spacer, ay define an air vent that is cut into the sensor hole and extended along a direction of attachment of the spacer, the air vent being configured to discharge air bubbles between the spacer and the sensor PCB. A guide part for guiding the spacer and the conductive foil so that the spacer and the conductive foil are disposed in fixed position on the sensor PCB may be disposed on each of the spacer and the conductive foil. The guide part may define a plurality of punching holes passing through the same position of the spacer and the conductive foil, and a working rod disposed on one surface of the sensor PCB may pass through the plurality of punching holes based on the spacer and the conductive foil being attached. The plurality of punching holes may be positioned to miss each other.

In some implementations, the refrigerator door may further include a touch booster that is disposed on a top surface of the conductive foil to contact the exterior member, the touch booster being configured to elastically deform according to a displacement of the exterior member to press the sensor upon being touched. In some cases, the refrigerator door may further include a cover display attached to a rear surface of the front panel at a position corresponding to the display window and on which the touch sensor assembly is mounted. An accommodation part in which the touch sensor assembly is inserted may be opened in the cover display, and front surfaces of the cover display and the touch sensor assembly may be disposed on the same plane. The accommodation part may extend in the mounting direction of the touch sensor assembly, and the refrigerator may further include a housing support surrounding and supporting a circumference of the touch sensor assembly. A housing coupling part that is hooked with one side of the accommodation part may be disposed on the touch sensor assembly. The touch sensor assembly and the sensor control part may be connected to each other by using a cable connector. At least one cable connector may be connected, and the cable connector may have a length that is extendable to reach an outside of the insertion hole. The cable connector may include a first cable connector connected to the touch sensor assembly, and a second cable connector connected to the sensor control part. The first cable connector and the second cable connector may be connected to each other outside of the insertion hole. An adhesion member configured to adhere a rear surface of the front panel may be disposed on an entire surface of the touch sensor assembly except for the opening and a front surface of the display assembly.

In some cases, the refrigerator door may further include a frame display to which the display assembly is fixed and mounted, the frame display being inserted into an inner space of the frame through the insertion hole in the state where the display assembly is mounted. In some cases, the refrigerator door may further include a frame handle extending from one side of the frame display toward the insertion hole, the frame handle being configured to be grasped by a user when the frame display is inserted. The refrigerator may further include a cover display attached to a rear surface of the front panel and on which a guide rail guiding the mounting of the display assembly, the cover display having a second through hole communicating a first through hole defining the display window and through which light emitted from the LED passes. The first through hole may have a size less than that of the second through hole, and a plurality of first through holes may be defined within a region of the second through hole. A blocking part protruding to contact the rear surface of the front panel may further be disposed around the second through hole, and an adhesion member configured to adhere the cover display to the front panel may be disposed outside the blocking part. A diffusion sheet may be disposed between the first and second through holes. A reflector defining a third through hole that communicates with the second through hole may be disposed on the display PCB, and the LED may be disposed inside the third through hole. A cover support supporting the cover display so that the cover display is closely attached to the rear surface of the front panel may be disposed on an inner surface of the frame. A protrusion protruding to line or point contact a rear surface of the cover display may further be disposed on a front surface of the cover support. A restriction part protruding laterally may be disposed on each of both sides of the cover display, and a restriction groove that is recessed in a shape corresponding to that of the restriction part to accommodate the restriction part may be defined in the inner surface of the frame corresponding to the restriction part.

In some implementations, the display PCB may include a reflector disposed on a front surface of the display PCB to irradiate light emitted from the LED onto the display window, and a display terminal disposed on an end of the display PCB, the display terminal being electrically connected to the sensor control part. The display terminal may be disposed on a rear surface of the display PCB. The display terminal may be disposed on an upper end of the display PCB at a side that is away from the touch sensor assembly. A support plate closely attached to the front panel to prevent the front panel from being deformed may further be disposed in an inner space of the frame above the display assembly. A plate support that is stepped to support both ends of the support plate so that the support plate is closely attached to the front panel may further be disposed on each of both left/right sides of the frame. A sealing member formed of a transparent material may be filled into a plurality of first through holes defining the display window to block the first through hole and to allow light emitted from the LED to pass therethrough. A wire entrance through a wire electrically connected to the display assembly is accessible may be opened in the frame. An acoustic output device for outputting an operation of the refrigerator as sound may be disposed in an inner space of the frame.

According to another aspect, a method for manufacturing a refrigerator door includes assembling a display assembly with a touch sensor assembly, attaching a cover display and the touch sensor assembly to a rear surface of a front panel, attaching a frame to the front panel, filling a foaming solution into a door except for a space defined inside the frame to form an insulation material, and inserting the display assembly into the frame to mount the display assembly.

Implementations according to this aspect may include one or more of the following features. For example, in this method, the touch sensor assembly may be coupled to the cover display in the state where the touch sensor assembly is assembled. The cover display and the touch sensor assembly may be attached to the front panel at a time by using an adhesion member in the state where the cover display and the touch sensor assembly are coupled to each other. When the touch sensor assembly is assembled, a working rod may be disposed on a sensor PCB to pass through a spacer and a punching hole of a conductive foil. When the spacer is attached, the spacer may gradually attached in a longitudinal direction of a vent hole. After a first through hole of the front panel is formed, a sealing member formed of a urethane or epoxy material through which light is transmittable may be filled into the first through hole to block the first through hole. A diffusion sheet for covering the first through hole may be attached to the rear surface of the front panel. The cover plate may be attached to so that a second through hole formed in the cover display communicates with the first through hole formed in the front panel. A reference point display part for attaching the cover display to a fixed position may be formed on the rear surface of the front panel. A coordinate of the reference point display part may be set through an image that is photographed by using a camera, and the cover display may be transferred to a designated coordinate to allow the cover display to adhere to the fixed position.

In some implementations of this method, the front panel may be fixed in position by using a fixing jig, and the cover display may be attached to the fixed position by using an attaching jig that is vertically movable at a set position. A through jig made up of a plurality of pins each of which pass through each of the first through holes to extend upward may be disposed under the front panel, and the cover display may be attached to the fixed position so that the pin passing through the first through hole passes through the second through hole. The display assembly may be inserted along a guide rail of the cover display, and as the display assembly is inserted more and more, the display assembly may be more closely attached to the rear surface of the cover display. When the display assembly is completely mounted, the display assembly may be closely attached to the rear surface of the cover display, and the first through hole, the second through hole, and a third through hole formed in the display assembly may be aligned to communicate with each other. A light source for irradiating light successively passing through the first and second through holes may be disposed under the front panel, and the cover display may be attached to the fixed position along the light of the light source, which successively passes through the first and second through holes. When the frame is attached, a pressing part formed on the frame may push each of both left and right ends of the cover display to maintain the state in which the cover display is closely attached to the front panel. When the touch sensor assembly is attached, an adhesion member may be disposed on an entire surface of the touch sensor assembly except for a touch booster to adhere to the front panel. A sensor control part controlling an operation of the touch sensor assembly may be disposed on the display assembly, and the insulation material may be filled after the touch sensor assembly is mounted. The sensor control part may be connected to the touch sensor assembly by a cable connector after the insulation material is filled. After the insulation material is filled, the sensor control part and the touch sensor assembly may be connected to each other, and the display assembly may be inserted into an inner space of the frame.

According to another aspect, a refrigerator door includes a front panel defining a front appearance of the refrigerator door, the front panel including a display window, a touch sensor assembly that is closely attached to a rear surface of the front panel, the touch sensor assembly being configured to detect deformation of the front panel caused by a user's pushing manipulation, a cover display to which the touch sensor assembly is coupled, an adhesion member configured to adhere the cover display to the rear surface of the front panel, a frame defining a space for accommodating the cover display at a rear position of the front panel, the frame including a cover support that is configured to push the cover display toward the front panel to closely contact the cover display to the front panel, and a display assembly disposed in the space defined by the frame, the display assembly being configured to irradiate light through the display window to display an operation state of the home appliance to the user.

Implementations according to this aspect may include one or more of the following features. For example, a front surface of the cover support may include one or more protrusions that protrude forward toward the front panel, the one or more protrusions being oriented transverse to an insertion direction of the cover display. The touch sensor assembly may be movably coupled to the cover display such that the touch sensor assembly moves in a front/rear direction relative to the cover display after coupling.

According to another aspect, a home appliance includes a front panel defining a frontal appearance of the home appliance, the front panel including a touch manipulation part, a housing cover attached to a rear surface of the front panel by an adhesion member, a front surface of the housing cover defining an opening at a position corresponding to a position of the touch manipulation part, a touch booster that is inserted within the opening and movably coupled to the housing cover, the touch booster being configured to directly contact the front panel, a sensor PCB configured to detect a displacement of the front panel through a movement of the touch booster, and an elastic member contacting a rear surface of the sensor PCB and configured to support the sensor PCB by pressing the sensor PCB toward the front panel.

Implementations according to this aspect may include one or more of the following features. For example, based on the sensor PCB being pressed by the elastic member, a front surface of the touch booster may be positioned closer to the rear surface of the front panel than the front surface of the housing cover. In some cases, the touch booster may be movably coupled to the housing cover by a plurality of hooks.

According to another aspect, a sensor PCB includes a plastic member, a copper film disposed on an upper surface of the plastic member, a plurality of sensor supports defined by the copper film and the plastic member, the plurality of sensor supports being placed apart from each other, a plurality of metal plates that contact the copper film and cover the plurality of sensor supports, a plurality of ceramic devices attached to an upper surface of the metal plate, each of the ceramic devices having a smaller area than each of the metal plates, a spacer disposed on an upper surface of the copper film, the spacer defining a first through hole and a plurality of sensor holes formed at positions corresponding to the plurality of ceramic devices, and a conductive foil attached to the copper film via the spacer, the conductive foil defining a second through hole at a position corresponding to the first through hole such that the first and second through holes are aligned, the conductive foil further including a conductive line having a mesh shape on a lower surface of the conductive foil.

According to another aspect, a method for manufacturing a refrigerator door is disclosed, wherein the refrigerator door includes a metallic front panel defining a frontal appearance of the refrigerator door and having a plurality of first through holes, a cover display having a plurality of second through holes defined at positions corresponding to positions of the first through holes, an adhesion member adhering the cover display to a rear surface of the front panel, a deco member coupled to the front panel, a door liner defining a rear surface of the refrigerator door by coupling with the deco member, an insulation member filled in a space formed by the front panel, the deco member, and the door liner, an insertion opening formed at a position of the deco member, a frame defining a space at a rear position of the front panel to receive the cover display, the space configured to communicate with the insertion opening, and a display assembly disposed in the space of the frame by passing through the insertion opening and irradiating light passing through the first and second through holes. This method includes attaching the cover display to the front panel using an adhesion member based on a fixing jig being closely contacted to the front panel.

Implementations according to this aspect may include one or more of the following features. For example, closely contacting the fixing jig to the front panel may include passing a plurality of pins that extend away from an upper surface of the fixing jig through the plurality of first through holes of the front panel.

The details of one or more implementations are set forth in the accompanying drawings and the description below. Other features will be apparent from the description and drawings, and from the claims.

BRIEF DESCRIPTION OF THE DRAWINGS

FIG. 24 is a perspective view illustrating an example elastic member of the touch sensor assembly.

FIG. 25 is a perspective view illustrating another example of the elastic member of the touch sensor assembly.

DETAILED DESCRIPTION

Reference will now be made in detail to examples illustrated in the accompanying drawings.

Although a side by side type refrigerator is illustrated for convenience in some implementations, the present disclosure may be applied to all types of refrigerators as well as other appliances.

Figure 1:
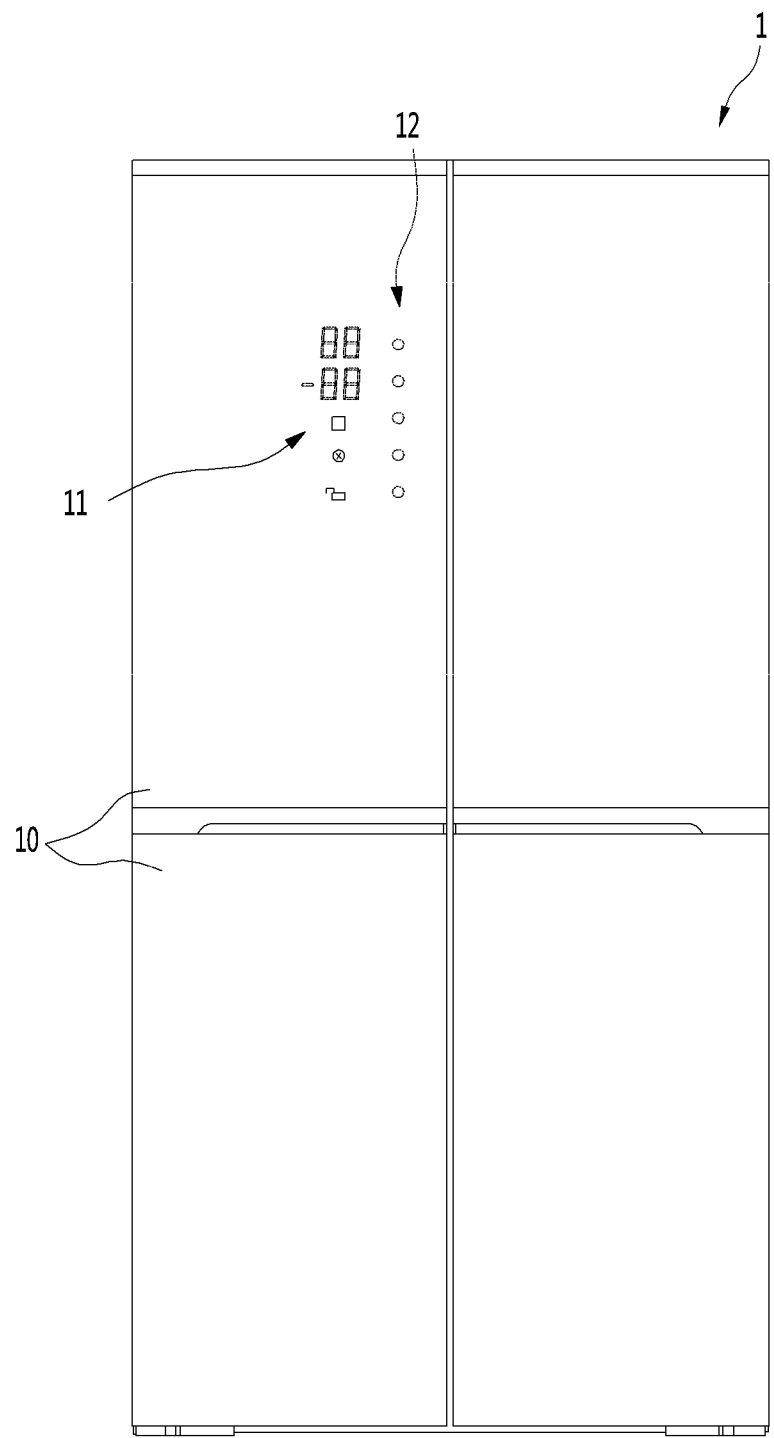
FIG. 1 is a front view of an example refrigerator.

Referring to FIG. 1, an example refrigerator 1 includes a cabinet defining a storage space and a refrigerator door 10 mounted on the cabinet to open or close the storage space. Here, an outer appearance of the refrigerator 1 may be defined by the cabinet and the refrigerator door 10.

The storage space may be partitioned into both left/right sides and/or may be vertically partitioned. A plurality of refrigerator doors 10 for opening/closing the spaces may be disposed on the opened spaces of the storage space. Each of the refrigerator doors 10 may open and close the storage space in a sliding or rotating manner. Also, when the refrigerator door 10 is closed, the refrigerator door 10 may define a front outer appearance of the refrigerator 1.

A display window 11 and a touch manipulation part 12 may be disposed on one or more of the plurality of refrigerator doors 10 at a height that is convenient for user viewing and manipulation.

The display window 11 may be configured to display an operation state of the refrigerator 1 to the outside. A symbol or figure may be expressed using light that is irradiated into the refrigerator door 10 to allow a user to identify the symbol or figure.

The touch manipulation part 12 may be used for performing touching manipulation to operate the refrigerator 1. The touch manipulation part 12 may be disposed on a portion of a front surface of the refrigerator door 10. Here, a portion at which the pushing manipulation is capable of being detected may be defined by plane processing methods such as printing or etching or various light transmission methods.

Figure 2:
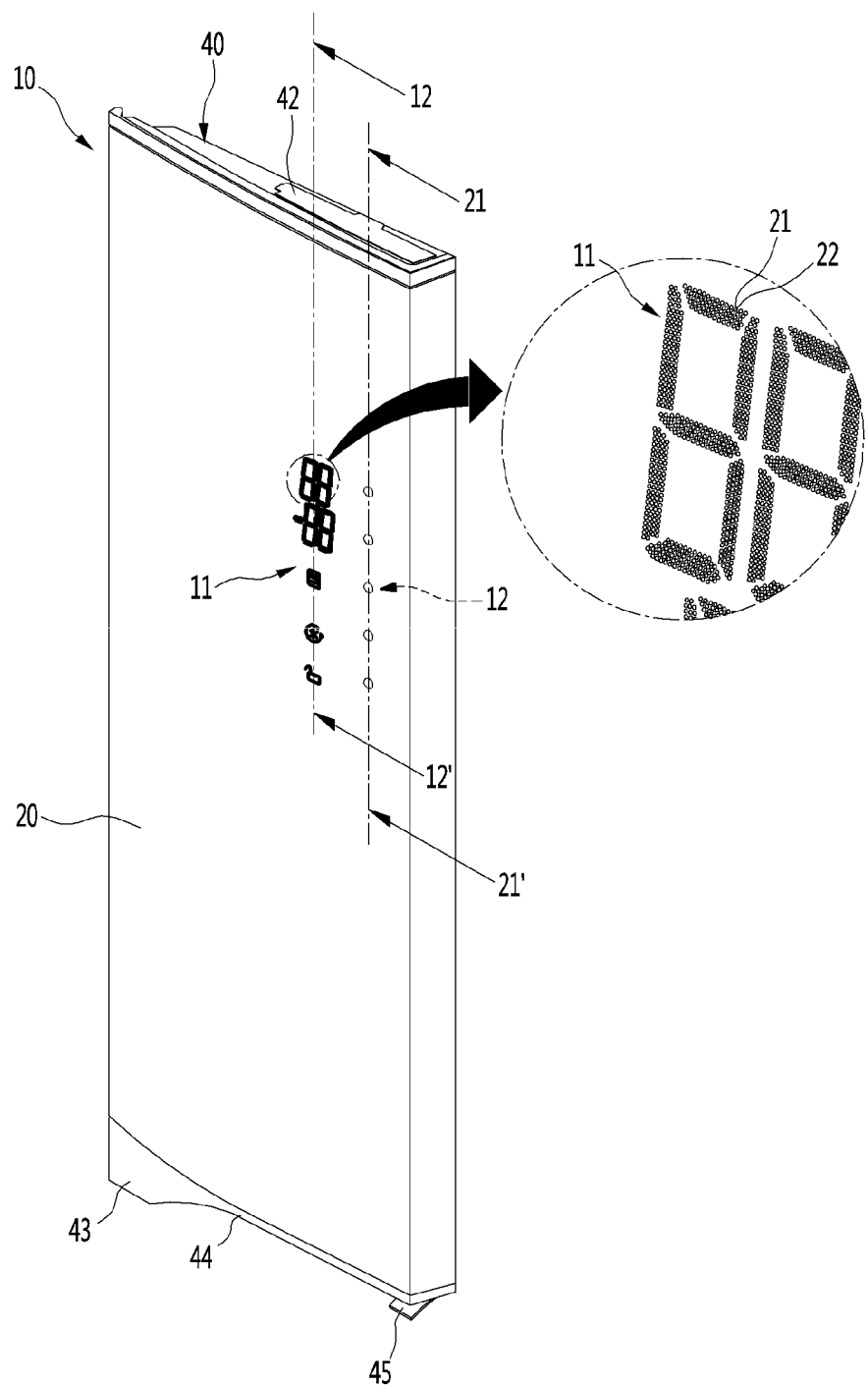
FIG. 2 is a perspective view of an example refrigerator door.
Figure 3:
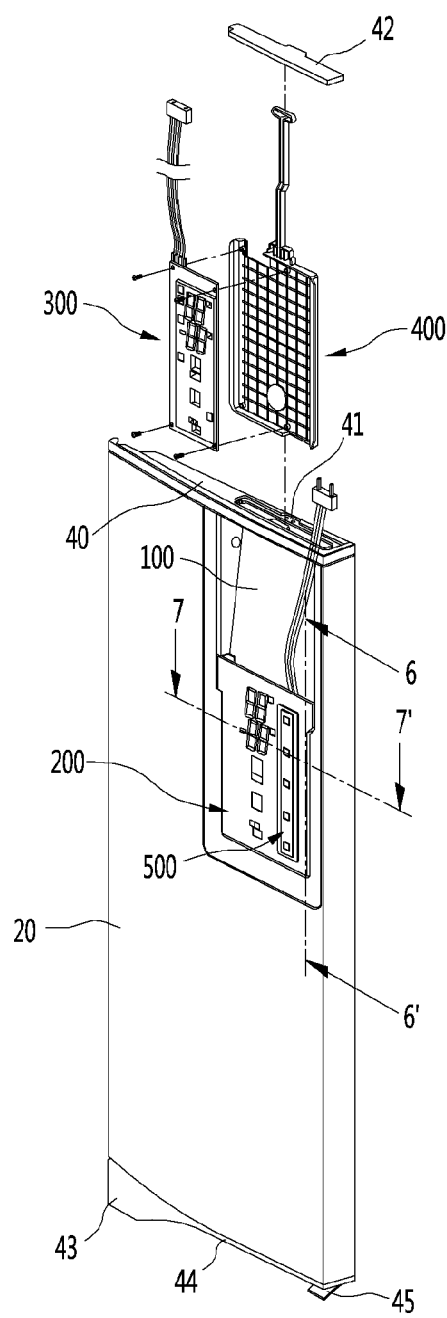
FIG. 3 is an exploded perspective view illustrating an example mounted structure of a display assembly of the example refrigerator door.
Figure 4:
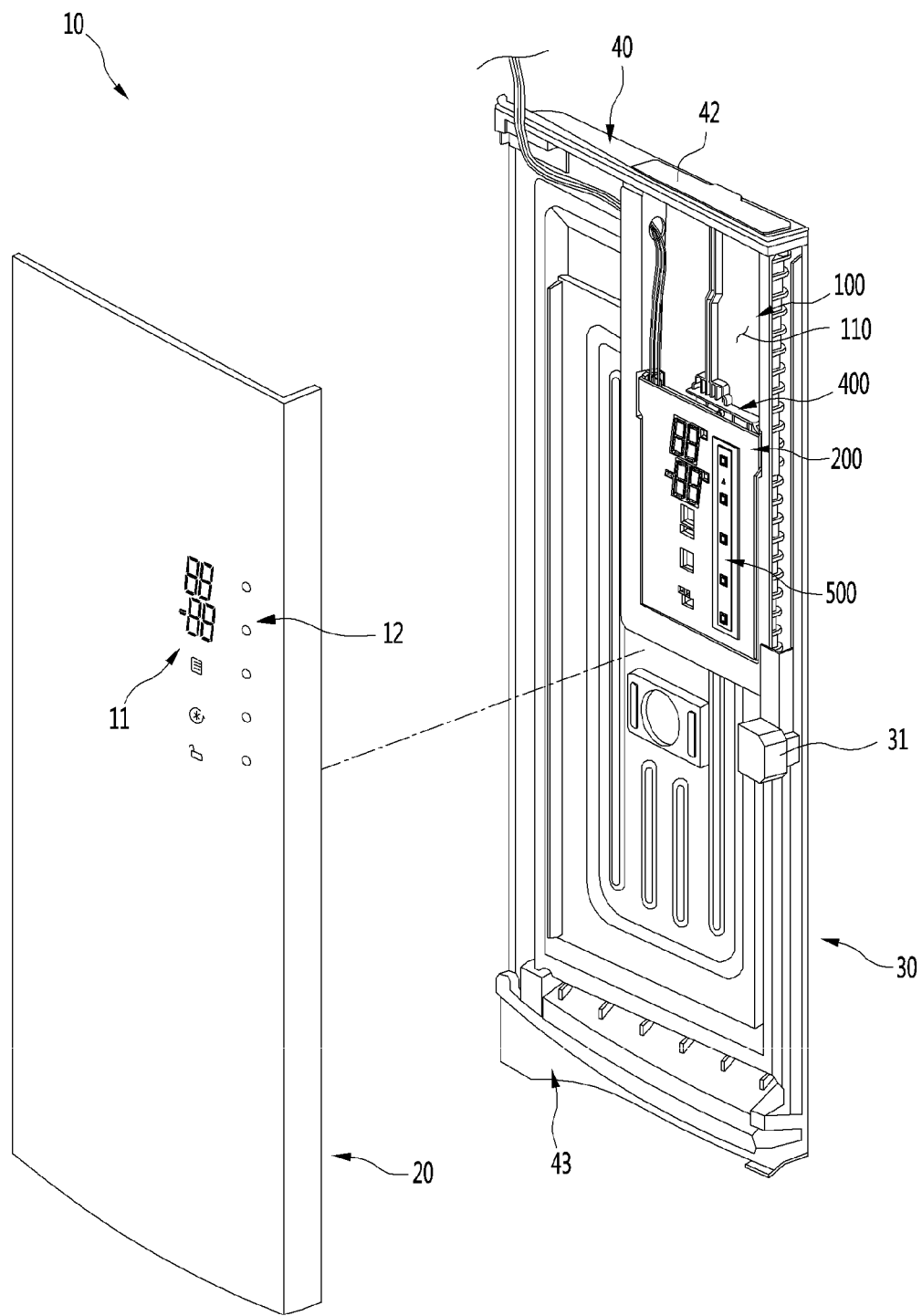
FIG. 4 is an exploded perspective view showing a separated front panel of the example refrigerator door.

Referring to FIGS. 2 to 4, the refrigerator door 10 includes a front panel 20 defining a front outer appearance thereof, deco members 40 and 43 that are respectively disposed on upper and lower ends of the front panel 20, and a door liner 30 defining a rear outer appearance thereof. Accordingly, an overall outer appearance of the refrigerator door may be defined by the front panel 20, the deco members 40 and 43, and the door liner 30.

In more detail, the front panel 20 may define the front outer appearance of the refrigerator door 10 and be formed of a stainless steel material having a generally plate shape. In some cases, the front panel 20 may form at least a portion of the outer appearance of the refrigerator door 10. In some cases, the front panel 20 may be configured to serve as an exterior member for various home appliances other than the refrigerator.

The front panel 20 may be formed of various metals or a material having the same or similar texture as metal. In some cases, the front panel 20 may be formed of a glass or plastic material.

In some cases, the front panel 20 may define a portion of a side surface of the refrigerator door 10 as well as the front surface of the refrigerator door 10. Fingerprint prevention processing or hairline processing may be further performed on a surface of the front panel 20.

The display window 11 may be defined by a plurality of first through holes 21 provided in a portion of the front panel 20. The display window 11 may be formed by a set of the plurality of first through holes 21 that are punched at a predetermined distance to show figures or symbols. For example, the set of the plurality of first through holes 21 may be disposed in the form of seven segments that can be selectively illuminated to express numerals or letters. Alternatively or additionally, the set of the plurality of first through holes 21 may be defined in the form of a special symbol or pattern that is capable of representing a state of the refrigerator 1. The display window 11 may be defined to correspond to second and third through holes 220 and 321 which will be described later so that light emitted from an LED 313 of a display assembly 300 is transmitted therethrough. The first through hole 21 may be formed with a fine size through laser processing or etching. Accordingly, the first through hole 21 may have a size for which it is difficult to easily identify the operation state of the refrigerator when light is not transmitted therethrough.

In some implementations, a sealing member 22 may be filled into the first through hole 21. The sealing member 22 may prevent the first through hole 21 from being blocked or clogged by foreign substances. The sealing member 22 may be formed of a silicon or epoxy material so that the first through hole 21 is sealed but still allows transmission of light. In some cases, the inside of the first through hole 21 may be filled with the sealing member 22 to help prevent or mitigate a processed surface of the first through hole 21 from being corroded.

The sealing member 22 may be filled into the first though hole 21 through a separate process. In some cases, the sealing member 22 may be filled into the first through hole 21 while a coating process is performed on the surface of the front panel 20, or the sealing member 22 may be attached in the form of a sheet to block the plurality of first through holes at the same time. For example, a fingerprint solution and/or a diffusion sheet within the front panel 20 may function as the sealing member 22.

The touch manipulation part 12 can be capable of being touched by the user. In some cases, when the user touches the touch manipulation part 12, an area on which the user's touch is detected by a touch sensor assembly 500 may be displayed. The touch manipulation part 12 may be formed on the front panel 20 through etching, printing, or other surface processing techniques. Thus, the touch manipulation part 2 may not be readily visible to the user when viewed from the outside. Instead, the entire outer appearance of the front panel 20 may be perceived as having the characteristic surface texture of the front panel 20.

The door liner 30 may have a surface that is coupled to the front panel 20 and thus facing the inside of the storage space. The door liner 30 may be injection-molded by using plastic. In some cases, the door liner 30 may have a structure in which a gasket is disposed or mounted along its periphery. In some cases, when the door liner 30 is coupled to the front panel 20, a space may be defined between the door liner 30 and the front panel 20. A foaming solution for forming an insulation material 24 may be filled into the space.

A frame 100 may be attached to a rear surface of the front panel 20. The frame 100 may define a separated space into which the foaming solution is not filled and may accommodate therein the cover display 200, the display assembly 300, the touch sensor assembly 500, and a frame display 400.

The deco members 40 and 43 may define outer appearances of upper and lower portions of the refrigerator door 10. The deco members 40 and 43 may cover the opened upper and lower ends of the refrigerator door 10, which are formed when coupling the front panel to the door liner 30.

An insertion hole 41 and an insertion hole cover 42 for opening/closing the insertion hole 41 may be defined by the upper deco member 40. The insertion hole 41 may pass through the deco member 40 to allow passage into the space that is defined by the frame 100. Thus, the display assembly 300 may be inserted into the frame display 400, with which the display assembly 300 is assembled, through the insertion hole 41. For this, the insertion hole 41 may have a size that allows the frame display 400 to be inserted therethrough. The insertion hole 41 may be positioned vertically above the final desired position of the display cover 200.

In some cases, a hinge hole to which a rotation shaft of the refrigerator door 10 is hinge-coupled may be defined on one side of the deco member 40. Also, the deco member 40 may have a structure in which a wire guided inside the frame 100 is accessible through the hinge hole and then is connected to a power source part of the cabinet.

A door handle 44 may be disposed on the lower deco member 43 of the refrigerator door 10. The door handle 44 may be recessed in a pocket shape to allow the user to rotate the refrigerator door 10. In some cases, a lever 45 for manipulating the opening/closing of the refrigerator door 10 may be disposed on the lower deco member 43 of the refrigerator door 10. A latch assembly 31 may be operated by the manipulation of the lever 45 to selectively maintain the opening or closing of the refrigerator door 10.

The cover display 200 can be attached to the rear surface of the front panel 20. The cover display 200 may guide the mounting of the display assembly 300 on which the LED 313 is mounted. The cover display 200 may be attached to the rear surface of the front panel 20 by a double-sided tape or an adhesion member 25 that is formed by applying primer thereon. Other attachment methods may be used.

The touch sensor assembly 500 for detecting user's pushing action on the front panel 20 may be mounted on one side of the cover display 200. The cover display 200 may have a structure allowing it to be attached to the front panel 20 while it is coupled to the touch sensor assembly 500.

The cover display 200 may be attached at a position such that the display window 11 and the second through hole 220 defined in the cover display 200 match each other. Also, the cover display 200 may be accommodated into the frame 100 while remaining attached.

The display assembly 300 may be inserted into the space within the frame 100 through the insertion hole 41 when it is mounted on the frame display 400. When the frame display 400 is completely inserted, the display assembly 300 may become disposed inside the cover display 200, and light emitted from the LED 313 may pass through the cover display 200 and the display window 11 before being irradiated to the outside.

Referring now to FIGS. 5 to 8, the front and top surfaces of the frame 100 may be opened. That is, when the frame 100 is attached to the front panel 20, the top surface of the frame 100 may define an opened space 110. In some cases, to define the opened space 110, edge portions of the frame 100, except for the edge portion at the upper end of the frame, may be bent toward the front panel 20. The outermost edge portions may be bent in the opposite direction to form a frame adhesion part 120. An adhesion member 25, such as a double-sided tape or adhesive, may be disposed on the frame adhesion part 120 to help attach the frame 100 to the rear surface of the front panel 20.

The frame 100 may have an upper end that contacts the deco member 40 while being attached to the front panel 20. Accordingly, the opened top surface of the frame 100 may be connected with the insertion hole 41 to thereby provide an independent, accessible space within the refrigerator door 10.

Thus, even when the foaming solution for forming the insulation material 24 is injected into the refrigerator door 10, the foaming solution may not be introduced into the inner space of the frame 100, thereby protecting the frame 100. In some cases, a plurality of reinforcing ribs may be disposed on the rear surface of the frame 100, the reinforcing ribs crossing each other in length and width directions. Accordingly, even though the foaming solution, which may create high-pressure, is filled to form the insulation material 24, the frame may not be deformed due to the reinforcing ribs 13, and the inner space of the frame 100 may be maintained. In some cases, a plate support 140 on which a support plate 141 is seated may be disposed on each of both left/right ends of the upper portion of the frame 100. The support plate 141 may be disposed in an upper space of the frame 100, which corresponds to an upper side of the cover display 200, in the state where the cover display 200 is mounted on the support plate 141 to support the front panel 20 from a rear side. Thus, rolling of the portion of the frame corresponding to the front panel 20 may be restricted, and also, the deformation of the front panel 20 by an external impact may be restricted.

The plate support 140 may be stepped to support both ends of the support plate 141. Also, the support plate 141 may be slidably inserted into the space between the plate support 140 and the front panel 20 in the state where the frame 100 is attached to the front panel 20. Alternatively, the support plate 141 may be attached to the rear surface of the front panel 20 when both ends of the plate support 140 are attached to the frame 100 in the fixed state.

A wire entrance hole 150 may be defined in an upper portion of a side surface of the frame 100. The wire entrance hole 150 may provide a passage through which the wire for connecting electronic components to the power source part of the cabinet is accessible. The wire entrance hole 150 may be defined in an upper portion of the side surface of the frame 100 that is adjacent to the hinge of the refrigerator door 10 and be defined in a position that is adjacent to a hinge hole of the refrigerator door 10. In its finished state, the frame 100 can help prevent the foaming solution from being introduced into the frame 100 when the foaming solution is injected into the refrigerator door 10.

In some cases, a restriction groove 160 may be defined in each of both left/right sides of the frame 100. A restriction part 230 protruding laterally from each of both left/right ends of the cover display 200 may be inserted into the restriction groove 160. The restriction groove 160 may be receded to the outside and have a shape corresponding to that of the restriction part 230. Thus, the cover display 200 may be maintained in the desired position without moving.

A cover support 170 for supporting the cover plate 200 may be disposed on a portion of the frame 100 below the restriction groove to correspond to the cover display 200.

The cover support 170 may protrude from each of both left/right surfaces of the frame 100 to push both left/right ends of the cover display 200 from a rear side, thereby supporting the cover display 200.

Thus, when the frame 100 is attached to the front panel 20, and the foaming solution is injected into the refrigerator door 10 in the state where the cover display 200 is attached to the rear surface of the front panel 20, the cover support 170 may push the cover display 200 forward to maintain the state in which the cover display 200 is attached to the front panel 20. Accordingly, even if the adhesion member 25 attaching the cover display 200 to the front panel 20 loses some or all of its adhesion function, the cover support 170 may press the cover display 200 to help the front panel 20 and the cover display 200 stay closely attached to each other.

The cover support 170 may be provided in plurality. In this case, the plurality of cover supports 170 may be vertically disposed at a uniform distance to uniformly push and support the entire cover display 200. Also, a protrusion 171 may protrude forward from a front surface of the cover support 170 that is adjacent to the cover display 200. The protrusion 171 may have a rib or projection shape that is extended in a transverse direction to line or point contact the cover display 200. Thus, even when a contact surface between the cover display 200 and the cover support 170 is uneven, the cover display 200 may not be inclined so that the cover support 170 can apply a uniform pressure to the cover display 200.

The cover display 200 may be formed of a plastic material having a plate shape. The cover display 200 may be accommodated into the frame 100 in the state where the cover display 200 is attached to the front panel 20. Also, the restriction part 230 protruding outward and inserted into the restriction groove 160 may be disposed on an upper portion of each of both left/right ends of the cover display 200.

An accommodation part 210 on which the touch sensor assembly 500 is mounted may be disposed on the cover display 200. Also, a plurality of second through holes 220 may be defined in a position corresponding to the display window 11 in the cover display 200.

The display assembly 300 may include a display PCB 310 on which the LED 313 is mounted and a reflector 320 disposed on a front surface of the display PCB 310.

A control part for driving the LED 313 and a sensor control part for driving the touch sensor assembly 500 may be mounted on the display PCB 310. The sensor control part 330 may process a manipulation signal of the front panel, which can be detected through the touch sensor assembly 500 on the display PCB 310. For this, a sensor PCB 700 and the display PCB 310 of the touch sensor assembly 500 may be connected to each other by using a cable connector 600.

The cable connector 600 may include a first cable connector 610 connected to the sensor PCB 700 and a second cable connector 620 connected to the display PCB 310. The first and second cable connectors 610 and 620 may be connected to each other while the display assembly 300 is mounted on the display assembly 300 in the state where in which the cable connector 620 is connected to each of the sensor PCB 700 and the display PCB 310.

In some cases, the cable connector 600 may have a total length greater than a distance from the touch sensor assembly 500 to the insertion hole 41. In the state where the touch sensor assembly 500 is mounted on the cover display 200, the cable connector 600 and the touch sensor assembly 500 may be connected to each other so that the display assembly 300 is mounted.

Figure 5:
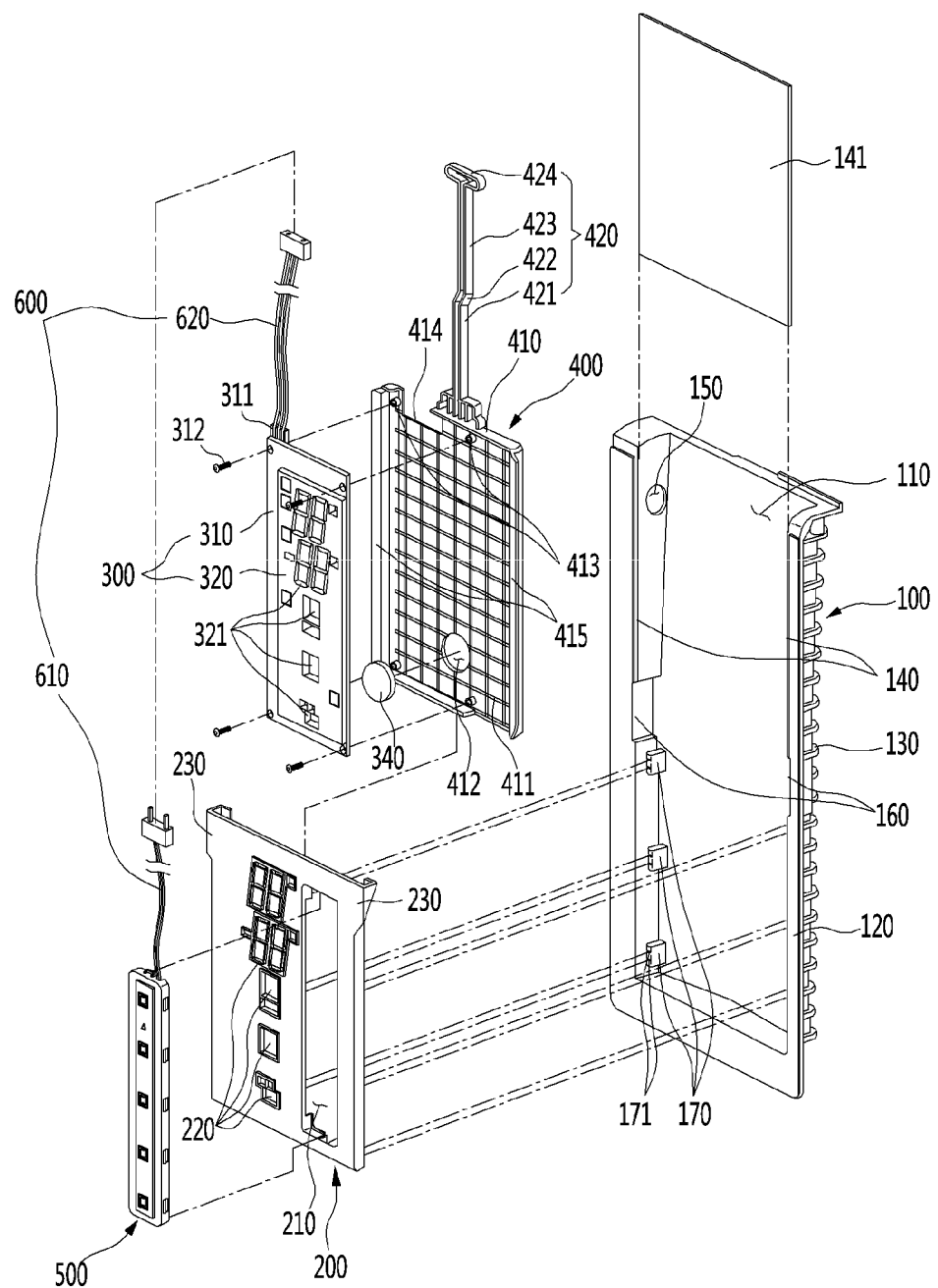
FIG. 5 is an exploded perspective view illustrating an example coupled structure of a touch sensor assembly, a cover display, a display assembly, a frame display, and a frame.
Figure 6:
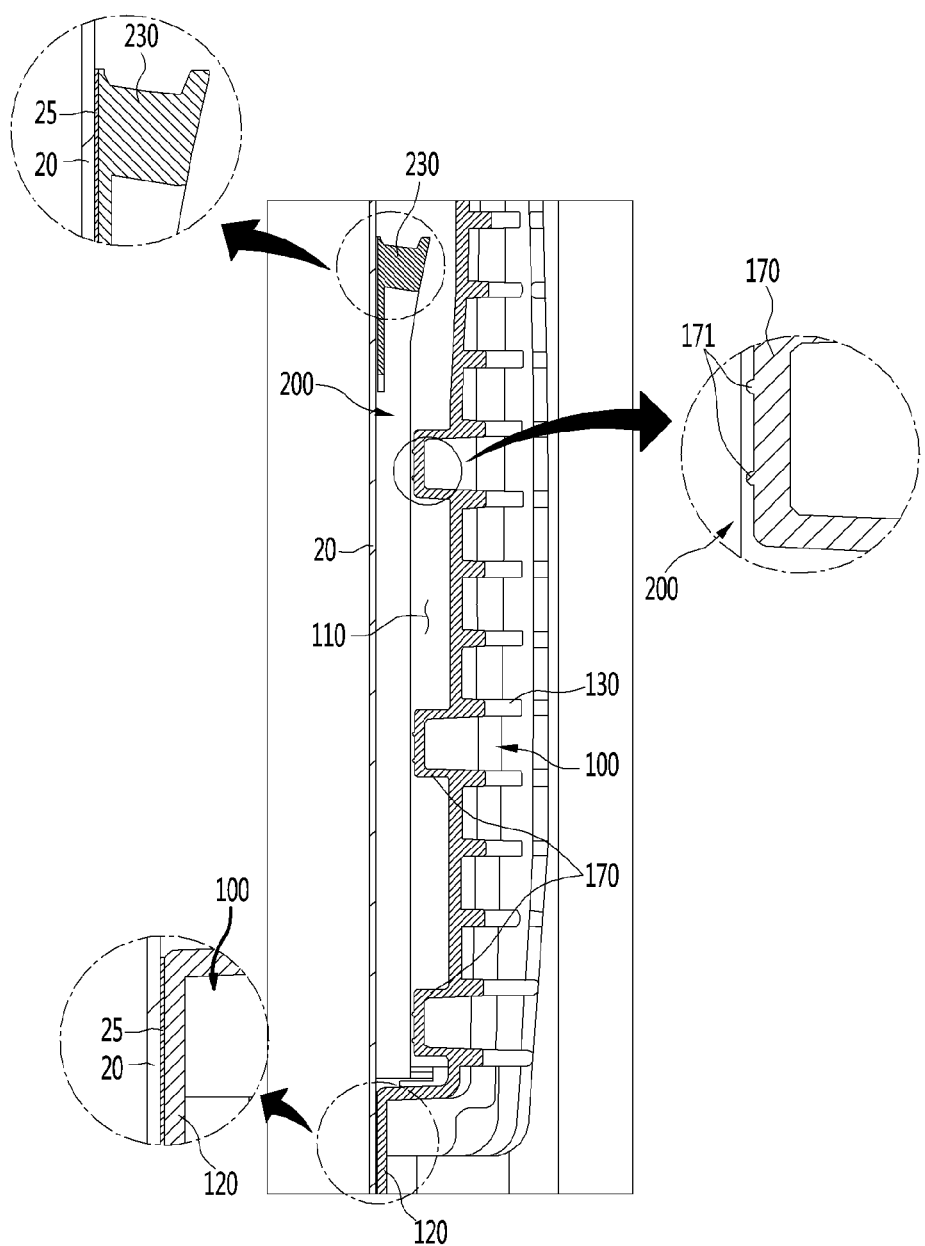
FIG. 6 is a cross-sectional view taken along line 6-6' of FIG. 3.
Figure 7:
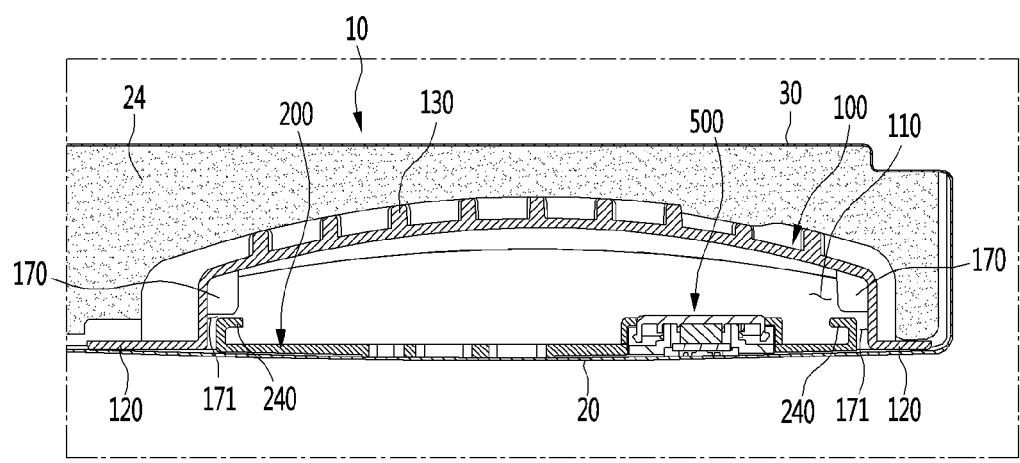
FIG. 7 is a cross-sectional view taken along line 7-7' of FIG. 3.
Figure 8:
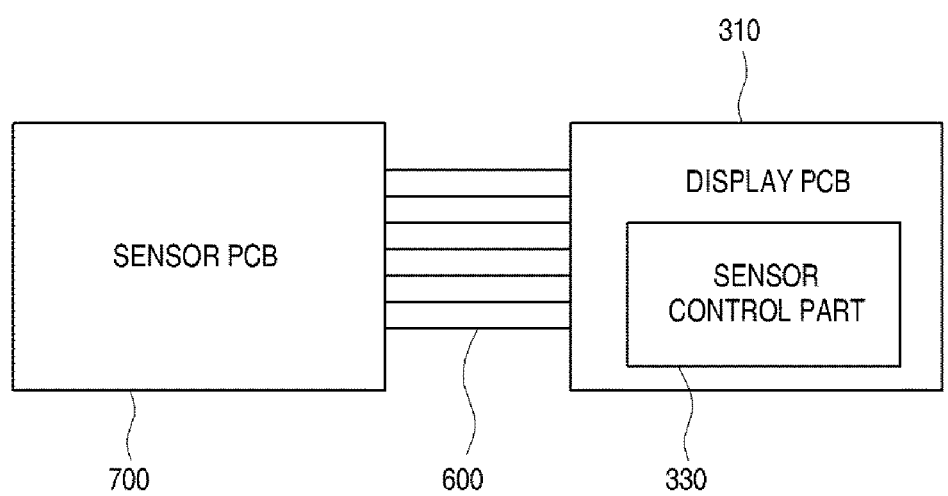
FIG. 8 is a block diagram illustrating an example connection between a sensor PCB and a display PCB.

A display terminal 311 connected to the second cable connector 620 may be disposed on a left side of an upper end of the display PCB 310 (when viewed in FIG. 5). This can help minimize unwanted effects arising from static electricity that is generated when the display terminal 311 is disposed at a position that is far away from the touch sensor assembly 500.

The reflector 320 for guiding light so that the light emitted from the LED 313 travels to the first through hole 21 may be disposed on the front surface of the display PCB 310. The reflector 320 may guide the light emitted from the LED 313 and also space the display PCB 310 and the display terminal 311 from the front panel 20 by a thickness of the reflector 320 to help protect the display PCB 310 against static electricity. Particularly, since the front panel 20 may be formed of a stainless steel material, and the display assembly 300 may be disposed adjacent to the display window 11, the display PCB 310 may be vulnerable to static electricity that is generated as described above. However, since the reflector 320 spaces the display PCB 310 from the front panel 20, the display PCB 310 may be protected against static electricity.

A third through hole 321 communicating with the second through hole 220 and the first through hole 21 may be defined in the reflector 320 to correspond to the LED 313. In the display assembly 300 that is mounted, the frame display 400 may be mounted on the cover display 200, and the first, second, and third through holes 21, 220, and 321 may be closely attached to each other to communicate with each other. Thus, the light emitted from the LED 313 may be irradiated to the outside through the display window 11.

In some cases, an acoustic output device 340 may be disposed on the rear surface of the display PCB 310. The acoustic output device 340 may communicate to the user an operation state of the refrigerator 1 by using sound. For example, a speaker or buzzer may be used as the acoustic output device 340. The acoustic output device 340 may be disposed at a position corresponding to a frame hole 412 of the frame display 400. Thus, sound outputted from the acoustic output device 340 may be transmitted to the user outside the refrigerator door 10 to express the operation state of the refrigerator 1.

The display PCB 310 may be seated on the frame display 400. The frame display 400 may have a plate shape to allow the display PCB 310 to be seated thereon. Also, an edge 410 bent forward along a circumference of the frame display 400 may be provided to form a space into which the display PCB 310 is accommodated. In some cases, a sliding insertion part 415 that is bent in both left/right directions may be disposed on each of both left/right ends of the frame display 400. The sliding insertion part 415 may be inserted into a guide rail 240 disposed on the cover display 200. Thus, the frame display 400 may be mounted on the cover display 200 by the sliding insertion part 415.

Reinforcing ribs 411 that are disposed in length and width directions to form a lattice shape may be further disposed on an entire front surface of the frame display 400. Also, a frame hole 412 may be defined in one side corresponding to the acoustic output device 340.

In some cases, a frame cutting part 414 may be disposed on an upper end of the frame display 400. The frame cutting part 414 may be cut to a size corresponding to the display terminal 311 to prevent the display terminal 311 from interfering with the frame display 400.

In some cases, a boss 413 to which a screw 312 is coupled to fix the display PCB 310 may be disposed on the frame display 400. The boss 413 may be coupled to the screw 312 and also support the display PCB 310 from a lower side.

A frame handle 420 extending upward may be disposed on a central portion of the upper end of the frame display 400. The frame handle 420 may have a predetermined length so that the user holds and manipulate the frame display 400 when the frame display 400 is coupled to the cover display 200.

The frame handle 420 may include a first vertical part extending from the frame display 400, an inclined part 422 that extends backward at an angle from an upper end of the first vertical part 421, and a second vertical part 423 extending upward from an upper end of the inclined part 422. The first and second vertical parts 421 and 423 may extend parallel to each other and be connected to each other by the inclined part 422. Also, a grip part 424 to be grasped by the user may extend from an upper end of the second vertical part 423 in a transverse direction.

Accordingly, the user may grasp the grip part 424 to insert a lower end of the frame display 400 into the insertion hole 41 when the frame display 400 is inserted. Also, the more the frame display 400 is inserted downward, the more the frame display 400 is closely attached to the rear surface of the cover display 200 due to the stepped structure of the frame handle 420.

When the insertion hole cover 42 is closed after the frame display 400 is completely inserted, the insertion hole cover 42 may contact the grip part 424. In some cases, a handle coupling part that is molded in a shape corresponding to that of the grip part 424 may be disposed on a bottom surface of the insertion hole cover 42. When the insertion hole cover 42 is closed, an upper end of the frame handle 420 may be coupled to the handle coupling part and thus maintained in the fixed state.

Figure 9:
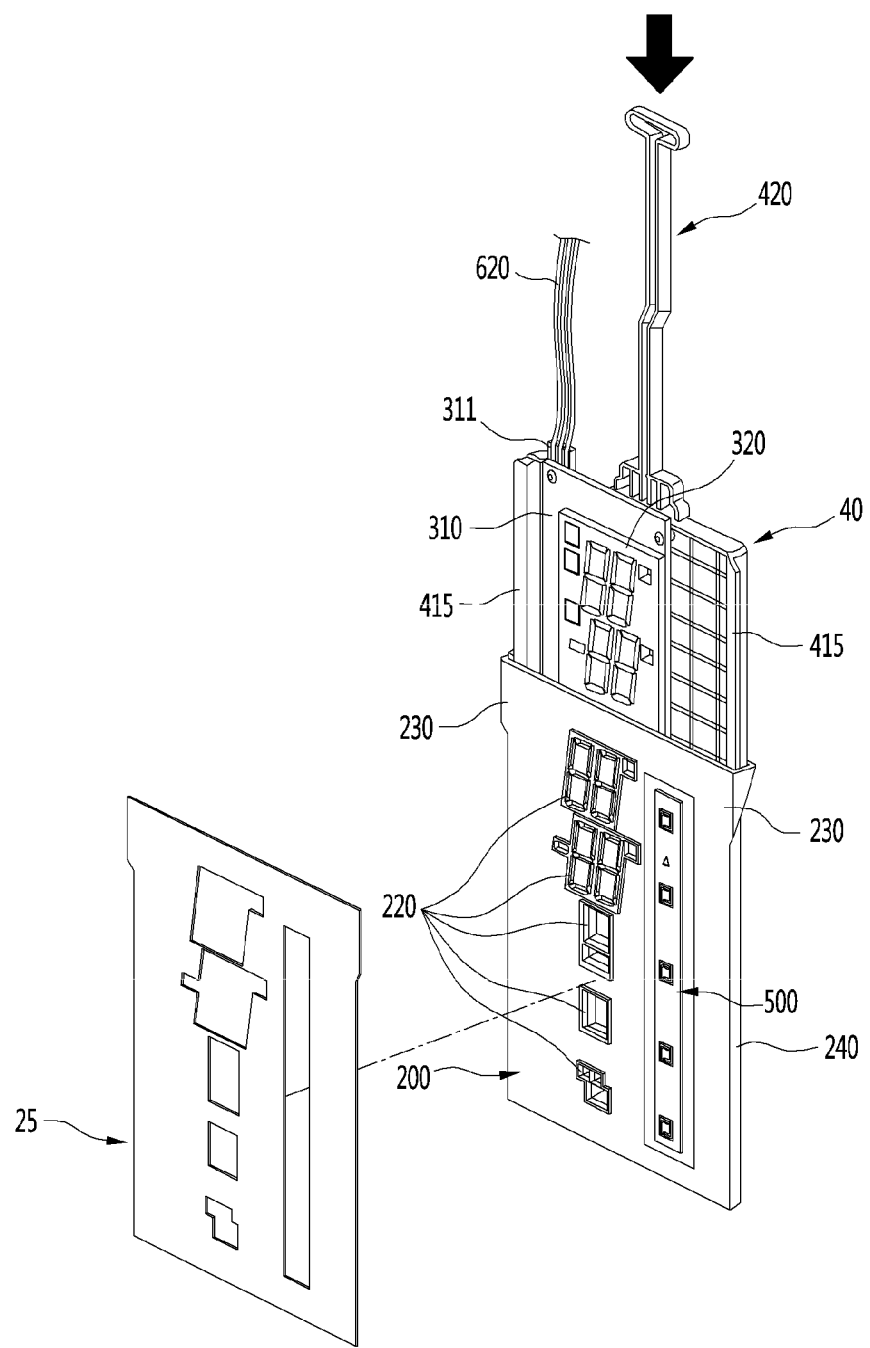
FIG. 9 is a perspective view illustrating an example coupling between the cover display and the frame display.
Figure 10:
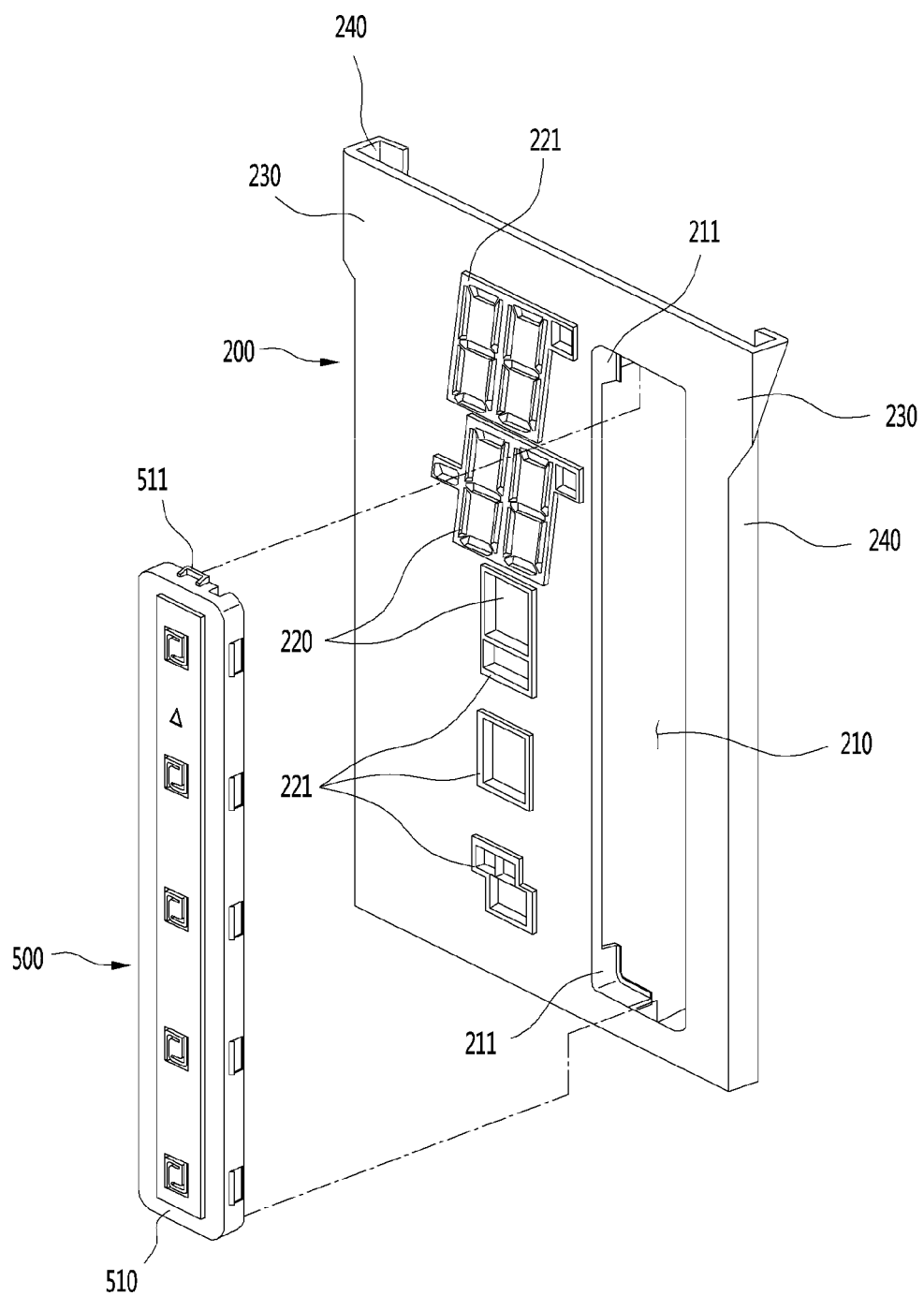
FIG. 10 is an exploded perspective view illustrating an example coupling between the cover display and the touch sensor assembly.
Figure 11:
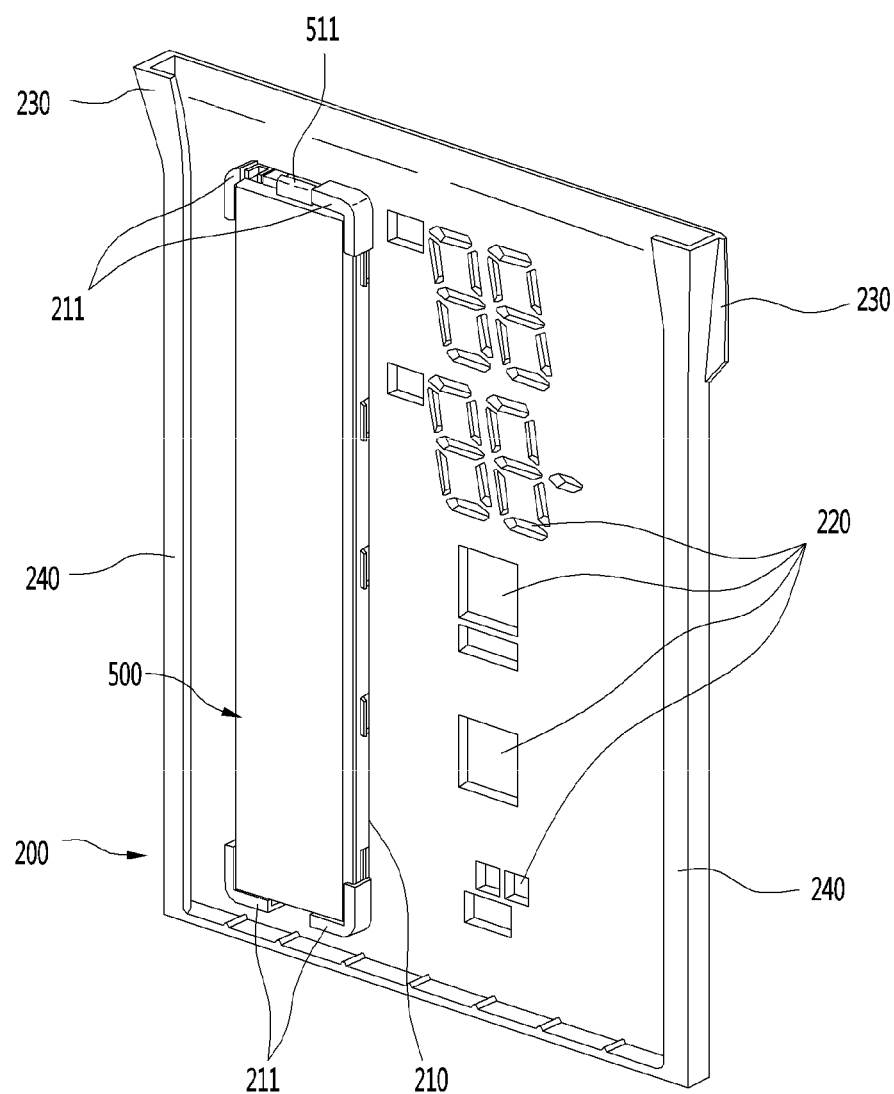
FIG. 11 is a rear perspective view of the cover display with the touch sensor assembly mounted.

Referring now to FIGS. 9 to 11, the guide rail 240 is disposed on each of both left/right ends of the cover display 200. The guide rail 240 may be configured so that both ends of the cover display 200 are bent to allow the sliding insertion part 415 to be inserted into the guide rail 240.

The guide rail 240 may have a wide upper end so that the sliding insertion part 415 may be more easily inserted. The guide rail 249 may have an inclined inner surface. Thus, the more the frame display is inserted, the more the display assembly 300 mounted on the frame display 400 can be closely attached to the cover display 200.

In some cases, when the frame display 400 is completely inserted, the sliding insertion part 415 may be fixed to the inside of the guide rail 240, and the reflector 320 may be completely and closely attached to the rear surface of the cover display 200. Here, the third through hole 321 may be defined to match the second through hole 220.

The cover display 200 may have a flat front surface so that the cover display 200 is attached to the rear surface of the front panel 20. Also, the accommodation part 210 into which the touch sensor assembly 500 is accommodated may be defined in one side of the front surface of the cover display 200. The accommodation part 210 may be opened in a shape corresponding to that of the touch sensor assembly 500 so that the touch sensor assembly 500 is inserted. Also, in the state where the touch sensor assembly 500 is mounted on the accommodation part 210, the front surface of the touch sensor assembly 500 may be disposed on the same plane as that of the cover display 200.

In some cases, the accommodation part 210 may have an inner surface that extends backward from the periphery of the accommodation part 210. Thus, when the touch sensor assembly 500 is mounted, the accommodation part 210 may contact a circumferential surface of the touch sensor assembly 500 to thereby allow the touch sensor assembly 500 to be maintained in a stably mounted state.

In some cases, a housing support 211 may be disposed on each of four corners within the accommodation part 210. The housing support 211 may further extend from the accommodation part 210 to surround and support corners of a sensor housing defining an outer appearance of the touch sensor assembly 500. Here, an end of the housing support 211 may be bent inward to surround and support the circumferential surface and rare surface of the sensor housing. Thus, even when the user pushes the front panel 20 to apply a pressure to the front panel 20, the touch sensor assembly 500 may be restricted from moving backward, instead being maintained in the assembled state.

A housing coupling part 511 that is hooked with the inside of the accommodation part 210 may be disposed on each of upper and lower ends of the sensor housing. The housing coupling part 511 may have a shape similar to a hook to allow the touch sensor assembly 500 to be maintained in the state in which the touch sensor assembly 500 is fixed to the inside of the accommodation part 210. Thus, the touch sensor assembly 500 may be inserted into the accommodation part 210 from a front side, and the housing coupling part 511 may be hooked and restricted at one side of the accommodation part 210. Thus, the touch sensor assembly 500 may be coupled to the cover display 200.

The second through hole 220 may be further defined in the front surface of the cover display 200. The second through hole 220 may be defined in a position corresponding to the first through hole 21 when the cover display 200 is attached to the rear surface of the front panel. The second through hole 220 may be opened in a shape corresponding to the seven segments. In some cases, openings having various shapes for expressing other information may further be defined.

A blocking part 221 may be disposed around the second through hole 220. The blocking part 221 may be disposed outside the second through hole 220 to surround the second through hole 220. The blocking part 221 may protrude forward toward the front panel 20.

In some cases, the adhesion member 25 that is provided for the adhesion of the cover display 200 may be attached to only an outer area of the blocking part 221. Thus, a gap between the first through hole 21 and the second through hole 220, which may be defined by a thickness of the adhesion member 25 when the cover display 200 is attached, may be minimized to thereby prevent light leakage through the gap. The blocking part 221 may protrude to a height at which the light leakage is prevented or mitigated. The blocking part 221 may protrude to a height that is less than that of the adhesion member 25 before the adhesion member 25 is pressed to be attached to the front surface of the cover display 200.

Figure 12:
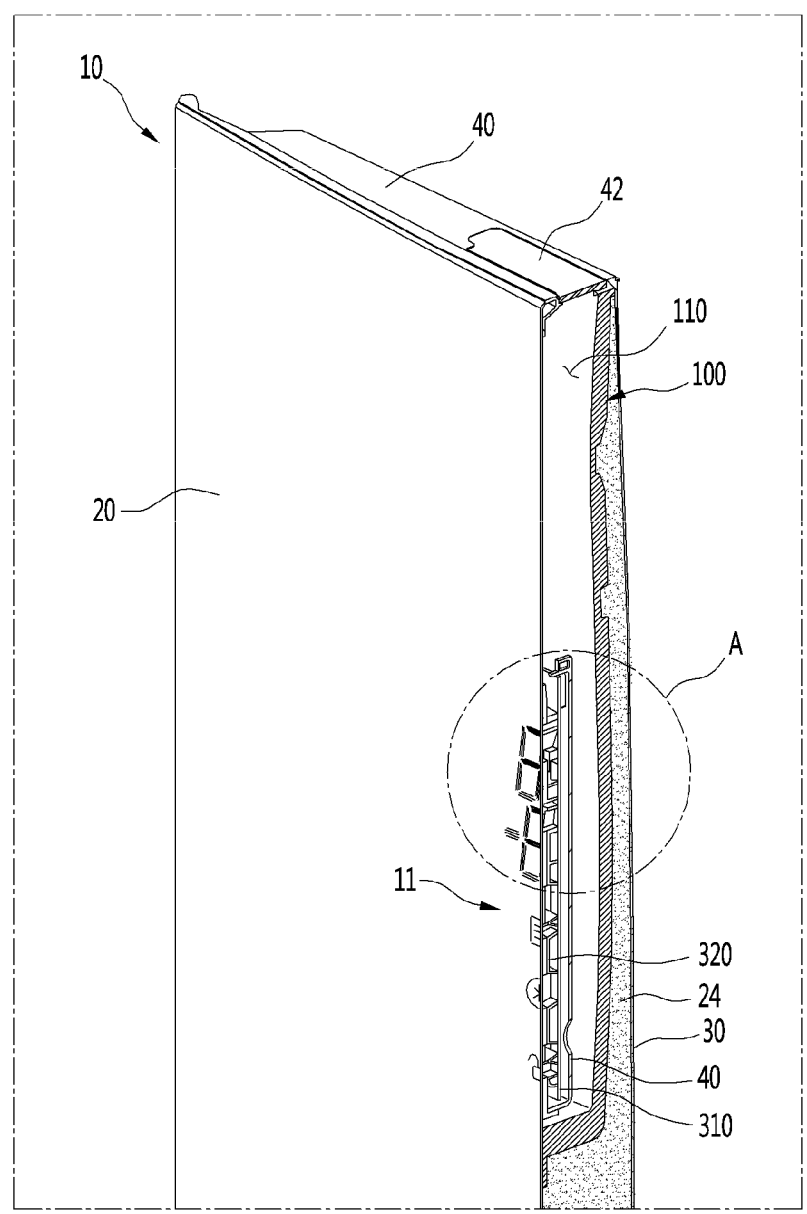
FIG. 12 is a cutaway perspective view taken along line 12-12' of FIG. 2.
Figure 13:
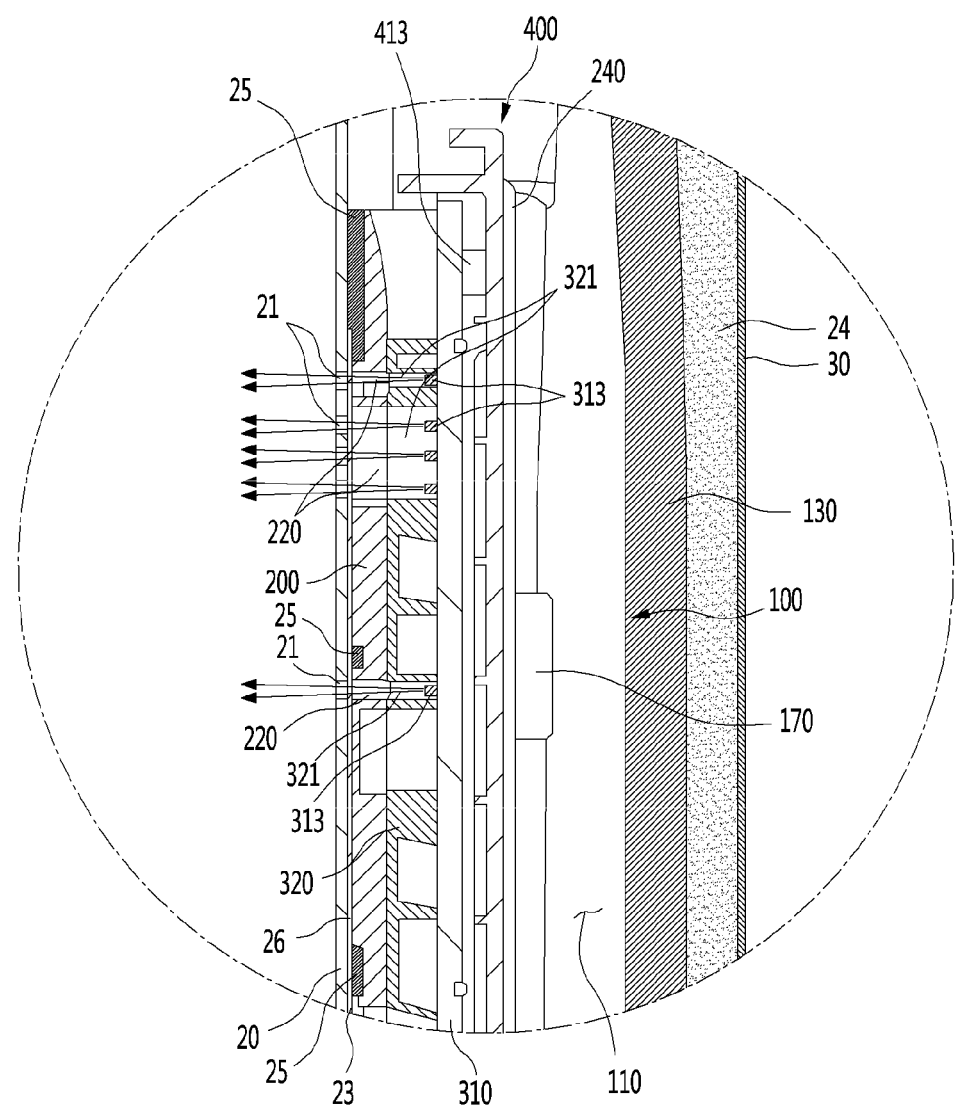
FIG. 13 is an enlarged cross-sectional view of a portion A of FIG. 12.

Referring to FIGS. 12 and 13, in the state where the cover display 200 is attached to the rear surface of the front panel 20 by using the adhesion member 25, the first and second through holes 21 and 220 may communicate with each other. Here, the first through hole 21 may have a too small size that is less than that of the second through hole 220. The plurality of first through holes 21 may be defined inside one second through hole 220.

Also, when the frame display 400 is completely inserted so that the display assembly 300 is disposed inside the cover display 200, the third and second through holes 321 and 220 may be connected to match each other. The second and third through holes 220 and 321 may have the same size. Since the reflector 320 is closely attached to the rear surface of the cover display 200, the second and third through holes 220 and 321 may completely overlap each other.

Thus, the third, second, and first through holes 321, 220, and 21 may communicate with each other. As a result, light emitted from the LED 313 may be irradiated to the outside of the refrigerator door 10 via the third, second, and first through holes 321, 220, and 21.

A diffusion sheet may be attached to the rear surface of the front panel 20 in which the first through hole 21 is defined. The diffusion sheet 26 may diffuse light emitted from the LED 313 so that the light irradiated through the display window 11 is uniformly irradiated onto the display window 11. Alternatively, the diffusion sheet 26 may be attached to the front panel 20 corresponding to the display window 11 to cover the whole of the first through hole 21.

Figure 14:
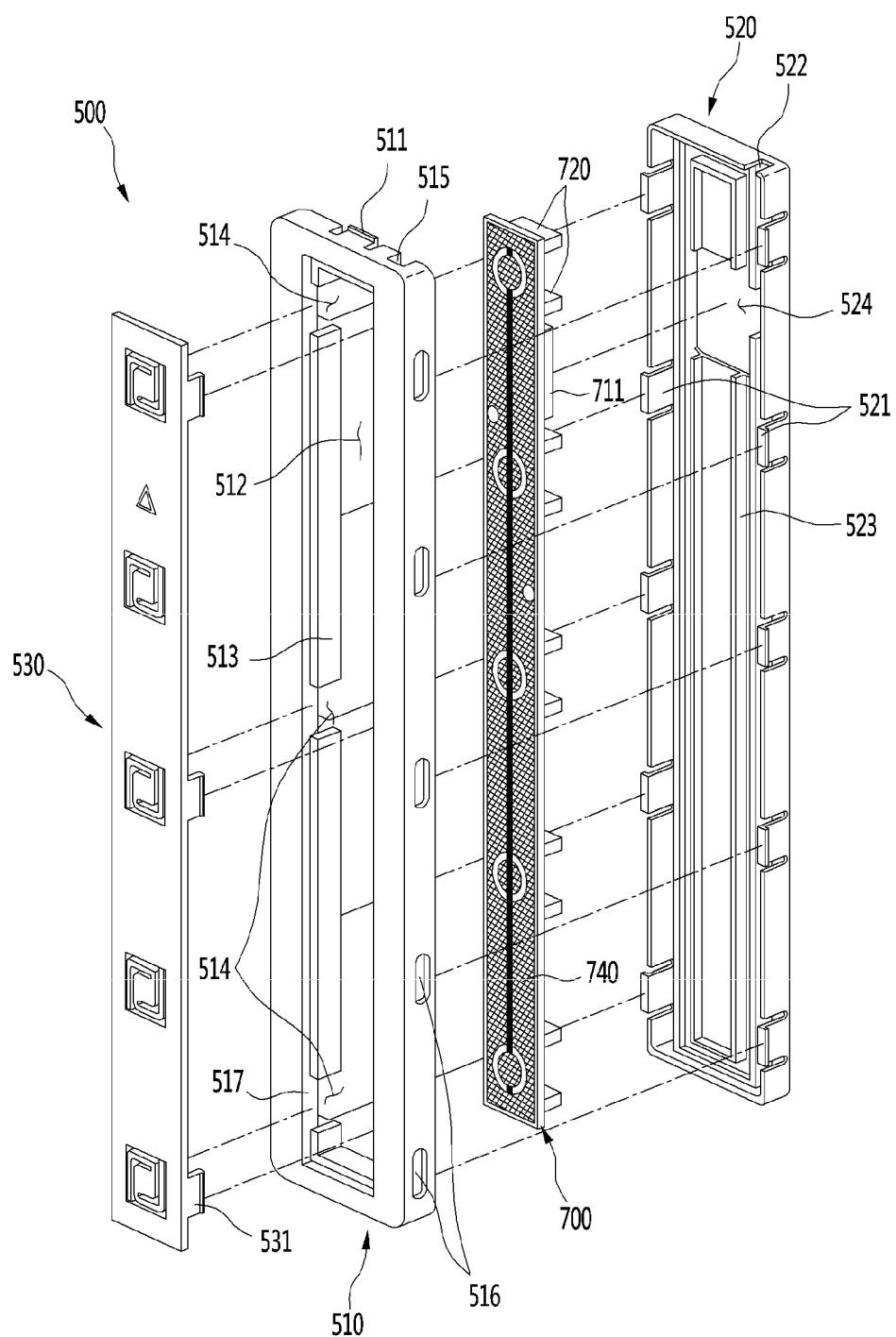
FIG. 14 is an exploded front perspective view of another example touch sensor assembly.
Figure 15:
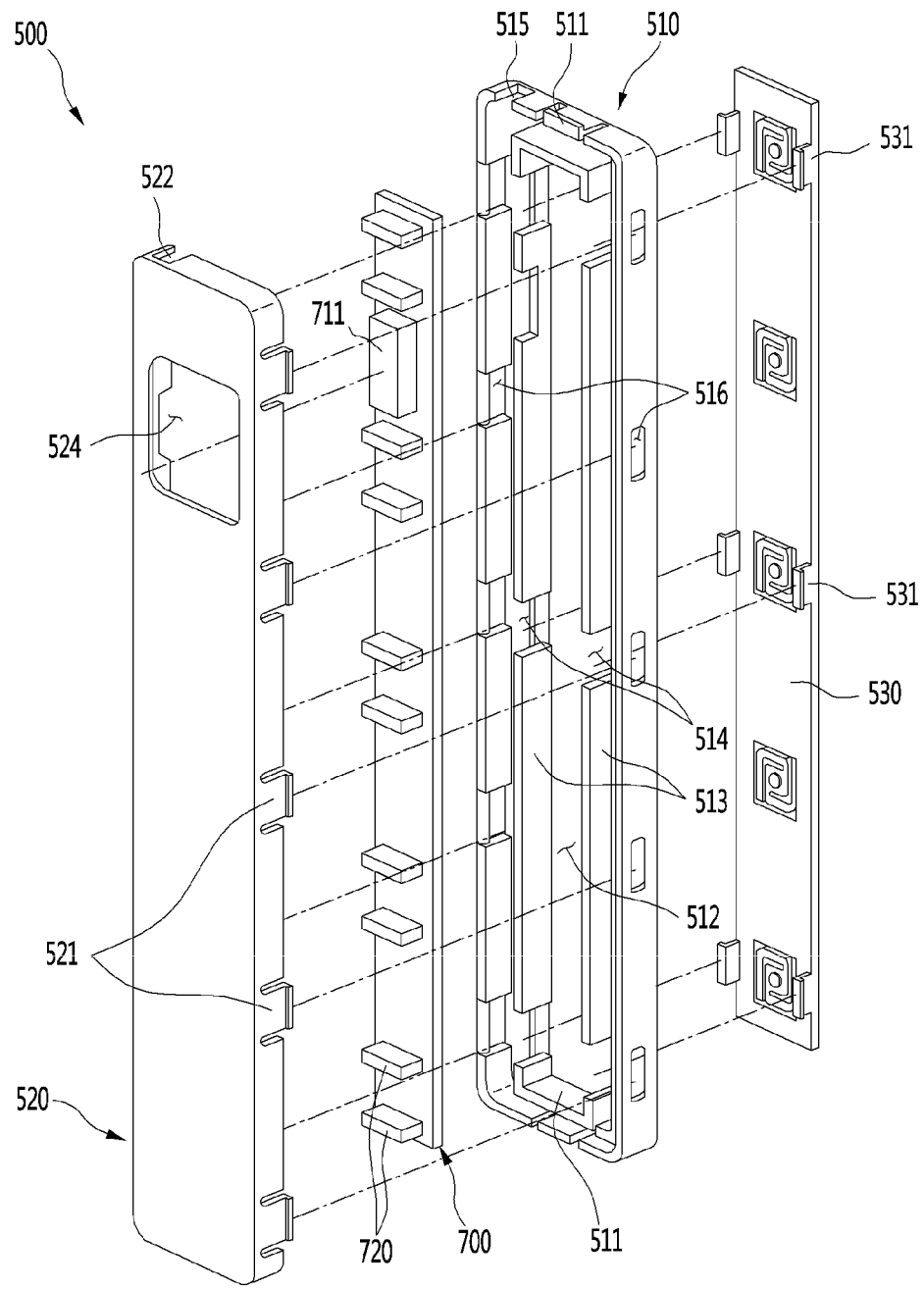
FIG. 15 is a rear exploded perspective view of the example touch sensor assembly of FIG. 14.
Figure 16:
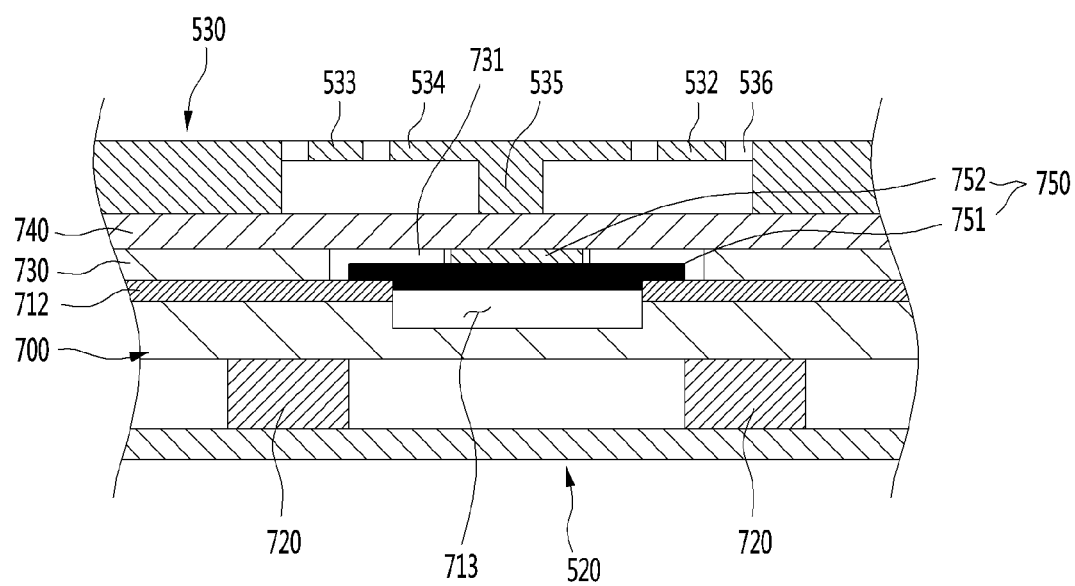
FIG. 16 is a longitudinal cross-sectional view of the example touch sensor assembly.
Figure 17:
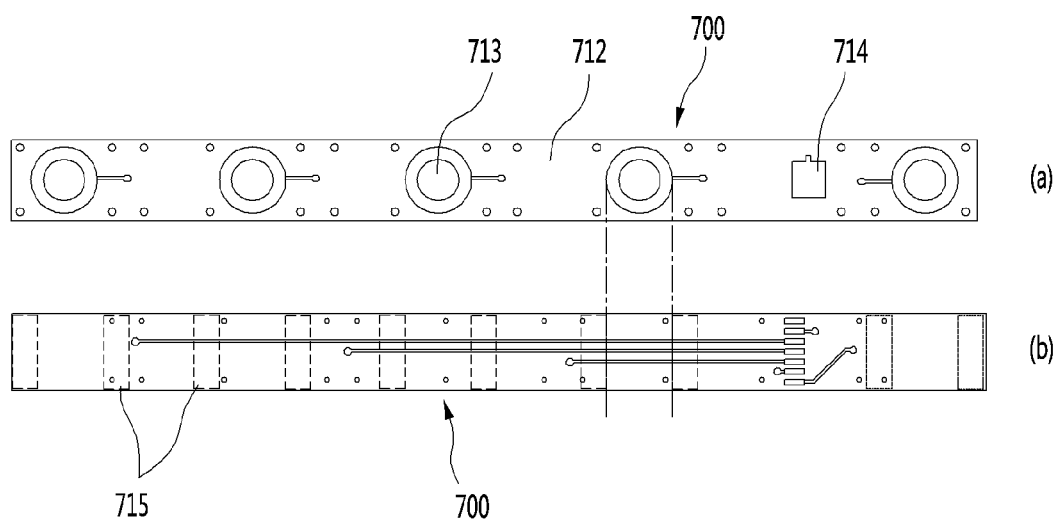
FIG. 17 is plan and rear views of a sensor PCB that is a main component of the example touch sensor assembly.
Figure 18:
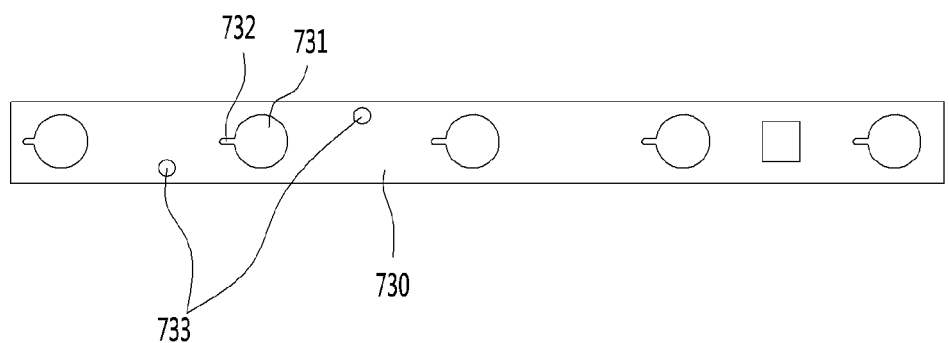
FIG. 18 is a plan view of a spacer of the example touch sensor assembly.

Referring now to FIGS. 14 and 15, the touch sensor assembly 500 may include the sensor housing defining an entire outer appearance thereof, the sensor PCB 700 accommodated into the sensor housing, an elastic member 720 supporting the sensor PCB 700, and a touch booster 530 coupled to an opened front surface of the sensor housing.

the sensor housing may include a housing cover 510 and a housing body 520 that are coupled to each other to define a space in which the sensor PCB 700 can be accommodated.

The housing cover 510 defines a front portion of the sensor housing. A housing coupling part 511 for mounting the touch sensor assembly 500 on the cover display 200 may be disposed on each of upper and lower ends of the housing cover 510. Also, the housing cover 510 may have a front surface that is exposed in the state where the touch sensor assembly 500 is mounted in the accommodation part 210. The housing cover 510 may be attached to the rear surface of the front panel by using the adhesion member 25.

An opening 512 may be defined in the front surface of the housing cover 510, and the touch booster 530 may be mounted in the opening 512. The touch booster 530 may help transfer displacement of the front panel 20, which occurs when the user pushes the front panel 20, to a sensor 750 that will be described in more detail below. A detailed structure of the touch booster 530 will also be described below in detail.

The opening 512 may has a size corresponding to that of the touch booster 530. Thus, when the touch booster 530 is mounted, the opening 512 may be covered by the touch booster 530. An extension rib 517 extending backward may be disposed around the opening 512. The extension rib 517 may contact a circumference of the sensor PCB 700 to allow the sensor PCB 700 to move without being tilted when the sensor PCB 700 moves in a front/rear direction.

In some cases, a booster support 513 protruding inward and extending backward may be further disposed inside the opening 512. The booster support 513 may support a circumferential portion of the touch booster 530 from a rear side in the state where the touch booster 530 is mounted. Thus, even though a pressure is applied to the touch booster 530, self-movement of the touch booster 530 to a rear side of the preset position may be prevented.

The booster support 513 may be disposed along the opening 512, and a hook groove 514 may be defined in the booster support 513. The hook groove 514 may be defined in a position corresponding to the hook 531 of the touch booster 530. The hook groove 514 may be formed by cutting a portion of the booster support 513. Alternatively, the hook groove 514 may be separately defined in one side of the housing cover 510 that is adjacent to the opening 512 except for the booster support 513.

The hook 531 and the hook groove 514 may be disposed on/in both left/right positions that face each other. The hook 531 and the hook groove 514 may be vertically disposed at a predetermined distance to prevent the touch booster 530 from being biased in one direction when the touch booster 530 is manipulated.

Also, the hook groove 514 may be extended in a front/rear direction. Thus, the hook 531 may be movable in the front/rear direction in a state where the hook 531 is disposed inside the hook groove 514. Thus, the touch booster 530 may be maintained in the state in which the touch booster 530 is coupled to the housing cover 510 and also move by a predetermined distance in the front/rear direction. Furthermore, the front surface of the touch booster 530 may protrude further than the housing cover 510 in the state where the touch booster 530 is assembled with the housing cover 510. Thus, when the touch sensor assembly 500 and the cover display 200 are attached to the front panel 20, the touch booster 530 may be maintained in the state in which the touch booster 530 is closely attached to the rear surface of the front panel 20.

A cover coupling part 516 may be disposed on a circumferential surface of the housing cover 510. The cover coupling part 516 may be a portion that matches the body coupling part 521 disposed on the housing body 520. A groove or hole with which the hook-shaped cover coupling part 561 is hooked may be defined in the body coupling part 521. Here, the cover coupling part 516 may be disposed on a position at which the elastic member 720 is capable of being pressed when the cover coupling part 516 and the body coupling part 521 are coupled to each other.

That is, when the housing cover 510 and the housing body 520 are coupled to each other, the elastic member 720 may be pressed to push the sensor PCB 700 and the touch booster 530 forward. Thus, the touch booster 530 may become forwardly protruded to be maintained in the state in which the touch booster 530 is closely attached to the front panel 20. Thus, when the user pushes the front panel 20, the touch booster may effectively detect the pushing of the front panel 20.

In some cases, a wire hole 515 may be defined in a top surface of the housing cover 510. The wire hole 515 may be shaped so that the first cable connector 610 connected to the sensor terminal 711 mounted on the sensor PCB 700 is accessible. The wire hole 515 may be defined in at least one side of the housing cover 510 and the housing body 520.

The housing body 520 may be coupled to the housing cover 510 to define an outer appearance of a rear portion of the touch sensor assembly 500 and a space in which the sensor PCB 700 is mounted.

A plurality of body coupling parts 521 may be disposed around a side circumferential surface of the housing body 520, which may be bent forward. The body coupling part 521 may be formed by cutting a portion of the circumferential surface of the housing body 520. The body coupling part 521 may be inserted into the cover coupling part 516 to maintain the state in which the housing cover 510 is coupled to the housing body 520.

The cover coupling part 516 and the body coupling part 521 may be disposed to be spaced a predetermined from each other and face each other at the same position of both left/right sides. Thus, the housing cover 510 and the housing body 520 may be coupled to each other with the same force at the same time to prevent the elastic member 720 from being inclined when assembled.

A wire hole 522 may be defined at a top surface of the housing body 520. The wire hole 522 may be defined in the same position as the wire hole 515 of the housing cover 510 so that the first cable connector 610 is accessible.

A mounting guide 523 may be disposed on a bottom surface of the housing body 520. The mounting guide 523 is designed to accommodate therein and guide a plurality of elastic members 720 that are attached to the sensor PCB 700.

In some cases, the mounting guide 523 may have a shape corresponding to that of the sensor PCB 700 to provide a space corresponding to a breadth width of the elastic member 720. Thus, the elastic member 720 may be disposed inside the mounting guide 523, and both left/right surfaces of the mounting guide 523 may support both left/right ends of the elastic member 720. Moreover, the mounting guide 523 may stably support the elastic member 720 to help prevent the elastic member 720 from becoming twisted or inclined in one direction in the state where the elastic member 720 is pressed.

In some cases, a terminal hole 524 may be defined at a rear surface of the housing body 520 to correspond to the sensor terminal 711 that is disposed on the sensor PCB 700. The terminal hole 524 may have a shape corresponding to that of the sensor terminal 711. Thus, the sensor terminal 711 may be exposed through the terminal hole 524. Accordingly, even if the sensor PCB 700 moves in the front/rear direction, the sensor terminal 711 may not interfere with the bottom of the housing body 520.

Since the first cable connector 610 is coupled to a side surface of the sensor terminal 711, the coupled state between the first cable connector 610 and the sensor terminal 711 may be seen through the terminal hole 524.

The sensor PCB 700 may be supported by the elastic member 720 inside the sensor housing in a state where a spacer 730, a sensor 750, and a conductive foil 740 are disposed. Also, the touch booster 530 may be mounted in the opening 512 so as to be movable in the front/rear direction. Thus, the displacement occurring when the front panel 20 and the conductive foil 740 contact and push each other may be immediately transmitted into the sensor 750.

Referring now to FIGS. 16 to 19, a copper film 712 is printed on a surface of the sensor PCB 700 to form a circuit. The sensor PCB 700 may be made from a plastic material. The sensor 750 for detecting push displacement of the front panel 20, which occurs by the user's touch, may be disposed on the front surface of the sensor PCB 700.

A piezo-sensor may be used as the sensor 750. In more detail, a ceramic device 752 may be attached to a top surface of a metal plate 751. The metal plate 751 may be elastically deformable according to a pressure of the touch manipulation of the front panel 20. Here, the ceramic device 752 may cause variations in quantity of electricity due to varying pressure. Although the sensor 750 is shown having a circular shape in the current example, the present disclosure is not limited thereto. For example, the sensor 750 may have various shapes.

The sensor 750 may be provided in plurality along the sensor PCB 700. A sensor support 713 may be disposed on the front surface of the sensor PCB 700 on which the sensor 750 is mounted.

The sensor support 713 may be defined by a groove having a diameter that is less than a size of the sensor. In detail, the sensor support 713 may not support a circumference of the sensor 750, but rather support a circumference of the metal plate 751. That is, the sensor support 713 may support the circumference of the metal plate 751. Thus, the sensor support 713 may have a projection shape for supporting the circumference of the metal plate 751, but not have a groove shape. Also, the sensor support 713 may have a size that is less than a diameter of the metal plate 751 and greater than a diameter of the ceramic device 752. Thus, the metal plate 751 may be immediately deformed by a pressure that is applied from a front side, and thus, the ceramic device 752 may effectively detect a variation in pressure.

A common contact point 714 connected to the plurality of sensors through the circuit may be disposed on one side of the sensor PCB 700. The common contact point 714 can connect the bottom surfaces of the plurality of sensors 750 to each other. When the conductive foil 740 adheres, the common contact point 714 may contact a conductive line 741 of the conductive foil 740 and be connected to a negative electrode of each of the plurality of sensors 750. Thus, the sensor may be electrically connected.

A mounting display part 715 for displaying an accurately mounted position of the elastic member 720 may be disposed on the rear surface of the sensor PCB 700. The mounting display part 715 may be formed through printing or processing. The mounting display part 715 may display a mounted position of the elastic member 720.

Here, the mounted position of the elastic member 720, i.e., the position of the mounting display part 715 may be disposed on both left/right sides (when viewed in FIG. 17) with respect to the sensor 750. Also, the mounted position of the elastic member 720, i.e., the position of the mounting display part 715 may be disposed outside an outer end of the sensor 750. Thus, the elastic member 720 may be disposed to prevent the elastic member 720 from interfering with the sensor 750, thereby preventing the detectability of the sensor 750 from being deteriorated. Furthermore, the plurality of elastic members 720 may be disposed to be spaced a predetermined distance from the sensor 750 to apply the same pressure to the sensor PCB 700.

The plurality of sensors 750 may be disposed in the same extension line as the body coupling part 521 and the cover coupling part 516. That is, as illustrated in FIG. 14, the body coupling part 521 and the cover coupling part 516 may be disposed on the same extension line as both left/right sides of the sensor 750. Also, the body coupling part 521 and the cover coupling part 516 may be disposed between the pair of elastic members 720 that are adjacent to the sensor 750. Thus, the body coupling part 521 and the cover coupling part 516 may be disposed on both left/right sides of one sensor 750, and the pair of elastic members 720 may be disposed in a direction that the body coupling part 521 and the cover coupling part 516. The plurality of body coupling parts 521, cover coupling parts 516, and elastic members 720 may be disposed according to the above-described arrangement. Thus, a pressure may be uniformly applied to the whole sensor PCB 700 disposed in the sensor housing, and the plurality of sensors 750 may detect the user's manipulation signal under the same condition.

The spacer 730 may be attached to the front surface of the sensor PCB 700. The spacer 730 may be configured to bond the sensor PCB 700 to the conductive foil 740. An adhesion member such as a double-sided tape may be used as the spacer 730. The spacer 730 may have a size corresponding to that of each of the sensor PCB 700 and the conductive foil 740. Also, the spacer 730 may have a predetermined thickness so that the conductive foil 740 contacts a top surface of the sensor 750 and the common contact point 714 at an adequate height thereof.

In some cases, a sensor hole 731 may be punched in a position corresponding to that of the sensor 750. The sensor hole 731 may have a size greater than that of the sensor 750 to accommodate the sensor 750 therein. Thus, when the sensor 750 operates, the sensor 750 may not interfere with the sensor hole 731. Also, the sensor hole 731 may be provided in number corresponding to the number of sensors 750. A vent hole 732 that is formed to have a predetermined length may be defined in each of the sensor holes 731.

In some cases, bubbles generated when the spacer 730 is attached may be discharged through the vent hole 732. The vent hole 732 may be defined along a longitudinal direction of the spacer 730 to extend in one direction. Here, the spacer 730 may be gradually attached in a direction in which the vent hole 732 extends in the sensor hole 731.

Also, when the spacer 730 and the conductive foil 740 are attached, guide parts may be provided on the spacer 730 and the conductive foil 740 so that the spacer 730 and the conductive foil 740 are attached to accurate positions.

In detail, the guide parts may be through holes 733 and 744 that are defined in the spacer 730 and the conductive foil 740. The through holes 733 and 744 may be provided in plurality along the spacer 730 and the conductive foil 740 and be defined to miss each other. Also, a working rod 760 may be disposed on the sensor PCB 700 at a position corresponding to each of the through holes 733 and 744. Thus, the working rod 760 may pass through each of the through holes 733 and 744 to successively attach the spacer 730 and the conductive foil 740. Thus, the spacer 730 and the conductive foil 740 may be attached to accurate positions by the guide parts. Thus, the spacer 730 and the conductive foil 740 may be spaced a predetermined distance from the sensor 750 disposed on the sensor PCB 700 to prevent errors of the plurality of sensors 750 from occurring.

The conductive foil 740 may be formed of a resin film material such as PET. Also, the conductive foil 740 may have a size corresponding to that of each of the sensor PCB 700 and the spacer 730. In some cases, a conductive line 741 having a mesh shape, which connects the plurality of sensors 750 to the common contact point 714, may be disposed on the conductive foil 740. The conductive line 741 may be printed on a bottom surface of the conductive foil 740 by using a silver material. The surface on which the conductor line 741 may adhere to the spacer 730, and also, contact the sensor 750 and the common contact point 714.

An inner guide line 742 and an outer guide line 743 may be printed on the conductive foil 740 so that the sensors 750 are attached to the accurate positions. The inner guide line 742 may have a size corresponding to that of the ceramic device 752, and the outer guide line 743 may have a size corresponding to that of the metal plate 751. Thus, in the state where the sensors 750 are mounted on the accurate positions, the ceramic device 752 may be disposed in the inner guide line 742, and the metal plate 751 may be disposed in the outer guide line 743. Also, the conductive line 741 having the lattice or mesh shape may connect the common contact point 714 to the top surface of the sensor 750, i.e., the negative electrode to allow the sensor 750 to be electrically connected.

Figure 20:
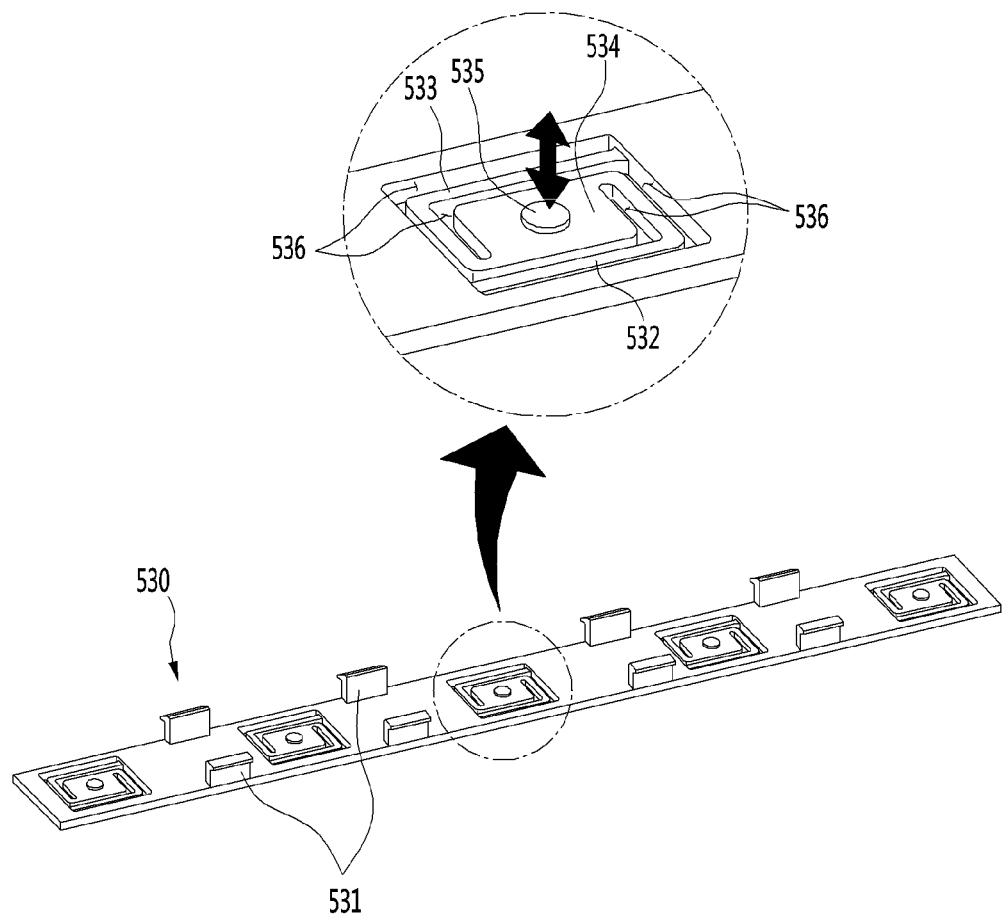
FIG. 20 is a rear perspective view of a touch booster of the example touch sensor assembly.

Referring to FIG. 20, the touch booster 530 has a size corresponding to that of the opening 512 of the housing cover 510 to cover the opening 512. A hook 531 may be disposed on each of both left/right ends of the housing cover 510. The hook 531 may be coupled to the hook groove 514 defined in the housing cover 510 and provided in plurality with a predetermined distance. The hook 531 may moves in the front/rear direction within the hook groove 514.

In some cases, a plurality of elastically deformable parts corresponding to each of the sensors 750 may be disposed on the touch booster 530. The elastically deformable parts may be disposed at positions corresponding to those of the touch manipulation part 12 of the front panel 20 and the sensor. Also, each of the elastically deformable parts may have an elastically deformable structure in which the elastic deformable part is movable in the front/rear direction. Thus, when the user pushes the touch manipulation part 12, the front panel 20 may be deformed, and thus, the touch manipulation part 12 may move in a rear direction to press the sensor 750. When the user's hand is separated from the touch manipulation part 12, the elastically deformable part may return to its original position.

In some implementations, the elastically deformable part may include a first extension part 532 extending from one side of the opened region of the touch booster 530, a second extension part 533 extending from a position opposite to the first extension part 532, and a common part 534 disposed at a central portion to connect the first extension part 532 to the second extension part 533.

Each of the first and second extension parts 532 and 533 may have a relatively narrow width compared to the common part 534 so that the common part 534 can be movable. Each of the first and second extension parts 532 and 533 may extend to a sufficient length and include at least one bent portion. Thus, the first and second extension parts 532 and 533 may be easily elastically deformable. Each of the first and second extension parts 532 and 533 may extend and be bent along a circumference of the common part 534. The first and second extension parts 532 and 533 may be symmetrical to each other with respect to the common part 534. In some cases, an area except for the first and second extension parts 532 and 533 and the common part 534 may be spirally cut in a central direction of the common part 534 to form a cut part 536. Here, the area may be cut along circumferences of the first and second extension parts 532 and 533 and the common part 534.

A protrusion 535 protruding rearward may be disposed on a bottom surface of the common part 534. The protrusion 535 may be disposed at a center of the common part 534 to correspond to a center of the sensor 750. Thus, when the common part 534 moves backward, the common part 534 may press the center of the sensor 750.

Figure 21:
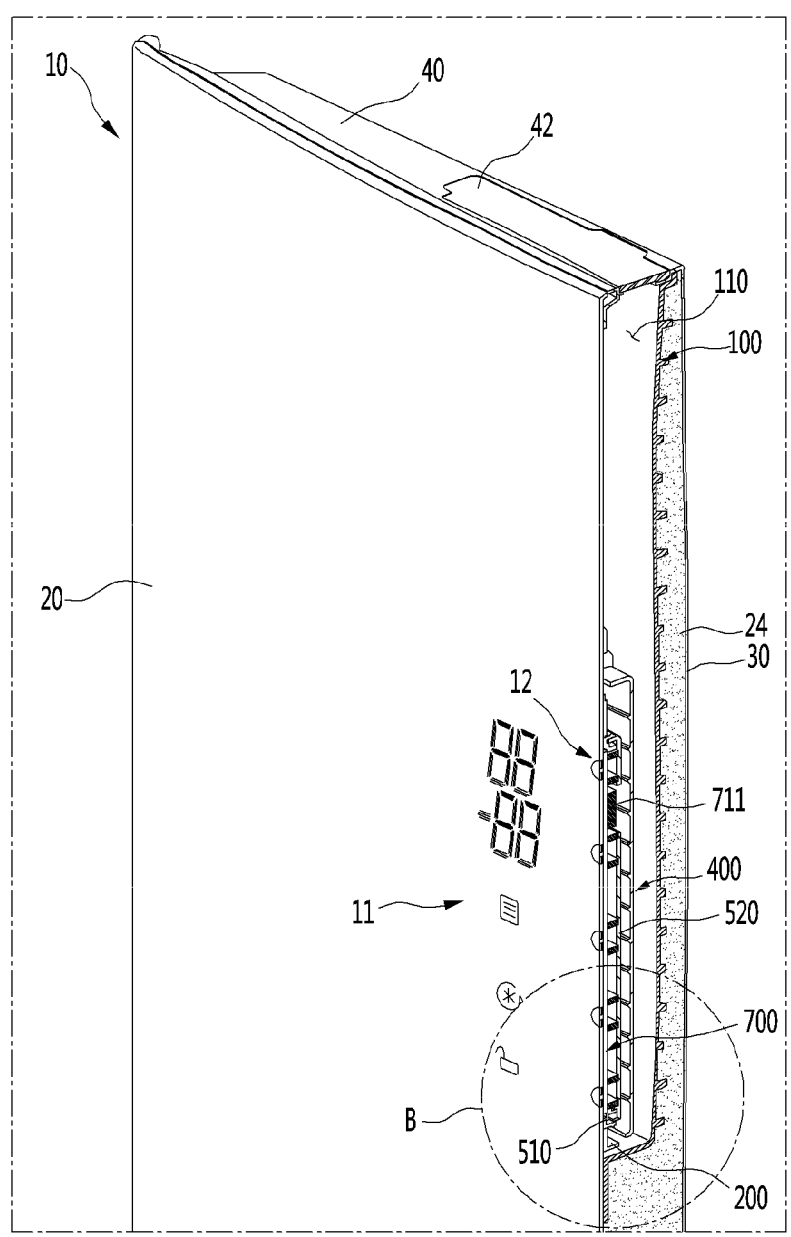
FIG. 21 is a cutaway perspective view taken along line 21-21' of FIG. 2.
Figure 22:
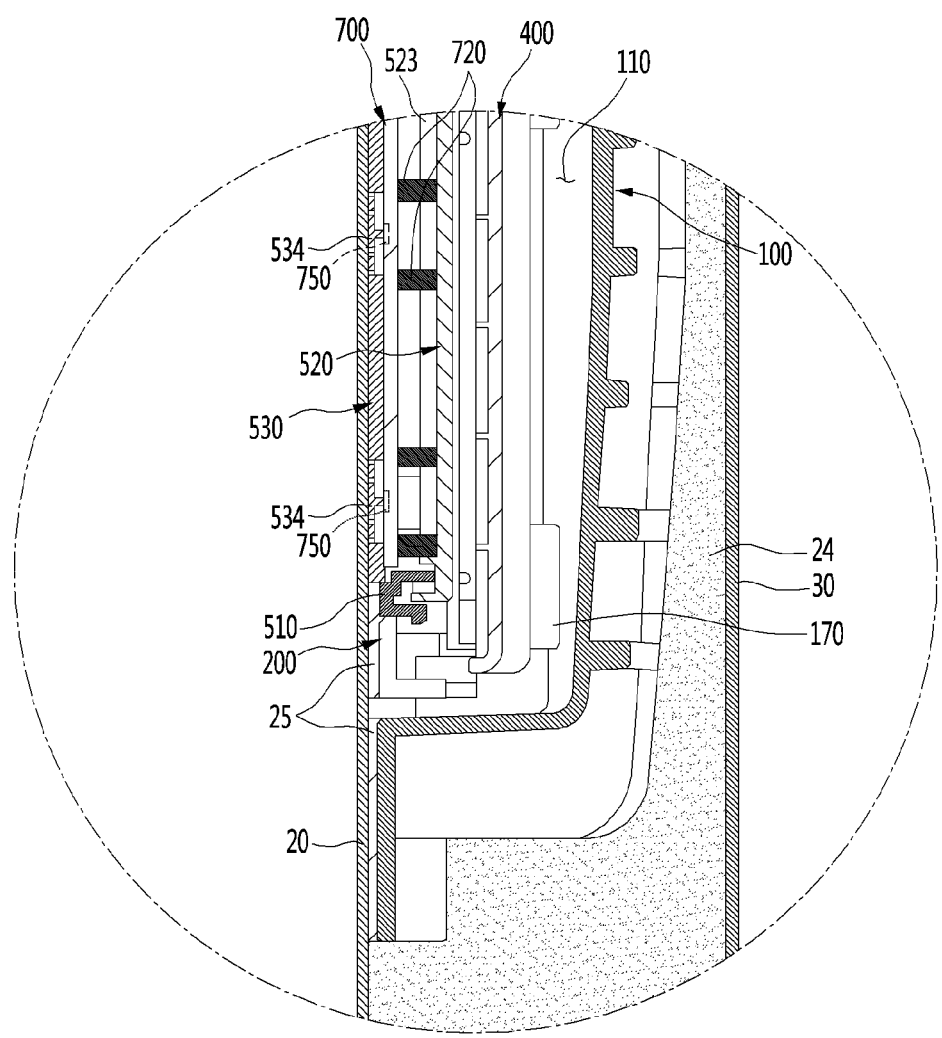
FIG. 22 is an enlarged cross-sectional view of a portion B of FIG. 21.
Figure 23:
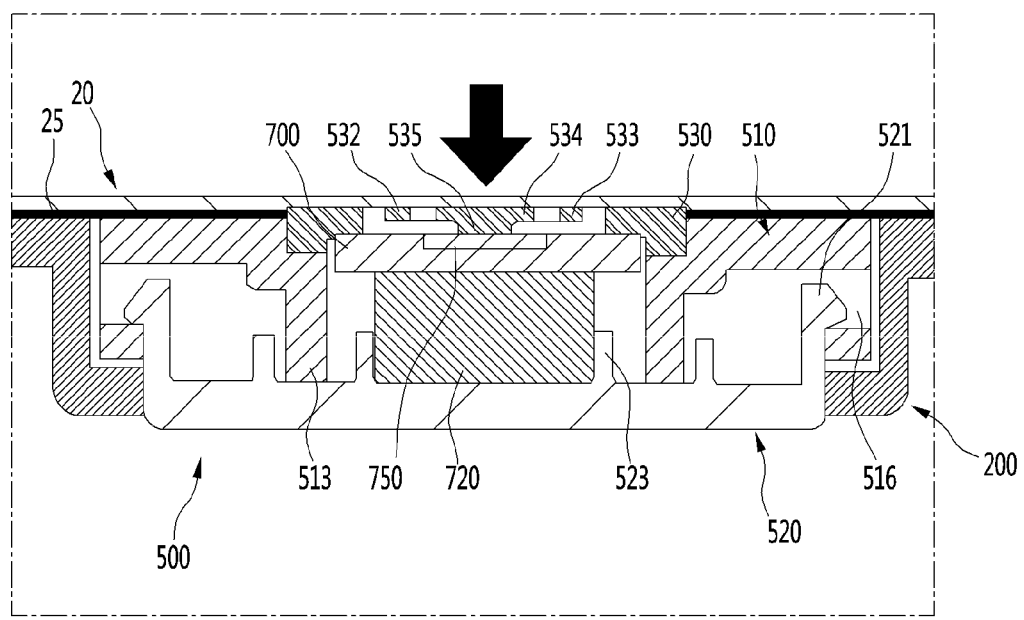
FIG. 23 is a cross-sectional view illustrating an example mounted state of the example touch sensor assembly.

Referring now to FIGS. 21 to 23, the touch sensor assembly 500 is shown attached to the front panel 20 in a state where the touch sensor assembly 500 is mounted on the cover display 200. Here, the adhesion member 25 may be attached to the front surface of the cover display 200 and the front surface of the housing cover 510 so that the cover display 200 and the touch sensor assembly 500 adhere to the rear surface of the front panel 20.

The adhesion member 25 may not be provided on the touch booster 530, and the touch booster 530 may be closely attached to the rear surface of the front panel 20. For this, when the touch sensor assembly 500 is assembled, the elastic member 720 may push the sensor PCB 700 forward while being pressed. Thus, the sensor PCB 700 may be closely attached to the touch booster 530. The touch booster 530 may be movable in the front/rear direction in the state where the touch booster 530 is coupled to the housing cover 510. Also, the touch booster 530 may further protrude forward from the front surface of the housing cover 510 by the pressing of the elastic member 720.

Thus, although the cover display 200 and the housing cover 510 adhere to the front panel 20 by the adhesion member 25, the state in which the front surface of the touch booster 530 is completely closely attached to the rear surface of the front panel 20 may be maintained.

In this state, when the user touches the touch manipulation part 12 of the front panel 20, displacement may occur on an area of the manipulated front panel 20. Here, the displacement of the front panel 20 may be immediately transmitted into the sensor 750 through the touch booster 530 that is completely closely attached to press the sensor 750. Thus, the sensor 750 may more readily detect the user's manipulation. Here, the elastic member 720 may be further pressed according a pressure during the manipulation thereof. Here, the touch booster 530 may move somewhat backward by the coupling between the hook 531 and the hook groove 514.

When the user's hand is separated from the touch manipulation part 12, the sensor PCB 700 and the touch booster 530 may move again forward by a restoring force of the elastic member 720, a restoring force of the touch booster 530, and a restoring force of the metal plate 751 of the sensor 750 to return to its original state.

The elastic member 720 for pressing and supporting the sensor PCB 700 may have various shapes so that a uniform pressure can be applied to the sensor PCB 700 when the sensor housing is coupled.

Referring now to FIG. 24, the elastic members 721 may be disposed on the bottom surface of the sensor PCB 700. The elastic member 721 may include a support 722 extending backward from the sensor PCB 700 and a connection part 723 connecting ends of the extending support 722 to each other. Here, the support 722 may be disposed outside the sensor so as to not interfere with an operation of the sensor 750.

Thus, the housing body 520 may contact and support the support 722. Also, a uniform pressure may be applied to both sides with respect to the sensor 750 by the support 722. Also, when a pressure is applied to the elastic member 721, the elastic member 721 may be maintained in a stable state without being inclined.

In some implementations, as illustrated in FIG. 25, an elastic member 724 may be disposed on the sensor PCB 700 and have a rectangular shape surrounding the sensor 750. Here, a space 726 defined inside the elastic member 724 may have a size greater than that of the sensor 750. Thus, since the elastic member 724 substantially supports the outside of the sensor 750, the interference with the sensor 750 may be prevented.

Furthermore, an extending end of the elastic member 724 may be supported by the housing body 520. Thus, the uniform pressure may be transmitted to the sensor PCB 700. Also, when a pressure is applied to the elastic member 724, the elastic member 724 may be maintained in a stable state without being inclined.

Figure 26:
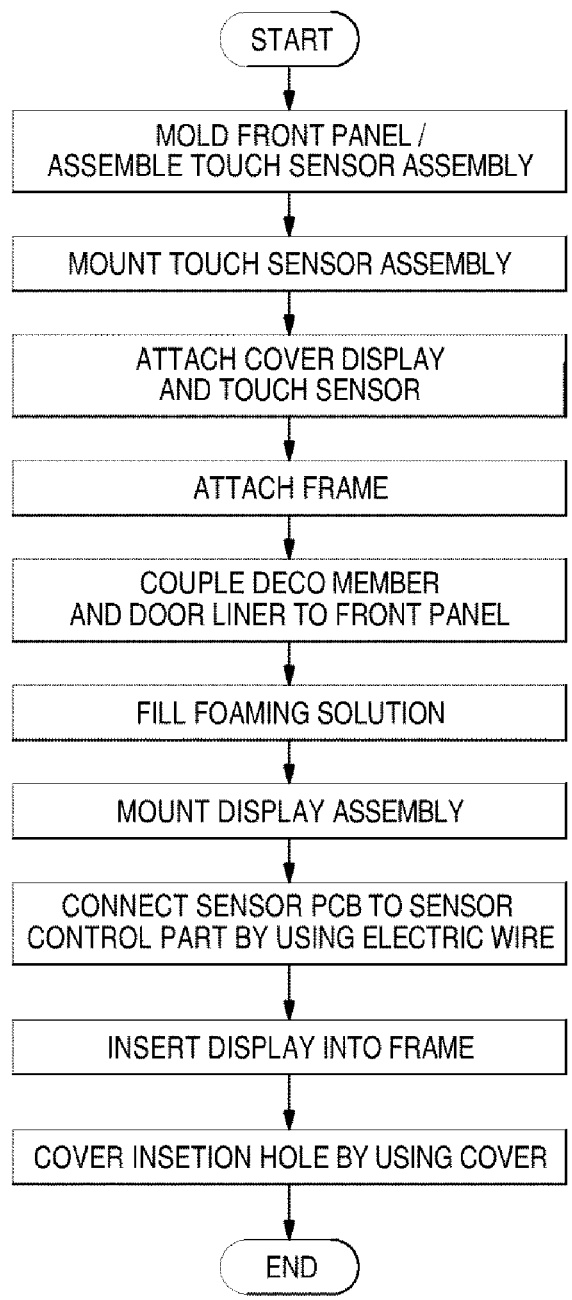
FIG. 26 illustrates an example method of manufacturing a refrigerator door.

Referring now to an example manufacturing method as illustrated in FIG. 26, in manufacturing the refrigerator door 10, a front panel 20 may be molded by using stainless steel having a plate shape. Here, the plurality of first through holes 21 that form the display window 11 may be formed in the front panel 20 through etching or laser processing. Also, the first through hole 21 may be filled with a sealing member 22, and a diffusion sheet 26 may be attached to the first through hole 21. An etching, surface processing, or printing process may be performed on the front panel 20 to mold a touch manipulation part 12.

The example method also includes assembling the touch sensor assembly 500. To assemble the touch sensor assembly 500, the elastic member 720 may be attached to a fixed position of a bottom surface of the sensor PCB 700, and the spacer 730 may be attached to a top surface. Then, the sensor 750 may be disposed, and the conductive foil 740 can be adhered thereto.

Figure 27:
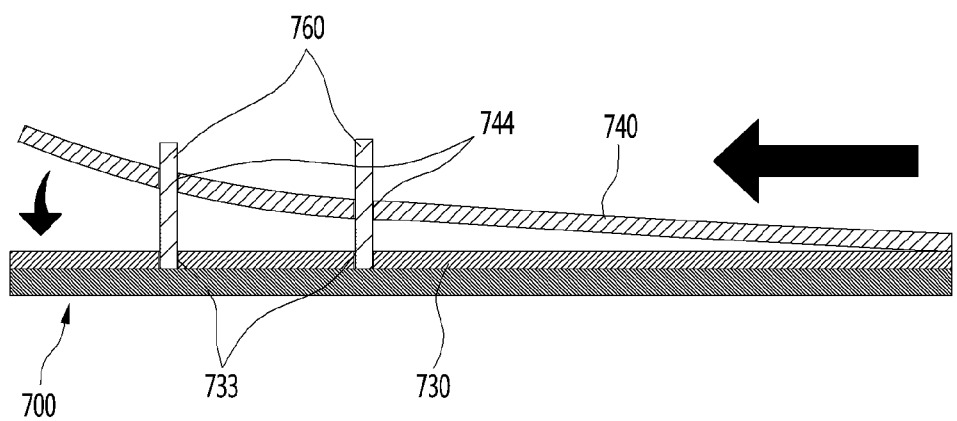
FIG. 27 is a schematic view illustrating an example method of bonding the spacer to the conductive foil.

FIG. 27 illustrates an example method of bonding the spacer to the conductive foil. An adhesion process of the spacer 730 and the conductor foil 740 will be described in more detail with reference to the accompanying drawings. First, a working rod 760 may be disposed at a preset position of the sensor PCB 700, and then, the spacer 730 can be attached. Here, a punching hole 733 of the spacer 730 may pass through the working rod 760. Thus, the spacer 730 may be attached to an accurate position of the top surface of the sensor PCB 700, and the sensor 750 may be disposed in an inner region of a sensor hole 731.

Here, the spacer 730 may be gradually attached in a direction in which a vent hole 732 extends. While the spacer 730 is attached, air may be discharged through the vent hole 732.

Figure 19:
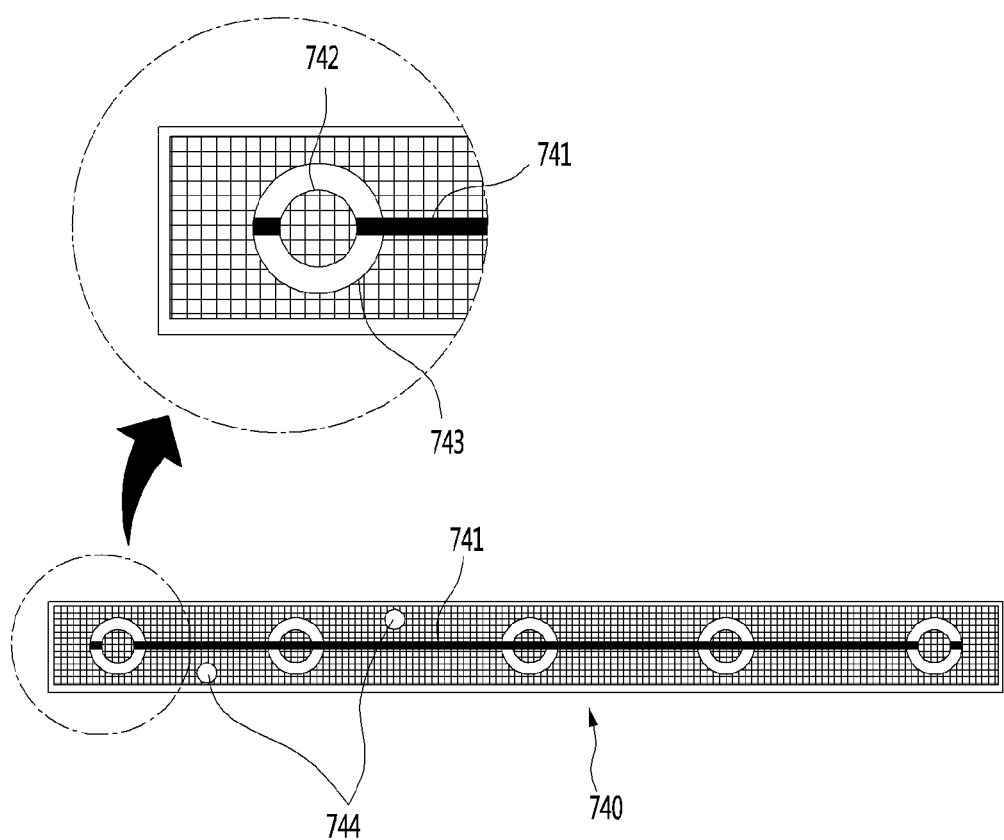
FIG. 19 is a plan view of a conductive foil of the example touch sensor assembly.

After the spacer 730 is completely attached, the conductive foil 740 can be attached to a top surface of the spacer 730. Like the spacer 730, the conductive foil 740 may be attached so that the punching hole 744 passes through the working rod 760. That is, the conductive foil 740 may be gradually attached in one direction so that the conductive foil 740 is attached to a fixed position. In the state where the conductive foil 740 is attached to the fixed position, the sensor 750 may be precisely disposed in areas of inner and outer guide lines 742 and 743 (FIG. 19).

After the above-described processes are performed, the sensor PCB 700 can be accommodated into the housing body 520, and the housing cover on which the touch booster 530 is mounted may be coupled to the housing body 520. When the housing cover 510 and the housing body 520 are coupled to each other, the elastic member 720 may be pressed to press the sensor PCB 700 and then be closely attached to the touch booster 530. Here, the touch booster 530 may be mounted to be movable in a front/rear direction. Here, the touch booster 530 may have a front surface that further protrudes from that of the housing cover 510.

The assembled touch sensor assembly 500 may be seated into an accommodation part 210 of the cover display 200, and the housing coupling part 511 may be coupled to the accommodation part 210 to allow the touch sensor assembly 500 to be maintained in the state in which the touch sensor assembly 500 is fixed to the cover display 200.

In this state, an adhesion member 25 may be attached to the front surfaces of the cover display 200 and the housing cover 510. Also, the cover display 200 and the touch sensor assembly 500 may be attached to the rear surface of the front panel 20 at the same time by using the adhesion member 25.

Here, the cover display 200 and the touch sensor assembly 500 may be mounted on the accurate position of the front panel 20. If a second through hole 220 of the cover display 200 is misaligned with the display window 11, light emitted from an LED 313 may not completely pass through the first through hole 21 to cause defects. Also, if the sensor 750 is misaligned with the touch manipulation part 12, it may be difficult to the user's touch manipulation, defects during the erroneous recognition may occur.

There are various methods for accurately attaching the cover display 200. Hereinafter, the methods will be described with reference to the accompanying drawings.

Figure 28:
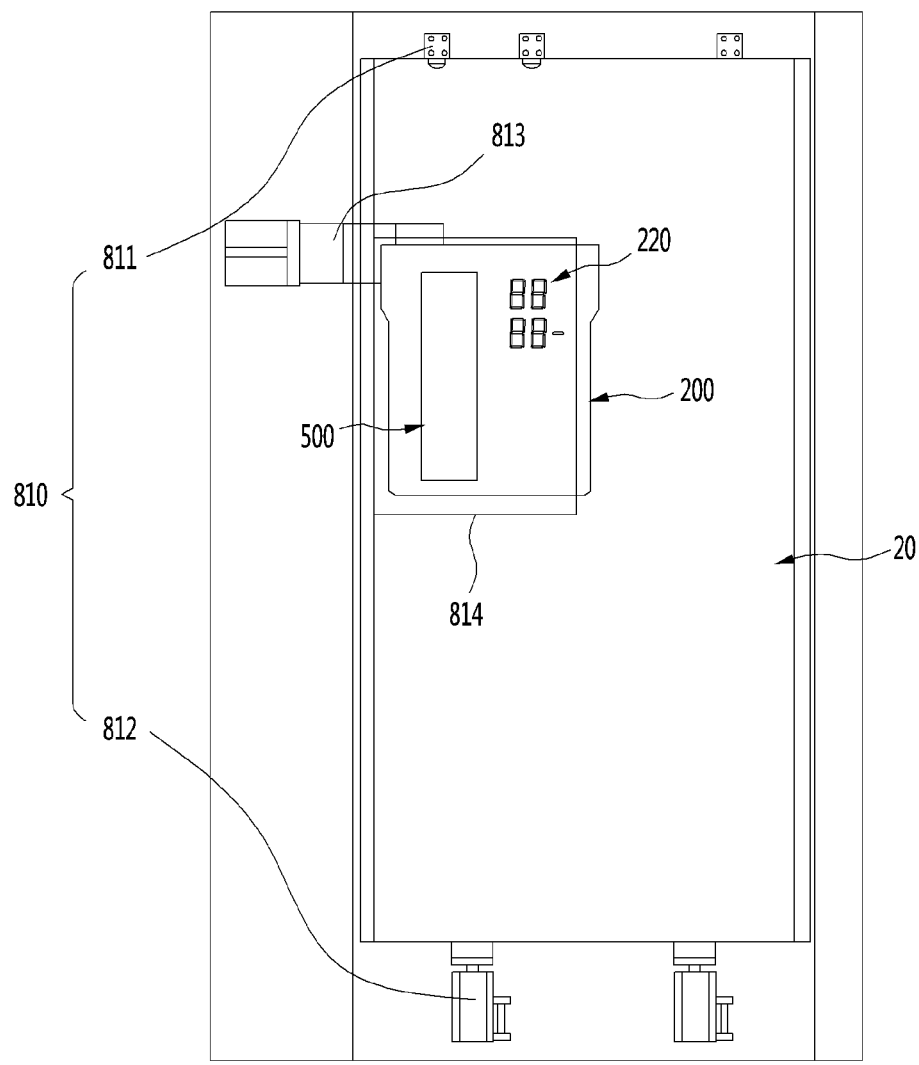
FIG. 28 is a plan view illustrating a process of mounting the cover display by using a fixing and attaching jig.
Figure 29:
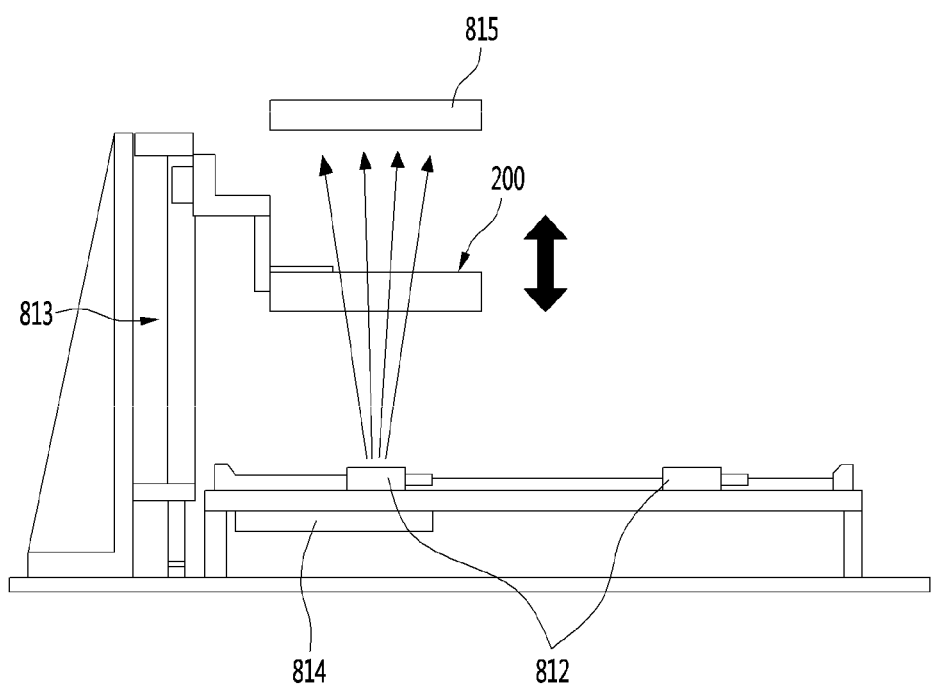
FIG. 29 is a side view of FIG. 28.

FIG. 28 is a plan view illustrating an example process of mounting the cover display by using a fixing and attaching jig. FIG. 29 shows a side view of FIG. 28.

As illustrated in FIGS. 28 and 29, the front panel 20 may be fixed by a fixing jig 810 in the state where the front panel 20 is molded. The fixing jig 810 includes an upper end fixing part 811 supporting an upper end of the front panel 20 and a lower end fixing part 812 supporting a lower end of the front panel 20. Also, the lower end fixing part 812 may vertically move to selectively fix the front panel 20 so that the front panel 20 is mounted or separated.

In some cases, an attaching jig that is vertically movable may be disposed at a preset position. The attaching jig 813 may move the cover display 200 downward to attach the cover display 200 to the front panel 20. Since the attaching jig 813 moves in only the vertical direction at the fixed position, the cover display 200 may be always attached to the fixed position. Thus, the position of the attaching jig 813 may be disposed at a position at which the cover display 200 is accurately attached when the cover display 200 moves downward in consideration of the fixed position of the cover display 200.

The attaching jig 813 may be interlocked with an operation of the fixing jig 810. That is, when the front panel 20 is automatically supplied, the fixing jig 810 fixes the front panel 20. Then, the attaching jig 813 can move the automatically supplied cover display 200 downward and attach the cover display 200 to allow the cover display 200 to return to its original position. Thus, the cover display 200 may be continuously attached. Only one of the attaching jig 813 and the fixing jig 810 may automatically operate as needed.

The attaching jig 813 may be controlled to move in X, Y, and Z axis directions, thereby improving the accuracy in attachment of the cover display 200. Here, the movement control of the attaching jig 813 may be performed by a light source 814. The light source 814 may be disposed under the display window 11 to irradiate light. The light emitted form the light source 814 passes through the display window 11. Also, when the cover display 200 is disposed at the preset position by the attaching jig 813, the light emitted from the light source 814 may pass through the display window 11 and then pass through the second through hole 220. Here, when the cover display 200 is aligned at the accurate position, a confirmation part 815 disposed above the light source 814 may recognize the light. In this state, the cover display 200 moves downward to attach the cover display 200 at the accurate position.

Figure 30:
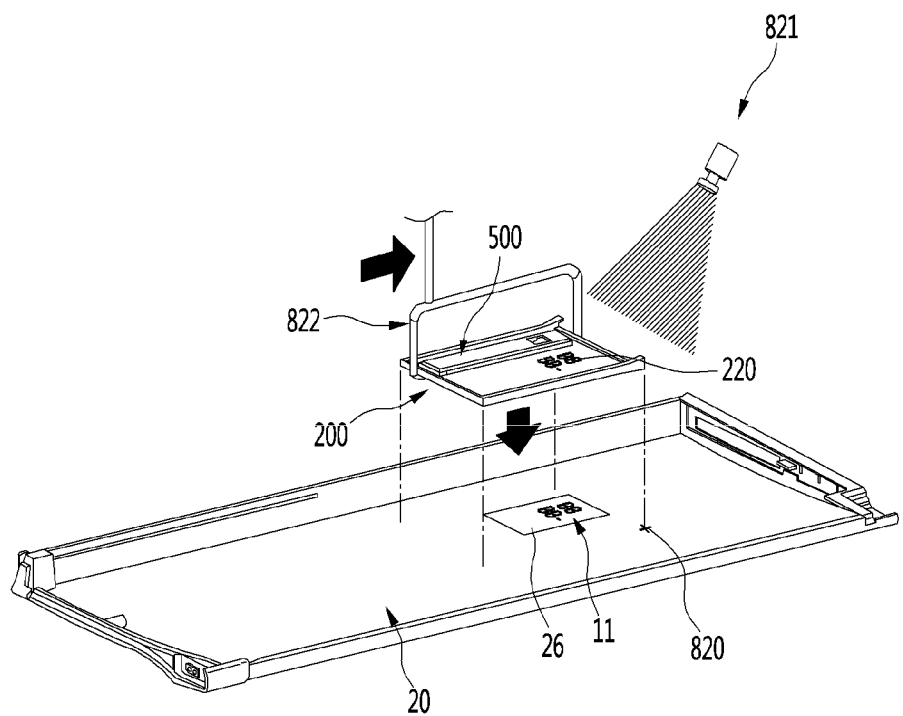
FIG. 30 is a perspective view illustrating an example mounting of the cover display by using vision.

FIG. 30 shows an example process in which the cover display is mounted by using vision-based methods.

As illustrated in FIG. 30, when the front panel 20 is molded, a reference point display part 820 may be formed. The reference point display part 820 is configured to attach the cover display 200 to a fixed position. When the front panel 20 is molded, the reference point display part 820 may be formed on the rear surface of the front panel through etching or printing.

In the state where the reference point display part 820 is formed, when the front panel 20 is supplied into a working space, a camera 821 disposed in the working space may photograph the working space to recognize the preset reference point display part 820. When the reference point display part 820 is recognized, accurate coordinate values of the reference point display part 820 and a carrier 822 may be calculated. The carrier 822 that is movable in the X, Y, and Z axis directions may move and attach the cover display 200 to the rear surface of the front panel 20 along a path that is calculated on the basis of the calculated coordinate values.

Figure 31:
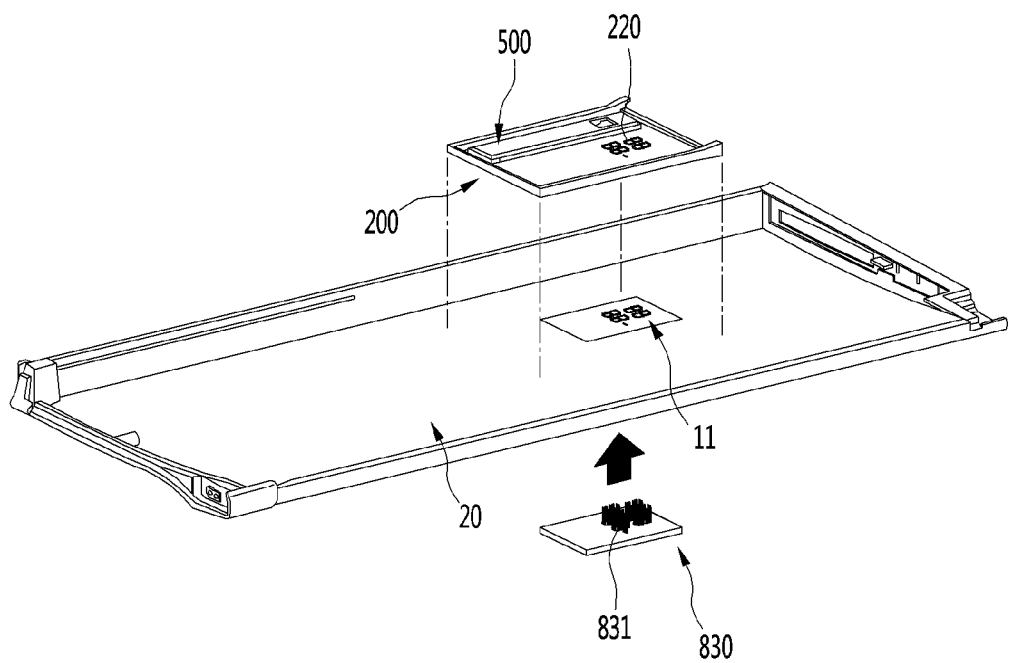
FIG. 31 is a perspective view illustrating an example mounting of the cover display by using a jig.
Figure 32:
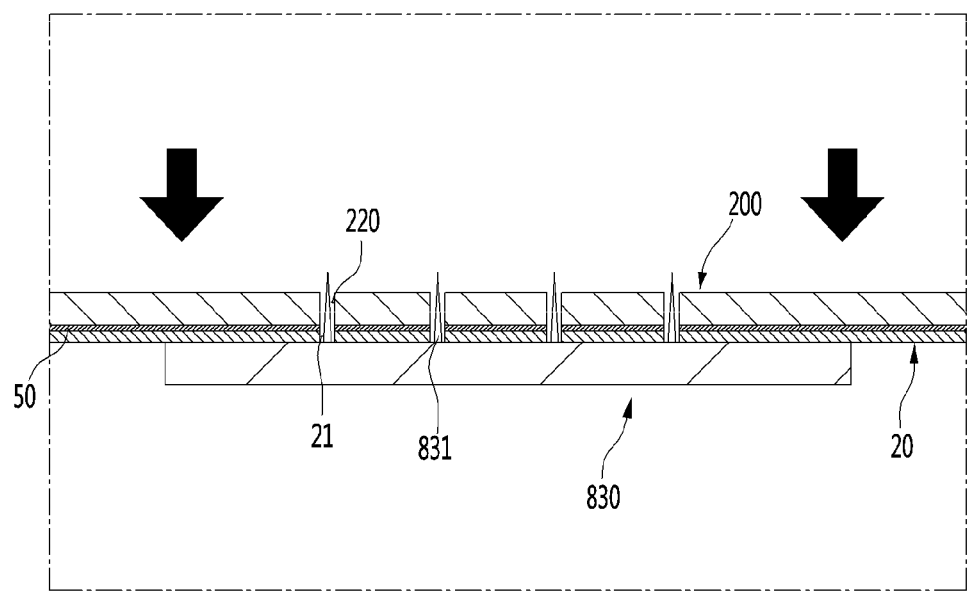
FIG. 32 is a cross-sectional view illustrating an example state in which the through jig passes through a front panel and the cover display.

FIG. 31 illustrates an example process in which the cover display is mounted by using a through jig. FIG. 32 is a cross-sectional view illustrating a state in which the through jig passes through the front panel and the cover display.

As illustrated in FIGS. 31 and 32, a through jig 830 to which a plurality of pins 831 extend upward may be disposed under the front panel 20. The pins 831 may be provided in the same number as the number of first through holes 21 defining the display window 11 at positions corresponding to the first through holes 21. Also, each of the pins 831 may extend by a length that is enough to pass through the front panel 20 and the cover display 200.

The through jig 830 can be moved upward from a lower side of the front panel 20, and the pin 831 may then pass through the first through hole 21 defining the display window 11. In this state, the cover display 200 may adjust a position of each of the pins 831 so that the pins 831 pass through the second through hole 220, and the worker can then attach the cover display 200 to the rear surface of the front panel 20.

According to one of the above-described methods, as well as others, the cover display 200 may be attached to the fixed position of the rear surface of the front panel 20. Since the cover display 200 is attached, the touch sensor assembly 500 may also be attached to the rear surface of the front panel 20. Here, the front surface of the touch booster 530 may not adhere to the rear surface of the front panel 20, but rather be closely attached to the rear surface of the front panel 20.

After the cover display 200 is attached, the frame 100 may be attached to the rear surface of the front panel 20. Since the frame is attached, the cover display 200 may be disposed inside a space defined by the frame 100. Then, the cover display 200 may be pressed forward by the cover support 170 and then be maintained in the state in which the cover display 200 is closely attached to the front panel 20.

After the frame is completely attached, the deco member 40 and the door liner 30 may be coupled to the front panel 20 to form a shape of the refrigerator door 10. Also, a foaming solution may be filled into a region except for an inner space of the frame 100 to mold the insulation material 24 through the foaming process. Here, a wire introduced into the refrigerator door 10 may be introduced into the frame 100 through a wire entrance 150 of the frame 100. After the insulation material 24 is molded, the wire may be connected to the display PCB 310.

Figure 33:
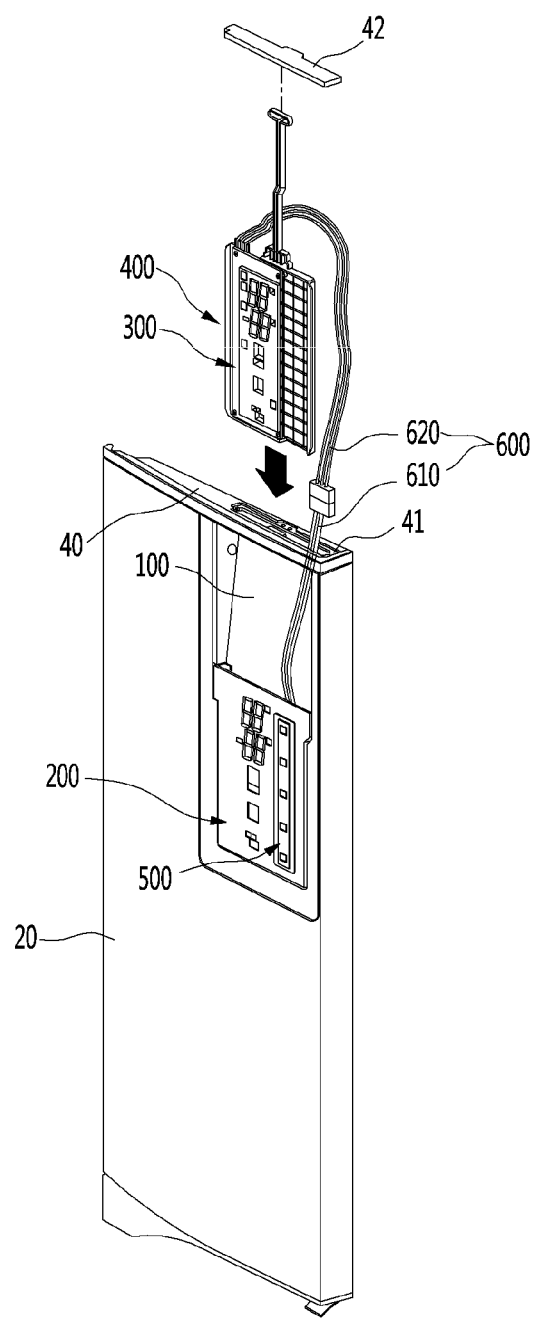
FIG. 33 is an exploded perspective view illustrating an example process of mounting the display assembly.

FIG. 33 shows an example process of mounting the display assembly.

As illustrated in FIG. 33, in the state where the exterior components of the refrigerator door 10 are assembled, and the insulation material 24 is molded, the touch sensor assembly 500 is mounted on the frame display 400.

In the state where the touch sensor assembly 500 is mounted on the frame display 400, the worker can connect the first cable connector 610 connected to the sensor PCB 700 to the second cable connector 620 connected to a sensor control part 330 mounted on the display PCB 310.

Since the first cable connector 610 and the second cable connector 620 are connected to each other after the insulation material 24 is completely molded, damage of the sensor control part 330 that occur due to static electricity, which may be generated when the foaming solution is filled and the insulation material is molded, may be prevented or mitigated.

After the first and second cable connectors 610 and 620 are connected to each other, the frame display 400 may be inserted through the insertion hole 41. Here, the frame display 400 may be completely inserted into the cover display 200 by using the frame handle 420.

When the frame display 400 is completely inserted, the display assembly 300 may be closely attached to the rear surface of the cover display 200. Thus, the first, second, and third through holes 21, 220, and 321 may be aligned in order to communicate with each other.

After the frame display 400 is completely inserted, the insertion hole cover 42 may be mounted on the insertion hole 41 to close the insertion hole 41. Then, an upper end of he frame handle 420 can be fixed to finish the manufacturing of the refrigerator door 10.

The refrigerator door is not limited to just the examples described above. For example, the refrigerator as well as the refrigerator door may vary according to various implementations.

In some implementations, a touch booster may be directly attached to a cover display, and a housing body is coupled to the cover display to define a space in which a sensor PCB is accommodated.

Figure 34:
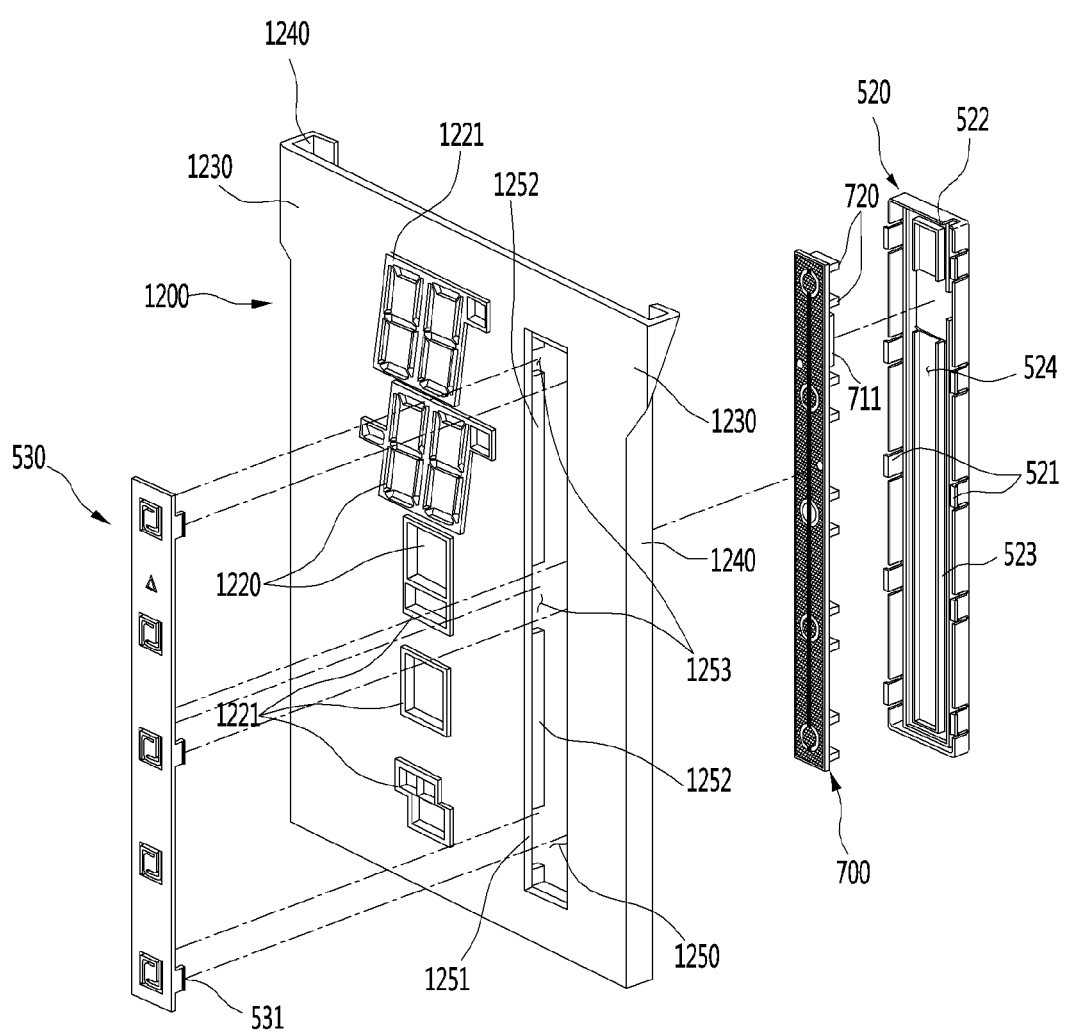
FIG. 34 is an exploded perspective view illustrating various structures of another example cover display and sensor housing.

Referring to FIG. 34, a cover display 1200 is attached to a rear surface of a front panel 20 of a refrigerator door 10 according to another implementation. A touch sensor assembly 500 including a touch booster 530, a sensor PCB 700, and a housing body 520 is coupled to the cover display 1200.

A plurality of second through holes 1220 are defined in the cover display 1200. A booster insertion part 1250 is disposed in one side on which the touch sensor assembly 500 is disposed. The booster insertion part 1250 is opened with a size corresponding to that of the touch booster 530. Also, an extension rib 1251 extending backward to guide movement of the touch booster 530 is disposed in the booster insertion part 1250.

Also, a booster support 1252 protruding inward and extending backward is disposed in the booster insertion part 1250 to support the touch booster 530 from a rear side. A portion of the booster support 1252 is cut to define a hook groove 1253. The hook groove 1253 may be hook-coupled to a hook 531 disposed on each of both sides of the touch booster 530. Here, the hook groove 1253 may be opened backward to allow the whole touch booster 530 to move in a front/rear direction.

The housing body 520 is coupled to a rear portion of the booster insertion part 250. The housing body 520 is coupled to a rear surface of the cover display 1200 to define a space in which the sensor PCB 700 is accommodated.

For this, a body coupling part 521 is disposed on a circumference of the housing body 520, and a coupling part coupled to the body coupling part 521 is further disposed on the rear surface of the cover display 200 corresponding to the body coupling part 521 having a hook shape.

Also, a mounting guide 523 for guiding a plurality of elastic members 720 supporting the sensor PCB 700 is disposed inside the housing body 520. The mounting guide 523 contacts both side surfaces of the elastic member 720 to allow the elastic member 720 to be disposed at a fixed position. When the elastic member 720 is pressed, the mounting guide 523 prevents the elastic member 720 from being inclined.

The sensor PCB 700 is accommodated into the housing body 520. Also, the sensor PCB 700 is pressed by the elastic member 720 that is pressed when the housing body 520 is coupled to the cover display 200. Thus, the sensor PCB 700 moves forward to contact the touch booster 530. Thus, the front surface of the touch booster 530 may further protrude than that of the cover display 1200. That is, the state in which the touch booster 530 is closely attached to the rear surface of the front panel 20 may be maintained.

An adhesion member 25 may be disposed on a portion of the cover display 1200 except for the booster insertion part 1250 in the state where the touch sensor assembly 500 is coupled. The cover display 1200 may be attached to the rear surface of the front panel 20 by the adhesion member 25. Here, the touch booster 530 may not adhere to the front panel 20, but be closely attached to the front panel 20 to detect manipulation of a touch manipulation part 12 of the front panel 20.

Figure 35:
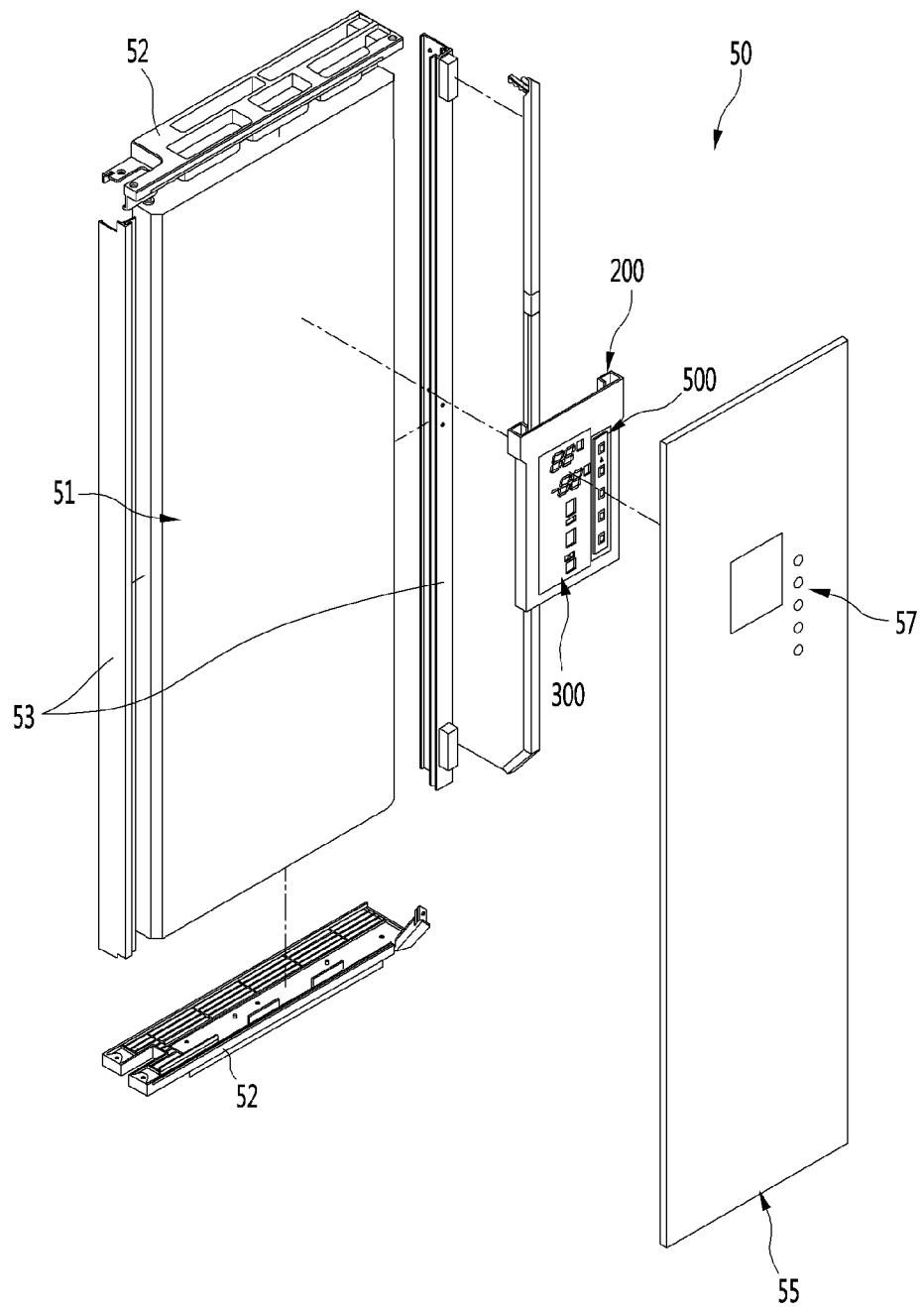
FIG. 35 is an exploded perspective view illustrating an example mounting of the touch sensor assembly on a different type of refrigerator door.

Referring now to FIG. 35, a refrigerator door 50 includes a touch sensor assembly 500. The door 50 includes a door case 51 that is configured to open and close a storage space and in which an insulation material is accommodated, a cap deco 52 disposed on upper and lower portions of the door case 51, a side deco 53 disposed on each of both sides of the door case 51 and to which a door handle 54 is coupled, and a front panel 55 coupled by the cap deco 53 and side deco 53 and disposed on a front side of the door case 51 to define a front outer appearance of the refrigerator door 50.

The front panel 55 may be formed of a tempered glass or plastic material. A film may be directly printed on a surface of the front panel 55, or a printed film may be attached to the surface of the front panel 55 to define an outer appearance.

A display window 56 for displaying an operation state of the refrigerator may be defined in the front panel 55. A touch manipulation part 57 is disposed on one side of the display window 56. The display window 56 may be formed of a transparent or translucent material through which the inside can be seen. The touch manipulation part 57 may be formed through printing or surface processing.

In some cases, the cover display 200 that is closely attached to the front panel 55 may be disposed at a rear side of the display window 56. A touch sensor assembly 500 and the display assembly 300 are mounted on the cover display 200. Since the cover display 200 is attached, the display assembly 300 may irradiate light through the display window 56 to display the operation state of the refrigerator. The touch sensor assembly 500 may be closely attached to the touch manipulation part 57 to recognize the touch manipulation of the touch manipulation part 57.

Figure 36:
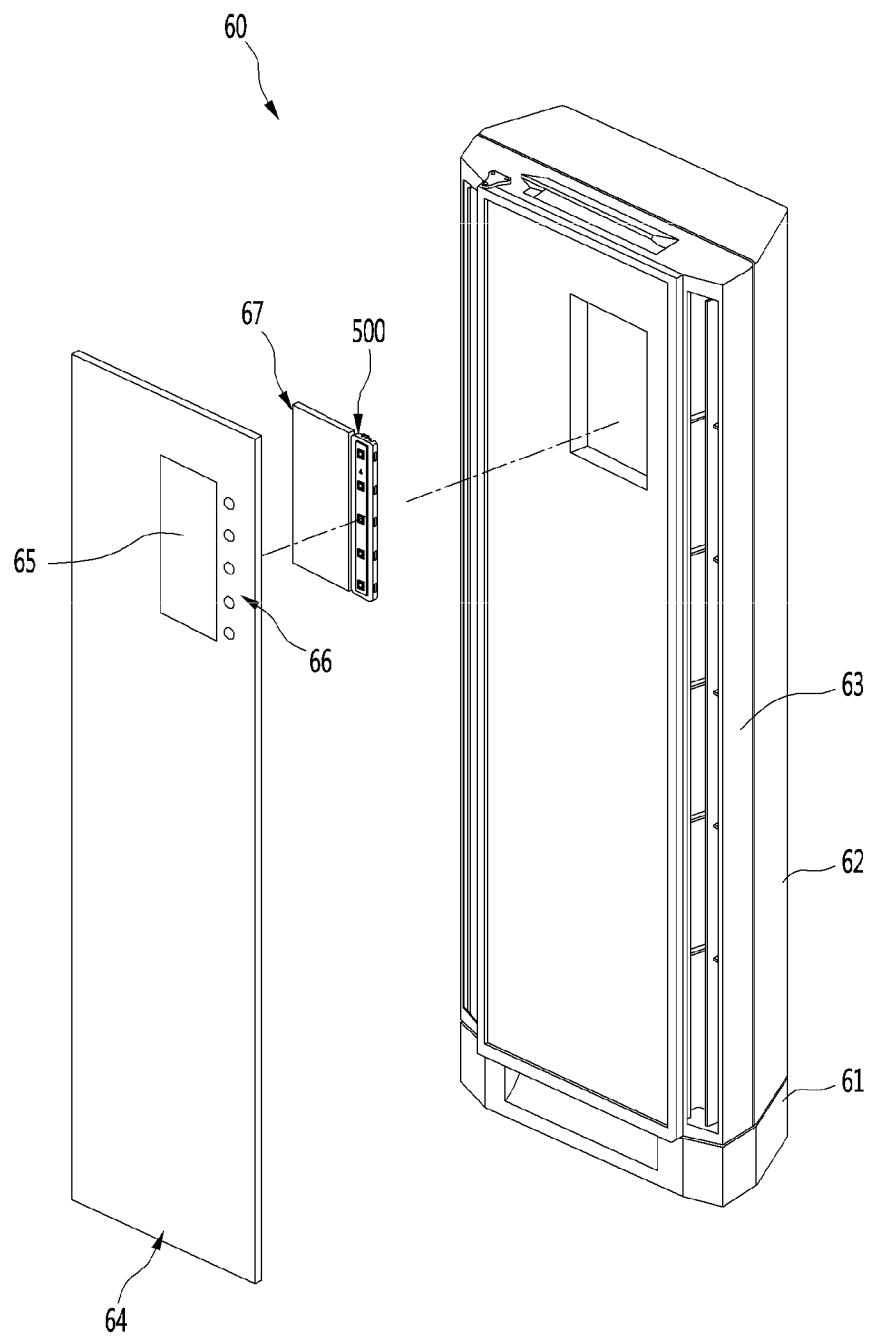
FIG. 36 is an exploded perspective view illustrating an example mounting of the touch sensor assembly on an air conditioner.

Referring now to FIG. 36, an indoor unit 60 of an air conditioner includes the touch sensor assembly 500. The indoor unit 60 of the air conditioner has an outer appearance that is defined by a case. The case may include a base 61, a rear cabinet 62 disposed on an upper side of a rear portion of the base 61, and a front cabinet 63 disposed on an upper side of a front portion of the base 61. An exterior member 64 may be disposed on a front surface of the front cabinet 63.

The base 61, the rear cabinet 62, and the front cabinet 63 may be coupled to each other to define a predetermined space therein. A blower fan and passage for suctioning and discharging air may be provided in the space. Also, a filter assembly for filtering the suctioned air, a heat exchanger for heat-exchanging of the suctioned air, and a component for driving a refrigeration cycle are accommodated in the space. Also, a plurality of suction holes for suctioning external air and a plurality of discharge holes for discharging heat-exchanged air are defined in the base and the rear and front cabinets 62 and 63.

The exterior member may be rotatably mounted on the front cabinet 63 and also detachably mounted. Thus, a front surface of the front cabinet 63 may be opened by the rotation or detachment of the exterior member 64. Thus, components inside and outside the front cabinet 63 may be easily manipulated and repaired. The exterior member 64 may be one component that constitutes an outer appearance of the indoor unit 60 and be fixed and mounted on one side of the case.

A transparent display window 65 for displaying an operation state of the air conditioner may be provided in the exterior member 64. A touch manipulation part 66 may be formed on one side of the display window 65 through printing or surface processing.

Also, a display assembly 67 may be disposed at a rear side of the display window 65. Thus, light is irradiated onto the display window 65 to display operation information of the air conditioner on the display assembly 67. The display assembly 67 may be constituted by a combination of LEDs to provide the information by using the form of figures or symbols. Alternatively, the display assembly 67 may be provided as an LCD to provide the information by using pictures or images.

In some cases, the touch sensor assembly 500 may be attached to a rear surface of the exterior member 64 corresponding to the touch manipulation part 66. The touch sensor assembly 500 may adhere by an adhesion member such as an adhesive or double-sided tape. The touch sensor assembly 500 may be closely attached to the touch manipulation part 66 to recognize user's touch manipulation.

Figure 37:
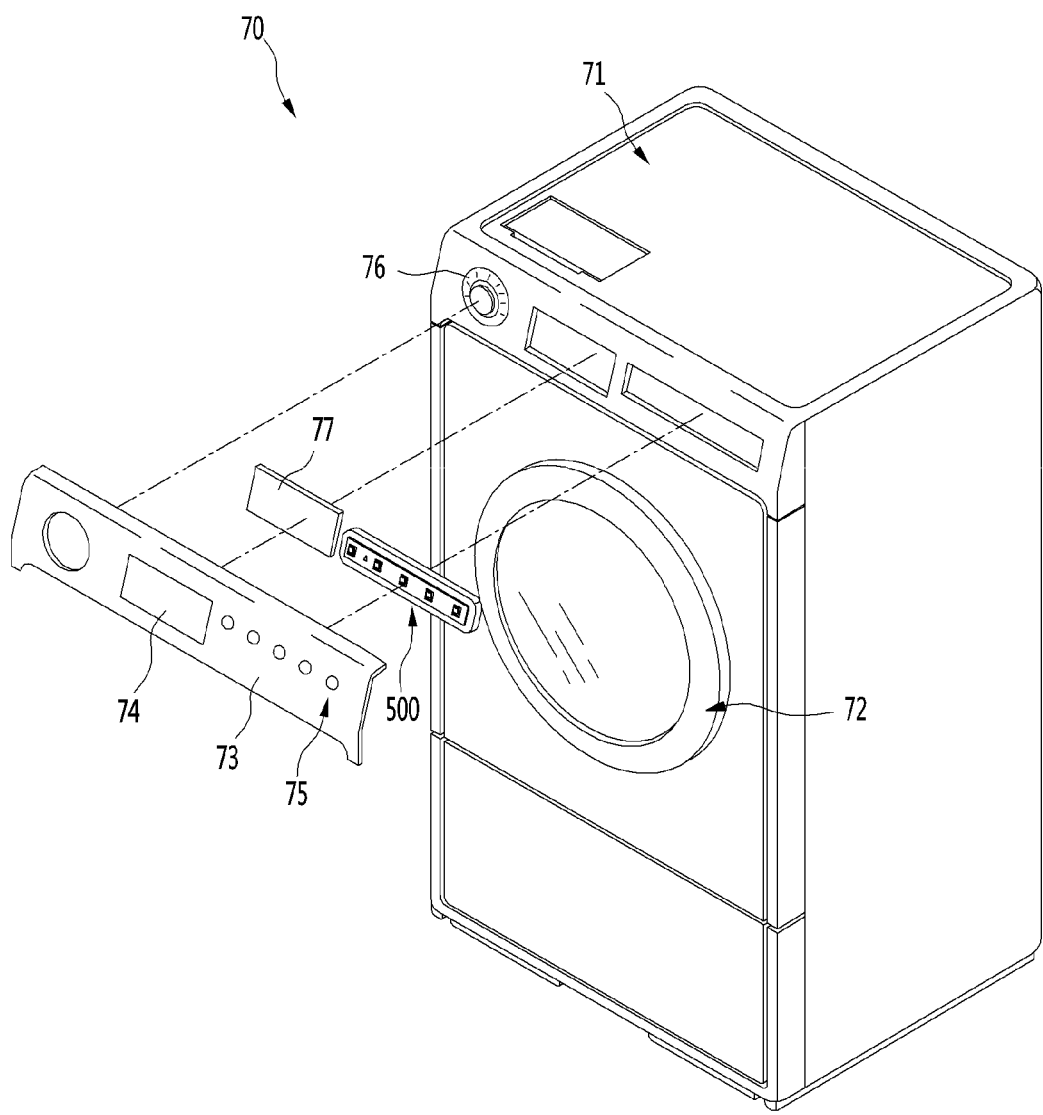
FIG. 37 is an exploded perspective view illustrating an example mounting of the touch sensor assembly on a washing machine.

Referring now FIG. 37, a washing machine 70 including the touch sensor assembly 500 further includes a washing machine body 71 defining an outer appearance, a tub in which washing water is stored, a drum rotatably disposed inside the tub to accommodate laundry, a driving device transmitting rotation force for rotating the drum, a washing water supply device supplying the washing water to the tub, and a discharging device for discharging the washing water.

A portion of a front surface of the washing machine body 71 can be opened so that the laundry is put into the drum. The opening of the washing machine body 71 may be opened and closed by a door 72. For this, the door 72 may be rotatably mounted on the washing machine body 71.

An exterior member 73 having a plate shape may be disposed on each of front and top surfaces of the washing machine body 71 except for the door 72. Also, a display window 74 and touch manipulation part75 may be disposed on at least a portion of the exterior member 73.

The display window 74 may display an operation state of the washing machine 70. The washing machine may operate by touch manipulation of the touch manipulation part 75, or the operation of the washing machine 70 may be selected by the touch manipulation of the touch manipulation part 75. Of cause, a knob 76 having a dial shape to manipulate the washing machine 70 may be provided.

Also, a display assembly 77 is disposed at a rear side of the display window 74. Thus, light is irradiated onto the display window 74 to display operation information of the washing machine 70 on the display assembly 77. The display assembly 77 may be constituted by a combination of LEDs to provide the information by using the form of figures or symbols. Alternatively, the display assembly 67 may be provided as an LCD to provide the information by using pictures or images.

Also, a touch sensor assembly 500 may be attached to a rear surface of the exterior member 73 corresponding to the touch manipulation part 75. The touch sensor assembly 500 may adhere by an adhesion member such as an adhesive or double-sided tape. The touch sensor assembly 500 may be closely attached to the touch manipulation part 75 to recognize user's touch manipulation.

Figure 38:
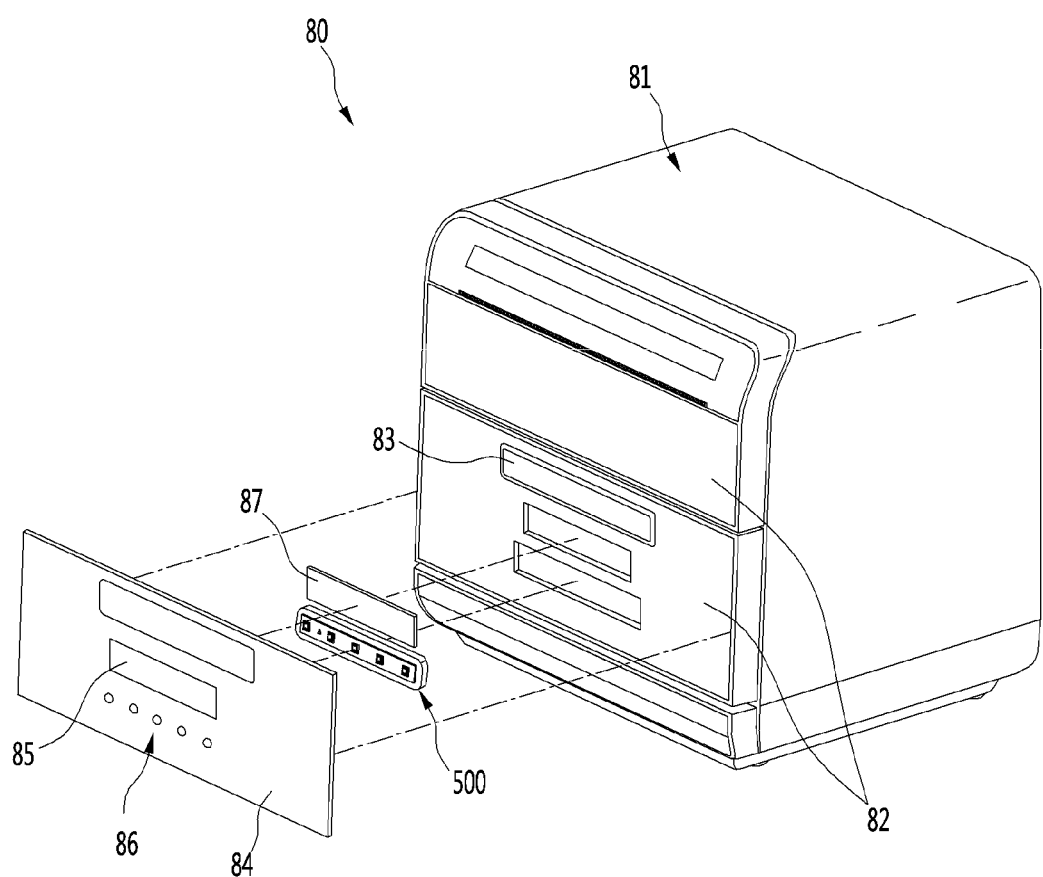
FIG. 38 is an exploded perspective view illustrating an example mounting of the touch sensor assembly on a dishwasher.

Referring now to FIG. 38, a dishwasher 80 including the touch sensor assembly 500 has an outer appearance defined by a dishwasher body 81 having an approximately rectangular parallelepiped shape.

The dishwasher body 81 of the dishwasher 80 may define a cavity in which dishes to be washed are accommodated, a rack member that is inserted into and withdrawn from the cavity and on which the dishes are seated, a water supply device supplying water for washing the dishes into the cavity, and a discharge device for discharging the water that is used for washing.

A door 82 may be disposed on the dishwasher body 81. The door 82 may be configured to selectively cover an opened front surface of the dishwasher body 81. When the door 82 is closed, the door 82 may define an outer appearance of a front surface of the dishwasher 80.

The door 82 can include an upper door and a lower door. When the lower door is manipulated, the upper door may be interlocked with the lower door and thus opened or closed. A handle 83 for opening and closing the door 82 may be provided on the lower door.

An exterior member 84 defining an outer appearance is attached to a front surface of the door 82, i.e., front surfaces of the upper and lower doors.

A transparent display window 85 for displaying an operation state of the dishwasher 80 may be provided in the exterior member 84. A touch manipulation part 86 may be formed on one side of the display window 85 through printing or surface processing.

Also, a display assembly 87 is disposed at a rear side of the display window 85. Thus, light is irradiated onto the display window 85 to display operation information of the dishwasher 80 on the display assembly 87. The display assembly 87 may be constituted by a combination of LEDs to provide the information by using the form of figures or symbols. Alternatively, the display assembly 67 may be provided as an LCD to provide the information by using pictures or images.

Also, a touch sensor assembly 500 may be attached to a rear surface of the exterior member 84 corresponding to the touch manipulation part 86. The touch sensor assembly 500 may adhere by an adhesion member such as an adhesive or double-sided tape. The touch sensor assembly may be closely attached to the touch manipulation part to recognize user's touch manipulation.

Figure 39:
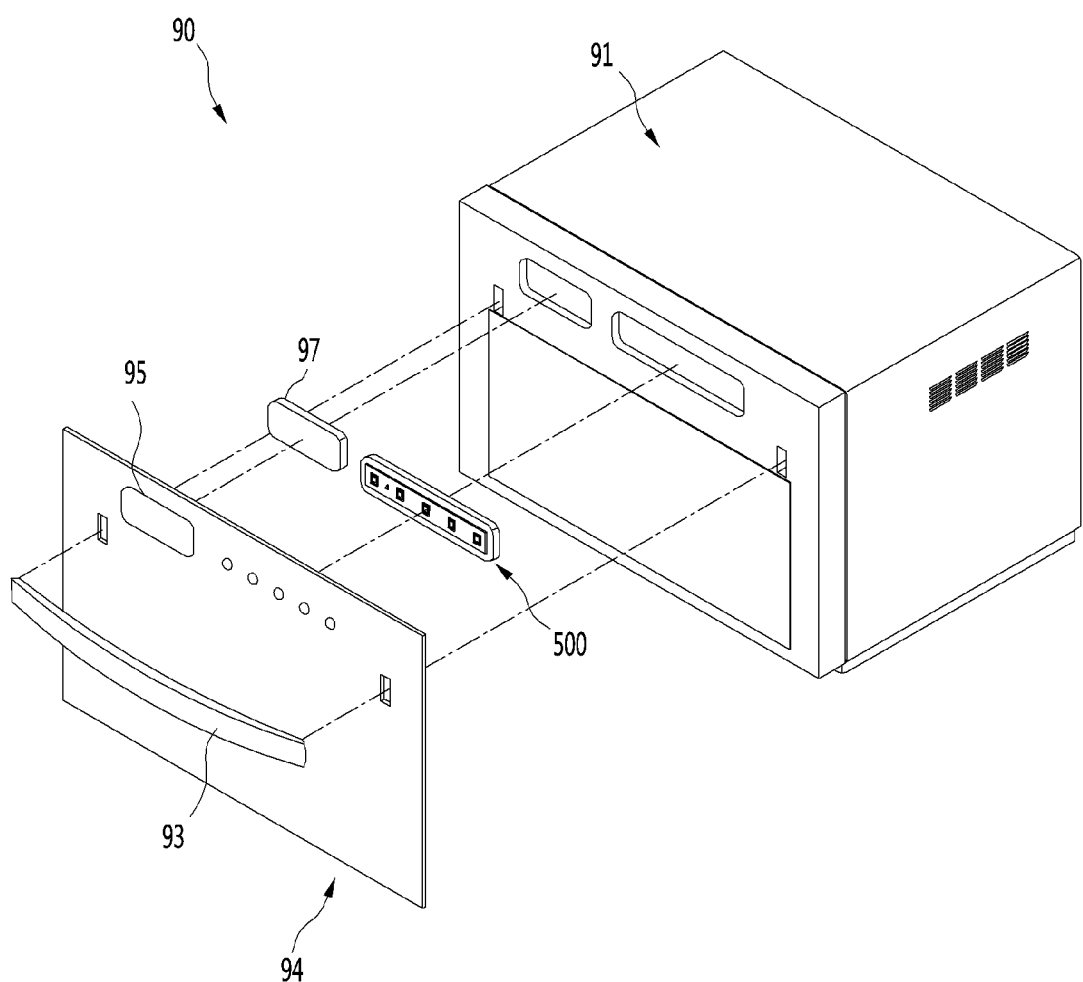
FIG. 39 is an exploded perspective view illustrating an example mounting of the touch sensor assembly on a cooker.

Referring now to FIG. 39, a cooker 90 including the touch sensor assembly 500 has an outer appearance defined by a cooker body 91 having an approximately rectangular parallelepiped shape.

The cooker body 91 may define a cavity in which foods to be cooked are accommodated, a heater or magnetron for cooking the foods within the cavity, and a fan assembly for convection within the cavity.

Also, a door 92 is disposed on the cooker body 91. The door 92 is configured to selectively cover an opened front surface of the cooker body 91. When the door 92 is closed, the door 82 may define an outer appearance of a front surface of the cooker 90.

The door 92 may be rotatably hinge-coupled to the cooker body 91. Thus, the door 92 may rotate in a left/right or up/down direction to selectively open and close an opened front surface of the cooker 90.

Also, a handle 93 for manipulating the opening/closing of the door 92 is disposed on the door 92. Also, an exterior member 94 defining an outer appearance of a front surface of the door 92 may be disposed on the front surface of the door 92. The exterior member 94 may not be limited to the door 92. For example, the exterior member 94 may be disposed on one side of the cooker body 91.

A transparent display window 95 for displaying an operation state of the cooker 90 may be provided in the exterior member 94. A touch manipulation part 96 may be formed on one side of the display window 95 through printing or surface processing.

Also, a display assembly 97 is disposed at a rear side of the display window 95. Thus, light is irradiated onto the display window 95 to display operation information of the cooker on the display assembly 97. The display assembly 97 may be constituted by a combination of LEDs to provide the information by using the form of figures or symbols. Alternatively, the display assembly 67 may be provided as an LCD to provide the information by using pictures or images.

Also, a touch sensor assembly 500 may be attached to a rear surface of the exterior member 94 corresponding to the touch manipulation part 96. The touch sensor assembly 500 may adhere by an adhesion member such as an adhesive or double-sided tape. The touch sensor assembly 500 may be closely attached to the touch manipulation part 96 to recognize user's touch manipulation.

According to the implementations, the manipulation recognition portion of the touch sensor assembly may be maintained in the state in which the touch sensor is closely attached to the exterior member or front panel to accurately detect the displacement of the exterior member or front panel, which occurs when the touch manipulation is performed on the exterior member or front panel, thereby improving the recognition rate with respect to the user's touch manipulation.

Also, the sensor control part for treating the manipulation signal of the touch sensor assembly may be separated from the touch sensor assembly and mounted on the display assembly that is mounted after the foaming process is performed in the door to prevent the touch sensor assembly from being damaged by the static electricity that is generated when the door is manufactured. In addition, the portion to be touched by the user and the sensor control part may be sufficiently spaced apart from each other to prevent the touch sensor assembly from being damaged by the static electricity that is generated in use.

Also, the cover display on which the touch sensor assembly is mounted may be attached to the front panel, and the display assembly may be inserted and mounted through the insertion hole of the deco member to improve the outer appearance of the front surface of the refrigerator door.

In addition, the cover display may be mounted at an exact location, and the light sources of the display may be aligned with each other through the display window to improve the discrimination of the display window and also, more improve the outer appearance of the refrigerator door.

Although implementations have been described with reference to a number of illustrative implementations thereof, it should be understood that numerous other modifications and implementations can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a refrigerator door, the method comprising:
   assembling a display assembly with a touch sensor assembly;
   attaching a cover display and the touch sensor assembly to a rear surface of a front panel;
   attaching a frame to the front panel;
   filling a foaming solution into a door except for a space defined inside the frame to form an insulation material; and
   inserting the display assembly into the frame to mount the display assembly,
   wherein, based on the display assembly being assembled with the touch sensor assembly, a working rod is disposed on a sensor printed circuit board (PCB) to sequentially pass through punching holes of a spacer and punching holes of a conductive foil.

2. The method according to claim 1, wherein the touch sensor assembly is coupled to the cover display in a state where the touch sensor assembly is assembled.

3. The method according to claim 1, wherein the cover display and the touch sensor assembly are attached to the front panel at a time by using an adhesion member in a state where the cover display and the touch sensor assembly are coupled to each other.

4. The method according to claim 1, wherein, based on the spacer being attached, the spacer is gradually attached in a longitudinal direction of a vent hole.

5. The method according to claim 1, wherein, after a first through hole of the front panel is formed, a sealing member formed of a urethane or epoxy material through which light is transmittable is filled into the first through hole to block the first through hole.

6. The method according to claim 5, wherein a diffusion sheet for covering the first through hole is attached to the rear surface of the front panel.

7. The method according to claim 6, wherein the cover display is attached to so that a second through hole formed in the cover display communicates with the first through hole formed in the front panel.

8. The method according to claim 7, wherein a reference point display part for attaching the cover display to a fixed position is formed on the rear surface of the front panel.

9. The method according to claim 8, wherein a coordinate of the reference point display part is set through an image that is photographed by using a camera, and
   the cover display is transferred to a designated coordinate to allow the cover display to adhere to the fixed position.

10. The method according to claim 7, wherein the front panel is fixed in a position by using a fixing jig, and
    the cover display is attached to a fixed position by using an attaching jig that is vertically movable at a set position.

11. The method according to claim 7, wherein a through jig comprising a plurality of pins each of which pass through each of first through holes to extend upward is disposed under the front panel, and
    the cover display is attached to a fixed position so that the pin passing through the first through hole passes through the second through hole.

12. The method according to claim 7, wherein the display assembly is inserted along a guide rail of the cover display, and
    as the display assembly is inserted more and more, the display assembly is more closely attached to the rear surface of the cover display.

13. The method according to claim 12, wherein, based on the display assembly being completely mounted, the display assembly is closely attached to the rear surface of the cover display, and
    the first through hole, the second through hole, and a third through hole formed in the display assembly are aligned to communicate with each other.

14. The method according to claim 7, wherein a light source for irradiating light successively passing through the first and second through holes is disposed under the front panel, and the cover display is attached to a fixed position along the light of the light source, which successively passes through the first and second through holes.

15. The method according to claim 1, wherein, based on the frame being attached, a pressing part formed on the frame pushes each of both left and right ends of the cover display to maintain a state in which the cover display is closely attached to the front panel.

16. The method according to claim 1, wherein, based on the touch sensor assembly being attached, an adhesion member is disposed on an entire surface of the touch sensor assembly except for a touch booster to adhere to the front panel.

17. The method according to claim 1, wherein a sensor control part controlling an operation of the touch sensor assembly is disposed on the display assembly, and the insulation material is filled after the touch sensor assembly is mounted.

18. The method according to claim 17, wherein the sensor control part is connected to the touch sensor assembly by a cable connector after the insulation material is filled.

19. The method according to claim 17, wherein, after the insulation material is filled, the sensor control part and the touch sensor assembly are connected to each other, and the display assembly is inserted into an inner space of the frame.

20. The method according to claim 7, further comprising:

defining a plurality of first through holes in the front panel, the first through hole being one of the plurality of first through holes; and placing a through jig under the front panel, the through jig comprising a plurality of pins that extend upward and pass through the plurality of first through holes, respectively, wherein the cover display is attached to a fixed position such that the pin passing through the first through hole passes through the second through hole.

* * * * *